(12) United States Patent
Smayling

(10) Patent No.: US 8,541,879 B2
(45) Date of Patent: Sep. 24, 2013

(54) SUPER-SELF-ALIGNED CONTACTS AND METHOD FOR MAKING THE SAME

(75) Inventor: Michael C. Smayling, Fremont, CA (US)

(73) Assignee: Tela Innovations, Inc., Los Gatos, CA (US)

( * ) Notice: Subject to any disclaimer, the term of this patent is extended or adjusted under 35 U.S.C. 154(b) by 1238 days.

(21) Appl. No.: 11/956,305

(22) Filed: Dec. 13, 2007

(65) Prior Publication Data
US 2009/0152734 A1    Jun. 18, 2009

(51) Int. Cl.
*H01L 23/48*    (2006.01)

(52) U.S. Cl.
USPC .............. 257/774; 257/E21.575; 257/E23.01; 438/675

(58) Field of Classification Search
USPC .................. 257/E21.575–E21.597, E21.627, 257/E21.641, 774
See application file for complete search history.

(56) References Cited

U.S. PATENT DOCUMENTS

| | | | |
|---|---|---|---|
| 4,197,555 A | 4/1980 | Uehara et al. |
| 4,417,161 A | 11/1983 | Uya |
| 4,424,460 A | 1/1984 | Best |
| 4,613,940 A | 9/1986 | Shenton et al. |
| 4,657,628 A | 4/1987 | Holloway et al. |
| 4,682,202 A | 7/1987 | Tanizawa |
| 4,684,733 A | 8/1987 | Leir |
| 4,745,084 A | 5/1988 | Rowson et al. |
| 4,780,753 A | 10/1988 | Shinichi et al. |
| 4,801,986 A | 1/1989 | Chang et al. |
| 4,804,636 A | 2/1989 | Groover, III et al. |
| 4,812,688 A | 3/1989 | Chu et al. |
| 4,884,115 A | 11/1989 | Michel et al. |
| 4,928,160 A | 5/1990 | Crafts |
| 4,975,756 A | 12/1990 | Haken et al. |
| 5,068,603 A | 11/1991 | Mahoney |
| 5,079,614 A | 1/1992 | Khatakhotan |

(Continued)

FOREIGN PATENT DOCUMENTS

| EP | 0102644 | 7/1989 |
|---|---|---|
| EP | 0788166 | 8/1997 |

(Continued)

OTHER PUBLICATIONS

U.S. Appl. No. 60/625,342, filed May 25, 2006, Pileggi et al., Entire document.

(Continued)

*Primary Examiner* — Mamadou Diallo
(74) *Attorney, Agent, or Firm* — Martine Penilla Group, LLP

(57) ABSTRACT

A number of first hard mask portions are formed on a dielectric layer to vertically shadow a respective one of a number of underlying gate structures. A number of second hard mask filaments are formed adjacent to each side surface of each first hard mask portion. A width of each second hard mask filament is set to define an active area contact-to-gate structure spacing. A first passage is etched between facing exposed side surfaces of a given pair of neighboring second hard mask filaments and through a depth of the semiconductor wafer to an active area. A second passage is etched through a given first hard mask portion and through a depth of the semiconductor wafer to a top surface of the underlying gate structure. An electrically conductive material is deposited within both the first and second passages to respectively form an active area contact and a gate contact.

16 Claims, 32 Drawing Sheets

View A-A

(56) References Cited

U.S. PATENT DOCUMENTS

| | | |
|---|---|---|
| 5,097,422 A | 3/1992 | Corbin et al. |
| 5,117,277 A | 5/1992 | Yuyama et al. |
| 5,121,186 A | 6/1992 | Wong et al. |
| 5,208,765 A | 5/1993 | Turnbull |
| 5,224,057 A | 6/1993 | Igarashi et al. |
| 5,242,770 A | 9/1993 | Chen et al. |
| 5,268,319 A | 12/1993 | Harari |
| 5,298,774 A | 3/1994 | Ueda et al. |
| 5,313,426 A | 5/1994 | Sakuma et al. |
| 5,351,197 A | 9/1994 | Upton et al. |
| 5,359,226 A | 10/1994 | DeJong |
| 5,365,454 A | 11/1994 | Nakagawa et al. |
| 5,367,187 A | 11/1994 | Yuen |
| 5,378,649 A | 1/1995 | Huang |
| 5,396,128 A | 3/1995 | Dunning et al. |
| 5,420,447 A | 5/1995 | Waggoner |
| 5,461,577 A | 10/1995 | Shaw et al. |
| 5,471,403 A | 11/1995 | Fujimaga |
| 5,497,334 A | 3/1996 | Russell et al. |
| 5,497,337 A | 3/1996 | Ponnapalli et al. |
| 5,526,307 A | 6/1996 | Lin et al. |
| 5,536,955 A | 7/1996 | Ali |
| 5,545,904 A | 8/1996 | Orbach |
| 5,581,098 A | 12/1996 | Chang |
| 5,581,202 A | 12/1996 | Yano et al. |
| 5,612,893 A | 3/1997 | Hao et al. |
| 5,636,002 A | 6/1997 | Garofalo |
| 5,656,861 A | 8/1997 | Godinho et al. |
| 5,682,323 A | 10/1997 | Pasch et al. |
| 5,684,311 A | 11/1997 | Shaw |
| 5,698,873 A | 12/1997 | Colwell et al. |
| 5,705,301 A | 1/1998 | Garza et al. |
| 5,723,883 A | 3/1998 | Gheewalla |
| 5,723,908 A | 3/1998 | Fuchida et al. |
| 5,740,068 A | 4/1998 | Liebmann et al. |
| 5,745,374 A | 4/1998 | Matsumoto |
| 5,764,533 A | 6/1998 | deDood |
| 5,774,367 A | 6/1998 | Reyes et al. |
| 5,780,909 A | 7/1998 | Hayashi |
| 5,789,776 A | 8/1998 | Lancaster et al. |
| 5,790,417 A | 8/1998 | Chao et al. |
| 5,796,128 A | 8/1998 | Tran et al. |
| 5,796,624 A | 8/1998 | Sridhar et al. |
| 5,814,844 A | 9/1998 | Nagata et al. |
| 5,825,203 A | 10/1998 | Kusunoki et al. |
| 5,834,851 A | 11/1998 | Ikeda et al. |
| 5,838,594 A | 11/1998 | Kojima |
| 5,841,663 A | 11/1998 | Sharma et al. |
| 5,847,421 A | 12/1998 | Yamaguchi |
| 5,850,362 A | 12/1998 | Sakuma et al. |
| 5,852,562 A | 12/1998 | Shinomiya et al. |
| 5,858,580 A | 1/1999 | Wang et al. |
| 5,898,194 A | 4/1999 | Gheewala |
| 5,900,340 A | 5/1999 | Reich et al. |
| 5,908,827 A | 6/1999 | Sirna |
| 5,915,199 A | 6/1999 | Hsu |
| 5,917,207 A | 6/1999 | Colwell et al. |
| 5,920,486 A | 7/1999 | Beahm et al. |
| 5,923,059 A | 7/1999 | Gheewala ................. 257/204 |
| 5,923,060 A | 7/1999 | Gheewala |
| 5,929,469 A | 7/1999 | Mimoto et al. |
| 5,930,163 A | 7/1999 | Hara et al. |
| 5,935,763 A | 8/1999 | Caterer et al. ............. 430/313 |
| 5,949,101 A | 9/1999 | Aritome |
| 5,973,507 A | 10/1999 | Yamazaki |
| 5,977,305 A | 11/1999 | Wigler et al. ............. 530/350 |
| 5,977,574 A | 11/1999 | Schmitt et al. |
| 5,998,879 A | 12/1999 | Iwaki et al. |
| 6,009,251 A | 12/1999 | Ho et al. |
| 6,026,223 A | 2/2000 | Scepanovic et al. |
| 6,037,613 A | 3/2000 | Mariyama |
| 6,037,617 A | 3/2000 | Kumagai |
| 6,044,007 A | 3/2000 | Capodieci |
| 6,054,872 A | 4/2000 | Fudanuki et al. |
| 6,063,132 A | 5/2000 | DeCamp et al. |
| 6,077,310 A | 6/2000 | Yamamoto et al. |
| 6,080,206 A | 6/2000 | Tadokoro et al. |
| 6,084,437 A | 7/2000 | Sako |
| 6,091,845 A | 7/2000 | Pierrat et al. |
| 6,099,584 A | 8/2000 | Arnold et al. |
| 6,100,025 A | 8/2000 | Wigler et al. .................. 435/6 |
| 6,114,071 A | 9/2000 | Chen et al. |
| 6,166,415 A | 12/2000 | Sakemi et al. |
| 6,166,560 A | 12/2000 | Ogura et al. |
| 6,174,742 B1 | 1/2001 | Sudhindranath et al. ....... 438/14 |
| 6,182,272 B1 | 1/2001 | Andreev et al. ................. 716/13 |
| 6,194,104 B1 | 2/2001 | Hsu |
| 6,194,252 B1 | 2/2001 | Yamaguchi .................. 438/129 |
| 6,194,912 B1 | 2/2001 | Or-Bach ........................ 326/38 |
| 6,209,123 B1 | 3/2001 | Maziasz et al. |
| 6,230,299 B1 | 5/2001 | McSherry et al. |
| 6,232,173 B1 | 5/2001 | Hsu et al. |
| 6,240,542 B1 | 5/2001 | Kapur ............................ 716/12 |
| 6,249,902 B1 | 6/2001 | Igusa et al. |
| 6,255,600 B1 | 7/2001 | Schaper ........................ 174/255 |
| 6,255,845 B1 | 7/2001 | Wong et al. |
| 6,262,487 B1 | 7/2001 | Igarashi et al. |
| 6,269,472 B1 | 7/2001 | Garza et al. |
| 6,275,973 B1 | 8/2001 | Wein .............................. 716/10 |
| 6,282,696 B1 | 8/2001 | Garza et al. |
| 6,291,276 B1 | 9/2001 | Gonzalez |
| 6,297,668 B1 | 10/2001 | Schober |
| 6,297,674 B1 | 10/2001 | Kono et al. |
| 6,303,252 B1 | 10/2001 | Lin |
| 6,331,733 B1 | 12/2001 | Or-Bach et al. ............... 257/758 |
| 6,331,791 B1 | 12/2001 | Huang |
| 6,335,250 B1 | 1/2002 | Egi |
| 6,338,972 B1 | 1/2002 | Sudhindranath et al. ....... 438/14 |
| 6,347,062 B2 | 2/2002 | Nii et al. |
| 6,356,112 B1 | 3/2002 | Tran et al. |
| 6,359,804 B2 | 3/2002 | Kuriyama et al. |
| 6,370,679 B1 | 4/2002 | Chang et al. |
| 6,378,110 B1 | 4/2002 | Ho |
| 6,380,592 B2 | 4/2002 | Tooher et al. |
| 6,388,296 B1 | 5/2002 | Hsu |
| 6,393,601 B1 | 5/2002 | Tanaka et al. |
| 6,399,972 B1 | 6/2002 | Masuda et al. |
| 6,415,421 B2 | 7/2002 | Anderson et al. |
| 6,416,907 B1 | 7/2002 | Winder et al. ..................... 430/5 |
| 6,417,549 B1 | 7/2002 | Oh |
| 6,421,820 B1 | 7/2002 | Mansfield et al. |
| 6,425,112 B1 | 7/2002 | Bula et al. |
| 6,425,117 B1 | 7/2002 | Pasch et al. ..................... 716/21 |
| 6,426,269 B1 | 7/2002 | Haffner et al. |
| 6,436,805 B1 | 8/2002 | Trivedi |
| 6,445,049 B1 | 9/2002 | Iranmanesh |
| 6,445,065 B1 | 9/2002 | Gheewala et al. |
| 6,467,072 B1 | 10/2002 | Yang et al. |
| 6,469,328 B2 | 10/2002 | Yanai et al. |
| 6,470,489 B1 | 10/2002 | Chang et al. |
| 6,476,493 B2 | 11/2002 | Or-Bach et al. ............... 257/758 |
| 6,477,695 B1 | 11/2002 | Gandhi |
| 6,480,032 B1 | 11/2002 | Aksamit |
| 6,480,989 B2 | 11/2002 | Chan et al. ....................... 716/8 |
| 6,492,066 B1 | 12/2002 | Capodieci et al. |
| 6,496,965 B1 | 12/2002 | van Ginneken et al. |
| 6,504,186 B2 | 1/2003 | Kanamoto et al. |
| 6,505,327 B2 | 1/2003 | Lin .................................. 716/5 |
| 6,505,328 B1 | 1/2003 | van Ginneken et al. |
| 6,507,941 B1 | 1/2003 | Leung et al. |
| 6,509,952 B1 | 1/2003 | Govil et al. |
| 6,514,849 B1 | 2/2003 | Hui et al. |
| 6,516,459 B1 | 2/2003 | Sahouria |
| 6,523,156 B2 | 2/2003 | Cirit |
| 6,525,350 B1 | 2/2003 | Kinoshita et al. ............. 257/202 |
| 6,536,028 B1 | 3/2003 | Katsioulas et al. ............. 716/17 |
| 6,543,039 B1 | 4/2003 | Watanabe |
| 6,553,544 B2 | 4/2003 | Tanaka et al. |
| 6,553,559 B2 | 4/2003 | Liebmann et al. |
| 6,553,562 B2 | 4/2003 | Capodieci et al. |
| 6,566,720 B2 | 5/2003 | Aldrich |
| 6,570,234 B1 | 5/2003 | Gardner |
| 6,571,140 B1 | 5/2003 | Wewalaarachchi et al. ..... 700/83 |
| 6,571,379 B2 | 5/2003 | Takayama |

| Patent No. | Date | Inventor(s) | Ref |
|---|---|---|---|
| 6,578,190 B2 | 6/2003 | Ferguson et al. | |
| 6,588,005 B1 | 7/2003 | Kobayashi et al. | |
| 6,590,289 B2 | 7/2003 | Shively | 257/758 |
| 6,591,207 B2 | 7/2003 | Naya et al. | 702/81 |
| 6,609,235 B2 | 8/2003 | Ramaswamy et al. | |
| 6,610,607 B1 | 8/2003 | Armbrust et al. | |
| 6,617,621 B1 | 9/2003 | Gheewala et al. | |
| 6,620,561 B2 | 9/2003 | Winder et al. | 430/5 |
| 6,633,182 B2 | 10/2003 | Pileggi et al. | |
| 6,635,935 B2 | 10/2003 | Makino | |
| 6,642,744 B2 | 11/2003 | Or-Bach et al. | |
| 6,643,831 B2 | 11/2003 | Chang et al. | |
| 6,650,014 B2 | 11/2003 | Kariyazaki | |
| 6,661,041 B2 | 12/2003 | Keeth | 257/211 |
| 6,662,350 B2 | 12/2003 | Fried et al. | |
| 6,664,587 B2 | 12/2003 | Guterman et al. | |
| 6,673,638 B1 | 1/2004 | Bendik et al. | |
| 6,677,649 B2 | 1/2004 | Minami et al. | |
| 6,687,895 B2 | 2/2004 | Zhang | |
| 6,691,297 B1 | 2/2004 | Misaka et al. | 716/21 |
| 6,700,405 B1 | 3/2004 | Hirairi | |
| 6,703,170 B1 | 3/2004 | Pindo | |
| 6,709,880 B2 | 3/2004 | Yamamoto et al. | |
| 6,714,903 B1 | 3/2004 | Chu et al. | 703/19 |
| 6,732,338 B2 | 5/2004 | Crouse et al. | |
| 6,732,344 B2 | 5/2004 | Sakamoto et al. | |
| 6,737,199 B1 | 5/2004 | Hsieh | 430/5 |
| 6,737,318 B2 | 5/2004 | Murata et al. | |
| 6,737,347 B1 | 5/2004 | Houston et al. | |
| 6,745,372 B2 | 6/2004 | Cote et al. | 716/2 |
| 6,745,380 B2 | 6/2004 | Bodendorf et al. | |
| 6,749,972 B2 | 6/2004 | Yu | |
| 6,750,555 B2 | 6/2004 | Satomi et al. | |
| 6,760,269 B2 | 7/2004 | Nakase et al. | |
| 6,765,245 B2 | 7/2004 | Bansal | |
| 6,777,138 B2 | 8/2004 | Pierrat et al. | |
| 6,777,146 B1 | 8/2004 | Samuels | |
| 6,787,823 B2 | 9/2004 | Shibutani | |
| 6,789,244 B1 | 9/2004 | Dasasathyan et al. | |
| 6,789,246 B1 | 9/2004 | Mohan et al. | |
| 6,792,591 B2 | 9/2004 | Shi et al. | |
| 6,792,593 B2 | 9/2004 | Takashima et al. | 716/21 |
| 6,794,677 B2 | 9/2004 | Tamaki et al. | |
| 6,794,914 B2 | 9/2004 | Sani et al. | |
| 6,795,332 B2 | 9/2004 | Yamaoka et al. | |
| 6,795,358 B2 | 9/2004 | Tanaka et al. | |
| 6,795,952 B1 | 9/2004 | Stine et al. | 716/5 |
| 6,795,953 B2 | 9/2004 | Bakarian et al. | |
| 6,800,883 B2 | 10/2004 | Furuya et al. | |
| 6,807,663 B2 | 10/2004 | Cote et al. | 716/21 |
| 6,809,399 B2 | 10/2004 | Ikeda et al. | |
| 6,812,574 B2 | 11/2004 | Tomita et al. | |
| 6,818,389 B2 | 11/2004 | Fritze et al. | |
| 6,818,929 B2 | 11/2004 | Tsutsumi et al. | |
| 6,819,136 B2 | 11/2004 | Or-Bach | 326/41 |
| 6,826,738 B2 | 11/2004 | Cadouri | |
| 6,834,375 B1 | 12/2004 | Stine et al. | 716/2 |
| 6,841,880 B2 | 1/2005 | Matsumoto et al. | |
| 6,850,854 B2 | 2/2005 | Naya et al. | 702/81 |
| 6,854,096 B2 | 2/2005 | Eaton et al. | |
| 6,854,100 B1 | 2/2005 | Chuang et al. | 716/5 |
| 6,871,338 B2 | 3/2005 | Yamauchi | |
| 6,872,990 B1 | 3/2005 | Kang | |
| 6,877,144 B1 | 4/2005 | Rittman et al. | 716/10 |
| 6,881,523 B2 | 4/2005 | Smith | |
| 6,884,712 B2 | 4/2005 | Yelehanka et al. | 438/622 |
| 6,885,045 B2 | 4/2005 | Hidaka | |
| 6,889,370 B1 | 5/2005 | Kerzman et al. | |
| 6,897,517 B2 | 5/2005 | Houdt et al. | |
| 6,897,536 B2 | 5/2005 | Nomura et al. | |
| 6,898,770 B2 | 5/2005 | Boluki et al. | |
| 6,904,582 B1 | 6/2005 | Rittman et al. | 716/10 |
| 6,918,104 B2 | 7/2005 | Pierrat et al. | |
| 6,920,079 B2 | 7/2005 | Shibayama | |
| 6,922,354 B2 | 7/2005 | Ishikura et al. | |
| 6,928,635 B2 | 8/2005 | Pramanik et al. | 716/21 |
| 6,931,617 B2 | 8/2005 | Sanie et al. | 716/18 |
| 6,953,956 B2 | 10/2005 | Or-Bach et al. | 257/203 |
| 6,954,918 B2 | 10/2005 | Houston | |
| 6,957,402 B2 | 10/2005 | Templeton et al. | |
| 6,968,527 B2 | 11/2005 | Pierrat | |
| 6,974,978 B1 | 12/2005 | Possley | |
| 6,977,856 B2 | 12/2005 | Tanaka et al. | |
| 6,978,436 B2 | 12/2005 | Cote et al. | |
| 6,978,437 B1 | 12/2005 | Rittman et al. | 716/21 |
| 6,980,211 B2 | 12/2005 | Lin et al. | |
| 6,992,394 B2 | 1/2006 | Park et al. | |
| 6,992,925 B2 | 1/2006 | Peng | 365/177 |
| 6,993,741 B2 | 1/2006 | Liebmann et al. | |
| 6,994,939 B1 | 2/2006 | Ghandehari et al. | |
| 7,003,068 B2 | 2/2006 | Kushner et al. | |
| 7,009,862 B2 | 3/2006 | Higeta et al. | |
| 7,016,214 B2 | 3/2006 | Kawamata et al. | |
| 7,022,559 B2 | 4/2006 | Barnak et al. | |
| 7,028,285 B2 | 4/2006 | Cote et al. | 716/21 |
| 7,041,568 B2 | 5/2006 | Goldbach et al. | 438/387 |
| 7,052,972 B2 | 5/2006 | Sandhu et al. | |
| 7,053,424 B2 | 5/2006 | Ono | |
| 7,063,920 B2 | 6/2006 | Baba-Ali | |
| 7,064,068 B2 | 6/2006 | Chou et al. | 438/687 |
| 7,065,731 B2 | 6/2006 | Jacques et al. | |
| 7,079,989 B2 | 7/2006 | Wimer | |
| 7,093,208 B2 | 8/2006 | Williams et al. | |
| 7,093,228 B2 | 8/2006 | Andreev et al. | 716/21 |
| 7,103,870 B2 | 9/2006 | Misaka et al. | 716/21 |
| 7,105,871 B2 | 9/2006 | Or-Bach et al. | |
| 7,107,551 B1 | 9/2006 | de Dood et al. | |
| 7,115,343 B2 | 10/2006 | Gordon et al. | |
| 7,115,920 B2 | 10/2006 | Bernstein et al. | |
| 7,120,882 B2 | 10/2006 | Kotani et al. | 716/5 |
| 7,124,386 B2 | 10/2006 | Smith et al. | |
| 7,126,837 B1 | 10/2006 | Banachowicz et al. | |
| 7,132,203 B2 | 11/2006 | Pierrat | |
| 7,137,092 B2 | 11/2006 | Maeda | 716/8 |
| 7,141,853 B2 | 11/2006 | Campbell et al. | |
| 7,149,999 B2 | 12/2006 | Kahng et al. | 716/19 |
| 7,152,215 B2 | 12/2006 | Smith et al. | |
| 7,155,685 B2 | 12/2006 | Mori et al. | |
| 7,155,689 B2 | 12/2006 | Pierrat et al. | 716/4 |
| 7,159,197 B2 | 1/2007 | Falbo et al. | |
| 7,174,520 B2 | 2/2007 | White et al. | |
| 7,175,940 B2 | 2/2007 | Laidig et al. | |
| 7,176,508 B2 | 2/2007 | Joshi et al. | |
| 7,177,215 B2 | 2/2007 | Tanaka et al. | |
| 7,185,294 B2 | 2/2007 | Zhang | |
| 7,188,322 B2 | 3/2007 | Cohn et al. | |
| 7,194,712 B2 | 3/2007 | Wu | |
| 7,200,835 B2 | 4/2007 | Zhang et al. | |
| 7,202,517 B2 | 4/2007 | Dixit et al. | |
| 7,214,579 B2 | 5/2007 | Widdershoven et al. | |
| 7,219,326 B2 | 5/2007 | Reed et al. | |
| 7,221,031 B2 | 5/2007 | Ryoo et al. | |
| 7,225,423 B2 | 5/2007 | Bhattacharya et al. | |
| 7,227,183 B2 | 6/2007 | Donze et al. | |
| 7,228,510 B2 | 6/2007 | Ono | |
| 7,231,628 B2 | 6/2007 | Pack et al. | |
| 7,235,424 B2 | 6/2007 | Chen et al. | |
| 7,243,316 B2 | 7/2007 | White et al. | |
| 7,252,909 B2 | 8/2007 | Shin et al. | |
| 7,264,990 B2 | 9/2007 | Rueckes et al. | |
| 7,269,803 B2 | 9/2007 | Khakzadi et al. | |
| 7,278,118 B2 | 10/2007 | Pileggi et al. | 716/1 |
| 7,279,727 B2 | 10/2007 | Ikoma et al. | |
| 7,287,320 B2 | 10/2007 | Wang et al. | |
| 7,294,534 B2 | 11/2007 | Iwaki | |
| 7,302,651 B2 | 11/2007 | Allen et al. | |
| 7,308,669 B2 | 12/2007 | Buehler et al. | |
| 7,312,003 B2 | 12/2007 | Cote et al. | |
| 7,329,938 B2 | 2/2008 | Kinoshita | |
| 7,335,966 B2 | 2/2008 | Ihme et al. | |
| 7,337,421 B2 | 2/2008 | Kamat | |
| 7,338,896 B2 | 3/2008 | Vanhaelemeersch et al. | |
| 7,345,909 B2 | 3/2008 | Chang et al. | |
| 7,346,885 B2 | 3/2008 | Semmler | |
| 7,350,183 B2 | 3/2008 | Cui et al. | |
| 7,353,492 B2 | 4/2008 | Gupta et al. | |
| 7,360,179 B2 | 4/2008 | Smith et al. | |
| 7,360,198 B2 | 4/2008 | Rana et al. | |

| | | | |
|---|---|---|---|
| 7,366,997 B1 | 4/2008 | Rahmat et al. | |
| 7,367,008 B2 | 4/2008 | White et al. | |
| 7,376,931 B2 | 5/2008 | Kokubun | |
| 7,383,521 B2 | 6/2008 | Smith et al. | |
| 7,397,260 B2 | 7/2008 | Chanda et al. | |
| 7,400,627 B2 | 7/2008 | Wu et al. | |
| 7,402,848 B2 | 7/2008 | Chang et al. | |
| 7,404,154 B1 | 7/2008 | Venkatraman et al. | |
| 7,404,173 B2 | 7/2008 | Wu et al. | |
| 7,411,252 B2 | 8/2008 | Anderson et al. | |
| 7,421,678 B2 | 9/2008 | Barnes et al. | |
| 7,423,298 B2 | 9/2008 | Mariyama et al. | |
| 7,424,694 B2 | 9/2008 | Ikeda | |
| 7,424,695 B2 | 9/2008 | Tamura et al. | |
| 7,426,710 B2 | 9/2008 | Zhang et al. | |
| 7,432,562 B2 | 10/2008 | Bhattacharyya | |
| 7,434,185 B2 | 10/2008 | Dooling et al. | |
| 7,441,211 B1 | 10/2008 | Gupta et al. | |
| 7,442,630 B2 | 10/2008 | Kelberlau et al. | |
| 7,444,609 B2 | 10/2008 | Charlebois et al. | |
| 7,446,352 B2 | 11/2008 | Becker et al. | |
| 7,449,371 B2 | 11/2008 | Kemerling et al. | |
| 7,458,045 B2 | 11/2008 | Cote et al. | |
| 7,459,792 B2 | 12/2008 | Chen | |
| 7,465,973 B2 | 12/2008 | Chang et al. | |
| 7,466,607 B2 | 12/2008 | Hollis et al. | |
| 7,469,396 B2 | 12/2008 | Hayashi et al. | |
| 7,480,880 B2 | 1/2009 | Visweswariah et al. | |
| 7,480,891 B2 | 1/2009 | Sezginer | |
| 7,484,197 B2 | 1/2009 | Allen et al. | |
| 7,485,934 B2 | 2/2009 | Liaw | |
| 7,487,475 B1 | 2/2009 | Kriplani et al. | |
| 7,500,211 B2 | 3/2009 | Komaki | |
| 7,502,275 B2 | 3/2009 | Nii et al. | |
| 7,503,026 B2 | 3/2009 | Ichiryu et al. | |
| 7,504,184 B2 | 3/2009 | Hung et al. | |
| 7,506,300 B2 | 3/2009 | Sezginer et al. | |
| 7,509,621 B2 | 3/2009 | Melvin, III | |
| 7,509,622 B2 | 3/2009 | Sinha et al. | |
| 7,512,017 B2 | 3/2009 | Chang | |
| 7,512,921 B2 | 3/2009 | Shibuya | |
| 7,514,959 B2 | 4/2009 | Or-Bach et al. | |
| 7,523,429 B2 | 4/2009 | Kroyan et al. | |
| 7,527,900 B2 | 5/2009 | Zhou et al. | |
| 7,538,368 B2 | 5/2009 | Yano | |
| 7,543,262 B2 | 6/2009 | Wang et al. | |
| 7,563,701 B2 | 7/2009 | Chang et al. | |
| 7,564,134 B2 | 7/2009 | Lee et al. | |
| 7,568,174 B2 | 7/2009 | Sezginer et al. | |
| 7,569,309 B2 | 8/2009 | Walter et al. | |
| 7,569,310 B2 | 8/2009 | Wallace et al. | |
| 7,569,894 B2 | 8/2009 | Suzuki | |
| 7,575,973 B2 | 8/2009 | Mokhlesi et al. | |
| 7,598,541 B2 | 10/2009 | Okamoto et al. | |
| 7,598,558 B2 | 10/2009 | Hashimoto et al. | |
| 7,614,030 B2 | 11/2009 | Hsu | |
| 7,632,610 B2 | 12/2009 | Wallace et al. | |
| 7,640,522 B2 | 12/2009 | Gupta et al. | |
| 7,646,651 B2 | 1/2010 | Lee et al. | |
| 7,653,884 B2 | 1/2010 | Furnish et al. | |
| 7,665,051 B2 | 2/2010 | Ludwig et al. | |
| 7,700,466 B2 | 4/2010 | Booth et al. | |
| 7,712,056 B2 | 5/2010 | White et al. | |
| 7,739,627 B2 | 6/2010 | Chew et al. | |
| 7,749,662 B2 | 7/2010 | Matthew et al. | |
| 7,755,110 B2 | 7/2010 | Gliese et al. | |
| 7,770,144 B2 | 8/2010 | Dellinger | |
| 7,791,109 B2 | 9/2010 | Wann et al. | |
| 7,802,219 B2 | 9/2010 | Tomar et al. | |
| 7,825,437 B2 | 11/2010 | Pillarisetty et al. | |
| 7,842,975 B2 | 11/2010 | Becker et al. | |
| 7,873,929 B2 | 1/2011 | Kahng et al. | |
| 7,882,456 B2 | 2/2011 | Zach | |
| 7,888,705 B2 | 2/2011 | Becker et al. | |
| 7,898,040 B2 | 3/2011 | Nawaz | |
| 7,908,578 B2 | 3/2011 | Becker et al. | |
| 7,910,958 B2 | 3/2011 | Becker et al. | |
| 7,917,877 B2 | 3/2011 | Singh et al. | |
| 7,917,879 B2 | 3/2011 | Becker et al. | |
| 7,923,266 B2 | 4/2011 | Thijs et al. | |
| 7,923,337 B2 | 4/2011 | Chang et al. | |
| 7,932,545 B2 | 4/2011 | Becker et al. | |
| 7,934,184 B2 | 4/2011 | Zhang | |
| 7,958,465 B2 | 6/2011 | Lu et al. | |
| 7,962,867 B2 | 6/2011 | White et al. | |
| 7,962,879 B2 | 6/2011 | Tang et al. | |
| 7,964,267 B1 | 6/2011 | Lyons et al. | |
| 7,971,160 B2 | 6/2011 | Osawa et al. | |
| 7,992,122 B1 | 8/2011 | Burstein et al. | |
| 7,994,583 B2 | 8/2011 | Inaba | |
| 8,004,042 B2 | 8/2011 | Yang et al. | |
| 8,044,437 B1 | 10/2011 | Venkatraman et al. | |
| 8,058,671 B2 | 11/2011 | Becker et al. | |
| 8,058,690 B2 | 11/2011 | Chang | |
| 8,072,053 B2 | 12/2011 | Li | |
| 8,130,529 B2 | 3/2012 | Tanaka | |
| 8,161,427 B2 | 4/2012 | Morgenshtein et al. | |
| 8,178,905 B2 | 5/2012 | Toubou | |
| 8,178,909 B2 | 5/2012 | Venkatraman et al. | |
| 8,214,778 B2 | 7/2012 | Quandt et al. | |
| 8,225,239 B2 | 7/2012 | Reed et al. | |
| 8,225,261 B2 | 7/2012 | Hong et al. | |
| 8,245,180 B2 | 8/2012 | Smayling et al. | |
| 8,378,407 B2 | 2/2013 | Audzeyeu et al. | |
| 8,422,274 B2 | 4/2013 | Tomita et al. | |
| 2002/0003270 A1 | 1/2002 | Makino | |
| 2002/0015899 A1 | 2/2002 | Chen et al. | |
| 2002/0030510 A1 | 3/2002 | Kono et al. | |
| 2002/0079927 A1 | 6/2002 | Katoh et al. | |
| 2002/0166107 A1 | 11/2002 | Capodieci et al. | |
| 2002/0194575 A1 | 12/2002 | Allen et al. | |
| 2003/0042930 A1 | 3/2003 | Pileggi et al. | 326/41 |
| 2003/0046653 A1 | 3/2003 | Liu | |
| 2003/0061592 A1 | 3/2003 | Agrawal et al. | |
| 2003/0088839 A1 | 5/2003 | Watanabe | |
| 2003/0088842 A1 | 5/2003 | Cirit | |
| 2003/0106037 A1 | 6/2003 | Moniwa et al. | |
| 2003/0117168 A1 | 6/2003 | Uneme et al. | |
| 2003/0125917 A1 | 7/2003 | Rich et al. | |
| 2003/0126569 A1 | 7/2003 | Rich et al. | |
| 2003/0145288 A1 | 7/2003 | Wang et al. | |
| 2003/0145299 A1 | 7/2003 | Fried et al. | |
| 2003/0177465 A1 | 9/2003 | MacLean et al. | |
| 2003/0185076 A1 | 10/2003 | Worley | |
| 2003/0229868 A1 | 12/2003 | White et al. | |
| 2003/0229875 A1 | 12/2003 | Smith et al. | |
| 2004/0049754 A1 | 3/2004 | Liao et al. | |
| 2004/0063038 A1 | 4/2004 | Shin et al. | |
| 2004/0115539 A1 | 6/2004 | Broeke et al. | |
| 2004/0139412 A1 | 7/2004 | Ito et al. | |
| 2004/0145028 A1 | 7/2004 | Matsumoto et al. | 257/620 |
| 2004/0153979 A1 | 8/2004 | Chang | |
| 2004/0161878 A1 | 8/2004 | Or-Bach et al. | 438/113 |
| 2004/0169201 A1 | 9/2004 | Hidaka | |
| 2004/0194050 A1 | 9/2004 | Hwang et al. | |
| 2004/0196705 A1 | 10/2004 | Ishikura et al. | |
| 2004/0229135 A1 | 11/2004 | Wang et al. | |
| 2004/0232444 A1* | 11/2004 | Shimizu | 257/202 |
| 2004/0243966 A1 | 12/2004 | Dellinger | 716/17 |
| 2004/0262640 A1 | 12/2004 | Suga | |
| 2005/0009312 A1 | 1/2005 | Butt et al. | |
| 2005/0009344 A1 | 1/2005 | Hwang et al. | |
| 2005/0012157 A1 | 1/2005 | Cho et al. | |
| 2005/0055828 A1 | 3/2005 | Wang et al. | 29/857 |
| 2005/0076320 A1 | 4/2005 | Maeda | |
| 2005/0087806 A1 | 4/2005 | Hokazono | |
| 2005/0093147 A1* | 5/2005 | Tu | 257/734 |
| 2005/0101112 A1 | 5/2005 | Rueckes et al. | 438/584 |
| 2005/0110130 A1 | 5/2005 | Kitabayashi et al. | |
| 2005/0135134 A1 | 6/2005 | Yen et al. | |
| 2005/0136340 A1 | 6/2005 | Baselmans et al. | |
| 2005/0138598 A1 | 6/2005 | Kokubun | |
| 2005/0156200 A1 | 7/2005 | Kinoshita | |
| 2005/0185325 A1 | 8/2005 | Hur | |
| 2005/0189604 A1 | 9/2005 | Gupta et al. | |
| 2005/0189614 A1 | 9/2005 | Ihme et al. | 257/532 |
| 2005/0196685 A1 | 9/2005 | Wang et al. | |
| 2005/0205894 A1 | 9/2005 | Sumikawa et al. | |

| | | | | | | |
|---|---|---|---|---|---|---|
| 2005/0212018 A1 | 9/2005 | Schoellkopf et al. | | 2008/0315258 A1 | 12/2008 | Masuda et al. |
| 2005/0224982 A1 | 10/2005 | Kemerling et al. ........... 257/758 | | 2009/0014811 A1 | 1/2009 | Becker |
| 2005/0229130 A1 | 10/2005 | Wu et al. | | 2009/0024974 A1 | 1/2009 | Yamada |
| 2005/0251771 A1 | 11/2005 | Robles | | 2009/0031261 A1 | 1/2009 | Smith et al. |
| 2005/0264320 A1 | 12/2005 | Chan et al. | | 2009/0032898 A1 | 2/2009 | Becker |
| 2005/0264324 A1 | 12/2005 | Nakazato | | 2009/0032967 A1 | 2/2009 | Becker |
| 2005/0266621 A1 | 12/2005 | Kim | | 2009/0037864 A1 | 2/2009 | Becker |
| 2005/0268256 A1 | 12/2005 | Tsai et al. | | 2009/0075485 A1 | 3/2009 | Ban et al. |
| 2005/0280031 A1 | 12/2005 | Yano | | 2009/0077524 A1 | 3/2009 | Nagamura et al. |
| 2006/0038234 A1 | 2/2006 | Liaw | | 2009/0085067 A1 | 4/2009 | Hayashi et al. |
| 2006/0063334 A1 | 3/2006 | Donze et al. | | 2009/0087991 A1 | 4/2009 | Yatsuda et al. |
| 2006/0070018 A1 | 3/2006 | Semmler | | 2009/0101940 A1 | 4/2009 | Barrows et al. |
| 2006/0084261 A1 | 4/2006 | Iwaki | | 2009/0106714 A1 | 4/2009 | Culp et al. |
| 2006/0091550 A1 | 5/2006 | Shimazaki et al. | | 2009/0155990 A1 | 6/2009 | Yanagidaira et al. |
| 2006/0095872 A1 | 5/2006 | McElvain et al. | | 2009/0181314 A1 | 7/2009 | Shyu et al. |
| 2006/0101370 A1 | 5/2006 | Cui et al. | | 2009/0187871 A1 | 7/2009 | Cork |
| 2006/0112355 A1 | 5/2006 | Pileggi et al. ..................... 716/1 | | 2009/0206443 A1 | 8/2009 | Juengling |
| 2006/0113567 A1 | 6/2006 | Ohmori et al. | | 2009/0224317 A1 | 9/2009 | Becker |
| 2006/0120143 A1 | 6/2006 | Liaw | | 2009/0224408 A1 | 9/2009 | Fox |
| 2006/0121715 A1* | 6/2006 | Chang et al. ................... 438/599 | | 2009/0228853 A1 | 9/2009 | Hong et al. |
| 2006/0123376 A1 | 6/2006 | Vogel et al. | | 2009/0228857 A1 | 9/2009 | Kornachuk et al. |
| 2006/0125024 A1 | 6/2006 | Ishigaki | | 2009/0273100 A1 | 11/2009 | Aton et al. |
| 2006/0131609 A1 | 6/2006 | Kinoshita et al. | | 2009/0280582 A1 | 11/2009 | Thijs et al. |
| 2006/0136848 A1 | 6/2006 | Ichiryu et al. | | 2009/0302372 A1 | 12/2009 | Chang et al. |
| 2006/0146638 A1 | 7/2006 | Chang et al. | | 2009/0319977 A1 | 12/2009 | Saxena et al. |
| 2006/0151810 A1 | 7/2006 | Ohshige ........................ 257/207 | | 2010/0001321 A1 | 1/2010 | Becker |
| 2006/0158270 A1 | 7/2006 | Gibet et al. | | 2010/0006897 A1 | 1/2010 | Becker |
| 2006/0177744 A1 | 8/2006 | Bodendorf et al. | | 2010/0006898 A1 | 1/2010 | Becker |
| 2006/0181310 A1 | 8/2006 | Rhee | | 2010/0006899 A1 | 1/2010 | Becker |
| 2006/0195809 A1 | 8/2006 | Cohn et al. | | 2010/0006900 A1 | 1/2010 | Becker |
| 2006/0197557 A1 | 9/2006 | Chung | | 2010/0006901 A1 | 1/2010 | Becker |
| 2006/0206854 A1 | 9/2006 | Barnes et al. | | 2010/0006902 A1 | 1/2010 | Becker |
| 2006/0223302 A1 | 10/2006 | Chang et al. | | 2010/0006903 A1 | 1/2010 | Becker |
| 2006/0248495 A1 | 11/2006 | Sezginer | | 2010/0006947 A1 | 1/2010 | Becker |
| 2007/0001304 A1 | 1/2007 | Liaw | | 2010/0006948 A1 | 1/2010 | Becker |
| 2007/0002617 A1 | 1/2007 | Houston | | 2010/0006950 A1 | 1/2010 | Becker |
| 2007/0038973 A1 | 2/2007 | Li et al. | | 2010/0006951 A1 | 1/2010 | Becker |
| 2007/0074145 A1 | 3/2007 | Tanaka | | 2010/0006986 A1 | 1/2010 | Becker |
| 2007/0094634 A1 | 4/2007 | Seizginer et al. | | 2010/0011327 A1 | 1/2010 | Becker |
| 2007/0101305 A1 | 5/2007 | Smith et al. | | 2010/0011328 A1 | 1/2010 | Becker |
| 2007/0105023 A1 | 5/2007 | Zhou et al. | | 2010/0011329 A1 | 1/2010 | Becker |
| 2007/0106971 A1 | 5/2007 | Lien et al. | | 2010/0011330 A1 | 1/2010 | Becker |
| 2007/0113216 A1 | 5/2007 | Zhang | | 2010/0011331 A1 | 1/2010 | Becker |
| 2007/0172770 A1 | 7/2007 | Witters et al. | | 2010/0011332 A1 | 1/2010 | Becker |
| 2007/0196958 A1 | 8/2007 | Bhattacharya et al. | | 2010/0011333 A1 | 1/2010 | Becker |
| 2007/0209029 A1 | 9/2007 | Ivonin et al. | | 2010/0012981 A1 | 1/2010 | Becker |
| 2007/0210391 A1 | 9/2007 | Becker et al. | | 2010/0012982 A1 | 1/2010 | Becker |
| 2007/0234252 A1 | 10/2007 | Visweswariah et al. | | 2010/0012983 A1 | 1/2010 | Becker |
| 2007/0251771 A1 | 11/2007 | Robles | | 2010/0012984 A1 | 1/2010 | Becker |
| 2007/0256039 A1 | 11/2007 | White | | 2010/0012985 A1 | 1/2010 | Becker |
| 2007/0257277 A1 | 11/2007 | Takeda et al. | | 2010/0012986 A1 | 1/2010 | Becker |
| 2007/0274140 A1 | 11/2007 | Joshi et al. | | 2010/0017766 A1 | 1/2010 | Becker |
| 2007/0277129 A1 | 11/2007 | Allen et al. | | 2010/0017767 A1 | 1/2010 | Becker |
| 2007/0288882 A1 | 12/2007 | Kniffin et al. | | 2010/0017768 A1 | 1/2010 | Becker |
| 2007/0290361 A1 | 12/2007 | Chen | | 2010/0017769 A1 | 1/2010 | Becker |
| 2007/0294652 A1 | 12/2007 | Bowen | | 2010/0017770 A1 | 1/2010 | Becker |
| 2007/0297249 A1 | 12/2007 | Chang et al. | | 2010/0017771 A1 | 1/2010 | Becker |
| 2008/0005712 A1 | 1/2008 | Charlebois et al. | | 2010/0017772 A1 | 1/2010 | Becker |
| 2008/0046846 A1 | 2/2008 | Chew et al. | | 2010/0019280 A1 | 1/2010 | Becker |
| 2008/0082952 A1 | 4/2008 | O'Brien | | 2010/0019281 A1 | 1/2010 | Becker |
| 2008/0086712 A1 | 4/2008 | Fujimoto | | 2010/0019282 A1 | 1/2010 | Becker |
| 2008/0097641 A1 | 4/2008 | Miyashita et al. | | 2010/0019283 A1 | 1/2010 | Becker |
| 2008/0098334 A1 | 4/2008 | Pileggi et al. | | 2010/0019284 A1 | 1/2010 | Becker |
| 2008/0099795 A1 | 5/2008 | Bernstein et al. | | 2010/0019285 A1 | 1/2010 | Becker |
| 2008/0127000 A1 | 5/2008 | Majumder et al. | | 2010/0019286 A1 | 1/2010 | Becker |
| 2008/0127029 A1 | 5/2008 | Graur et al. | | 2010/0019287 A1 | 1/2010 | Becker |
| 2008/0134128 A1 | 6/2008 | Blatchford et al. | | 2010/0019288 A1 | 1/2010 | Becker |
| 2008/0144361 A1 | 6/2008 | Wong | | 2010/0019308 A1 | 1/2010 | Chan et al. |
| 2008/0148216 A1 | 6/2008 | Chan et al. | | 2010/0023906 A1 | 1/2010 | Becker |
| 2008/0163141 A1 | 7/2008 | Scheffer et al. | | 2010/0023907 A1 | 1/2010 | Becker |
| 2008/0168406 A1 | 7/2008 | Rahmat et al. | | 2010/0023908 A1 | 1/2010 | Becker |
| 2008/0211028 A1 | 9/2008 | Suzuki | | 2010/0023911 A1 | 1/2010 | Becker |
| 2008/0216207 A1 | 9/2008 | Tsai | | 2010/0025731 A1 | 2/2010 | Becker |
| 2008/0244494 A1 | 10/2008 | McCullen | | 2010/0025732 A1 | 2/2010 | Becker |
| 2008/0265290 A1 | 10/2008 | Nielsen et al. | | 2010/0025733 A1 | 2/2010 | Becker |
| 2008/0276105 A1 | 11/2008 | Hoberman et al. | | 2010/0025734 A1 | 2/2010 | Becker |
| 2008/0283910 A1 | 11/2008 | Dreeskornfeld et al. | | 2010/0025735 A1 | 2/2010 | Becker |
| 2008/0285331 A1 | 11/2008 | Torok et al. | | 2010/0025736 A1 | 2/2010 | Becker |
| 2008/0308848 A1 | 12/2008 | Inaba | | 2010/0032721 A1 | 2/2010 | Becker |

| | | | |
|---|---|---|---|
| 2010/0032722 A1 | 2/2010 | Becker |
| 2010/0032723 A1 | 2/2010 | Becker |
| 2010/0032724 A1 | 2/2010 | Becker |
| 2010/0032726 A1 | 2/2010 | Becker |
| 2010/0037194 A1 | 2/2010 | Becker |
| 2010/0037195 A1 | 2/2010 | Becker |
| 2010/0096671 A1 | 4/2010 | Becker |
| 2010/0187615 A1 | 7/2010 | Becker |
| 2010/0187616 A1 | 7/2010 | Becker |
| 2010/0187617 A1 | 7/2010 | Becker |
| 2010/0187618 A1 | 7/2010 | Becker |
| 2010/0187619 A1 | 7/2010 | Becker |
| 2010/0187620 A1 | 7/2010 | Becker |
| 2010/0187621 A1 | 7/2010 | Becker |
| 2010/0187622 A1 | 7/2010 | Becker |
| 2010/0187623 A1 | 7/2010 | Becker |
| 2010/0187624 A1 | 7/2010 | Becker |
| 2010/0187625 A1 | 7/2010 | Becker |
| 2010/0187626 A1 | 7/2010 | Becker |
| 2010/0187627 A1 | 7/2010 | Becker |
| 2010/0187628 A1 | 7/2010 | Becker |
| 2010/0187630 A1 | 7/2010 | Becker |
| 2010/0187631 A1 | 7/2010 | Becker |
| 2010/0187632 A1 | 7/2010 | Becker |
| 2010/0187633 A1 | 7/2010 | Becker |
| 2010/0187634 A1 | 7/2010 | Becker |
| 2010/0203689 A1 | 8/2010 | Bernstein et al. |
| 2010/0224943 A1 | 9/2010 | Kawasaki |
| 2010/0229140 A1 | 9/2010 | Werner et al. |
| 2010/0232212 A1 | 9/2010 | Anderson et al. |
| 2010/0237426 A1 | 9/2010 | Becker |
| 2010/0237427 A1 | 9/2010 | Becker |
| 2010/0237428 A1 | 9/2010 | Becker |
| 2010/0237429 A1 | 9/2010 | Becker |
| 2010/0237430 A1 | 9/2010 | Becker |
| 2010/0252889 A1 | 10/2010 | Becker |
| 2010/0252890 A1 | 10/2010 | Becker |
| 2010/0252891 A1 | 10/2010 | Becker |
| 2010/0252892 A1 | 10/2010 | Becker |
| 2010/0252893 A1 | 10/2010 | Becker |
| 2010/0258879 A1 | 10/2010 | Becker |
| 2010/0264468 A1 | 10/2010 | Xu |
| 2010/0270681 A1 | 10/2010 | Bird et al. |
| 2010/0287518 A1 | 11/2010 | Becker |
| 2011/0016909 A1 | 1/2011 | Mirza et al. |
| 2011/0108890 A1 | 5/2011 | Becker et al. |
| 2011/0108891 A1 | 5/2011 | Becker et al. |
| 2011/0154281 A1 | 6/2011 | Zach |
| 2011/0207298 A1 | 8/2011 | Anderson et al. |
| 2011/0260253 A1 | 10/2011 | Inaba |
| 2011/0298025 A1 | 12/2011 | Haensch et al. |
| 2012/0012932 A1 | 1/2012 | Perng et al. |
| 2012/0273841 A1 | 11/2012 | Quandt et al. |

FOREIGN PATENT DOCUMENTS

| | | |
|---|---|---|
| EP | 1394858 | 3/2004 |
| EP | 1670062 | 6/2006 |
| EP | 1833091 | 8/2007 |
| EP | 1730777 | 9/2007 |
| EP | 2251901 | 11/2010 |
| FR | 2860920 | 4/2005 |
| JP | 2684980 | 7/1995 |
| JP | 1995-302706 | 11/1995 |
| JP | 1997-09289251 A | 11/1997 |
| JP | 10-116911 | 5/1998 |
| JP | 1999-045948 | 2/1999 |
| JP | 2001-068558 | 3/2001 |
| JP | 2002-026125 | 1/2002 |
| JP | 2002-184870 A | 6/2002 |
| JP | 2001-056463 | 9/2002 |
| JP | 2002-258463 | 9/2002 |
| JP | 2002-289703 | 10/2002 |
| JP | 2001-272228 | 3/2003 |
| JP | 2004-013920 | 1/2004 |
| JP | 2004-200300 | 7/2004 |
| JP | 2005-020008 | 1/2005 |
| JP | 2003-359375 | 5/2005 |
| JP | 2005-135971 A | 5/2005 |
| JP | 2005-149265 | 6/2005 |
| JP | 2005-203447 | 7/2005 |
| JP | 2005-259913 | 9/2005 |
| JP | 2005-114752 | 10/2006 |
| JP | 2006-303022 A | 11/2006 |
| KR | 10-0417093 | 6/1997 |
| KR | 10-1998-087485 | 12/1998 |
| KR | 1998-0084215 A | 12/1998 |
| KR | 10-1999-0057943 | 7/1999 |
| KR | 10-1999-0057943 A | 7/1999 |
| KR | 10-2000-0028830 A | 5/2000 |
| KR | 10-2000-0028830 A | 5/2000 |
| KR | 10-2002-0034313 | 5/2002 |
| KR | 10-2002-0070777 | 9/2002 |
| KR | 2003-0022006 | 3/2003 |
| KR | 10-2005-0030347 A | 3/2005 |
| KR | 10-2005-0030347 A | 3/2005 |
| KR | 2005-0037965 A | 4/2005 |
| KR | 2006-0108233 A | 10/2006 |
| TW | 386288 | 4/2000 |
| WO | WO 2005/104356 | 11/2005 |
| WO | WO 2006/014849 | 2/2006 |
| WO | WO 2006/052738 | 5/2006 |
| WO | WO 2007/014053 | 2/2007 |
| WO | WO 2007/103587 | 9/2007 |

OTHER PUBLICATIONS

Wang, J. et al., Statndard Cell Layout with Regular Contact Placement, IEEE Trans. on Semicon. Mfg., vol. 17, No. 3, Aug. 2004.

Kang, S.M., Metal-Metal Matrix (M3) for High-Speed MOS VLSI Layout, IEEE Trans. on CAD, vol. CAD-6, No. 5, Sep. 1987.

Liebmann, L. W., Layout Impact of Resolution Enhancement Techniques: Impediment or Opportunity?, International Symposium on Physical Design, 2003.

Jhaveri, T. et al., Maximization of Layout Printability/Manufacturability by Extreme Layout Regularity, Proc. of the SPIE, Apr. 2006.

Acar, et al., "A Linear-Centric Simulation Framework for Parametric Fluctuations", 2002, IEEE, Carnegie Mellon University USA, pp. 1-8.

Amazawa, et al., "Fully Planarized Four-Level Interconnection with Stacked VLAS Using CMP of Selective CVD-A1 and Insulator and its Application to Quarter Micron Gate Array LSIs", 1995, IEEE, Japan, pp. 473-476.

Burkhardt, et al., "Dark Field Double Dipole Lithography (DDL) for Back-End-Of-Line Processes", 2007, SPIE Proceeding Series, vol. 6520; 65200K.

Capetti, et al., "Sub k1=0.25 Lithography with Double Patterning Technique for 45nm Technology Node Flash Memory Devices at λ=193nm", 2007, SPIE Proceeding Series, vol. 6520; 65202K.

Chandra, et al., "An Interconnect Channel Design Methodology for High Performance Integrated Circuits", 2004, IEEE, Carnegie Mellon University, pp. 1-6.

Cheng, et al., "Feasibility Study of Splitting Pitch Technology on 45nm Contact Paterning with 0.93 NA", 2007, SPIE Proceeding Series, vol. 6520; 65202N.

Chow, et al., "The Design of a SRAM-Based Field-Programmable Gate Array—Part II: Circuit Design and Layout", 1999, IEEE, vol. 7 # 3 pp. 321-330.

DeVor, et al., "Statistical Quality Design and Control", 1992, Macmillan Publishing Company, pp. 264-267.

Dusa, et al. "Pitch Doubling Through Dual Patterning Lithography Challenges in Integration and Litho Budgets", 2007, SPIE Proceeding Series, vol. 6520; 65200G.

El-Gamal, "Fast, Cheap and Under Control: the Next Implementation Fabric", Jun. 2-6, 2003, ACM Press, pp. 354-355.

Frankel, "Quantum State Control Interference Lithography and Trim Double Patterning for 32-16nm Lithography", 2007, SPIE Proceeding Series, vol. 6520; 65202L.

Hayashida, et al., "Manufactuable Local Interconnect technology Fully Compatible with Titanium Salicide Process", Jun. 11-12, 1991, VMIC Conference.

Heng, et al., "A VLSI Artwork Legalization Technique Base on a New Criterion of Minimum Layout Perturbation", 1997, ACM Press, pp. 116-121.

Hu, et al., "Synthesis and Placemant Flow for Gain-Based Programmable Regular Fabrics", Apr. 6-9, 2003, ACM Press, pp. 197-203.
Hutton, et al., "A Methodology for FPGA to Structured-ASIC Synthesis and Verification", 2006, EDAA, pp. 64-69.
Jayakumar, et al., "A Metal and VIA Maskset Programmable VLSI Design Methodology using PLAs", 2004, IEEE, pp. 590-594.
Kheterpal, et al., "Routing Architecture Exploration for Regular Fabrics", DAC, Jun. 7-11, 2004, ACM Press, pp. 204-207.
Kheterpal, et al., "Design Methodlgy for IC Manufactrability Based on Regular Logic-Bricks", DAC, Jun. 13-17, 2005, IEEE/AMC, vol. 6520.
Kim, et al., "Issues and Challenges of Double Patterning Lithography in DRAM", 2007, SPIE Proceeding Series, vol. 6520; 65200H.
Kim, et al., "Double Exposure Using 193nm Negative Tone Photoresist", 2007, SPIE Proceeding Series, vol. 6520; 65202M.
Koorapaty, et al., "Heterogeneous Logic Block Architectures for Via-Patterned Programmable Fabric", 13th International Conference on Field Programmable Logic and Applications (FPL) 2003, Lecture Notes in Computer Science (LNCS), Sep. 2003, Springer-Verlag, vol. 2778, pp. 426-436.
Koorapaty, et al., "Modular, Fabric-Specific Synthesis for Programmable Architectures", 12th International Conference on Field Programmable Logic and Applications (FPL_2002, Lecture Notes in Computer Science (LNCS)), Sep. 2002, Springer-Verlag, vol. 2438 pp. 132-141.
Koorapaty, et al., "Exploring Logic Block Granularity for Regular Fabrics", 2004, IEEE, pp. 1-6.
Li, et al., "A Linear-Centric Modeling Approach to Harmonic Balance Analysis", 2002, IEEE, pp. 1-6.
Li, et al., "Nonlinear Distortion Analysis Via Linear-Centric Models", 2003, IEEE, pp. 897-903.
Liebmann et al., "Integrating DfM Components Into a Cohesive Design-To-Silicon Solution", IBM Systems and Technology Group, b IBM Research, pp. 1-12.
Liebmann, et al., "High-Performance Circuit Design for the RET-Enabled 65nm Technology Node", Feb. 26-27, 2004, SPIE Proceeding Series, vol. 5379 pp. 20-29.
Liu, et al., "Double Patterning with Multilayer Hard Mask Shrinkage for Sub-0.25 k1 Lithography", 200, SPIE Proceeding Series, vol. 6520; 65202J.
Mo, et al., "Checkerboard: A Regular Structure and its Synthesis, International Workshop on Logic and Synthesis", 2003, Department of Electrical Engineering and Computer Sciences, UC Berkeley, California, pp. 1-7.
Mo, et al., "PLA-Based Regular Structures and Their Synthesis", 2003, Department of Electrical Engineering and Computer Sciences, IEEE, pp. 723-729.
Mo, et al., "Regular Farbrics in Deep Sub-Micron Integrated-Circuit Design", 2004, Kluwer Academic Publishers, Entire Book.
Op de Beek, et al., "Manufacturability issues with Double Patterning for 50nm half pitch damscene applications, using RELACS® shrink and corresponding OPC", 2007, SPIE Proceeding Series, vol. 6520; 652001.
Or-Bach, "Programmable Circuit Fabrics", Sep. 18, 2001, e-ASIC, pp. 1-36.
Otten, et al., "Planning for Performance", DAC 1998, ACM Inc., pp. 122-127.
Pandini, et al., "Congestion-Aware Logic Synthesis", 2002, IEEE, pp. 1-8.
Pandini, et al., "Understanding and Addressing the Impact of Wiring Congestion During Technology Mapping", ISPD Apr. 7-10, 2002, ACM Press, pp. 131-136.
Patel, et al., "An Architectural Exploration of Via Patterned Gate Arrays, ISPD 2003", Apr. 6, 2003, pp. 184-189.
Pileggi, et al., "Exploring Regular Fabrics to Optimize the Performance-Cost Trade-Offs, Proceedings of the 40th ACM/IEEE Design Automation Conference (DAC) 2003", Jun. 2003, ACM Press, pp. 782-787.
Poonawala, et al., "Ilt for Double Exposure Lithography with Conventional and Novel Materials", 2007, SPIE Proceeding Series, vol. 6520; 65202Q.

Ran, et al., "Designing a Via-Configurable Regular Fabric", Custom Integrated Circuits Coference (CICC). Proceedings of the IEEE, Oct. 2004, Oct. 1, 2004, pp. 423-426.
Ran, et al., "On Designing Via-Configurable Cell Blocks for Regular Fabrics" Proceedings of the Design Automation Conference (DAC) 2004, Jun. 2004, ACM Press, pp. 198-203.
Ran, et al., "An Integrated Design Flow for a Via-Configurable Gate Array", 2004, IEEE, pp. 582-589.
Ran, et al., "Via-Configurable Routing Architectures and Fast Design Mappability Estimation for Regular Fabrics", 2005, IEEE, pp. 25-32.
Ran, et al., "The Magic of a Via-Configurable Regular Fabric", Proceedings of the IEEE International Conference on Computer Design (ICCD) Oct. 2004.
Reis, et al., "Physical Design Methodologies for Performance Predictability and Manufacturability", Apr. 14-16, 2004, ACM Press, pp. 390-397.
Robertson, et al., "The Modeling of Double Patterning Lithographic Processes", 2007, SPIE Proceeding Series, vol. 6520; 65200J.
Rovner, "Design for Manufacturability in Via Programmable Gate Arrays", May 2003, Graduate School of Cagegie Mellon University.
Sengupta, "An Integrated CAD Framework Linking VLSI Layout Editors and Process Simulators", 1998, Thesis for Rice University, pp. 1-101.
Sengupta, et al., "An Integrated CAD Framework Linking VLSI Layout Editors and Process Simulators", 1996, SPIE Proceeding Series, vol. 2726; pp. 244-252.
Sherlekar, "Design Considerations for Regular Fabrics", Apr. 18-21, 2004, ACM Press, pp. 97-102.
Stapper, "Modeling of Defects in Integrated Circuit Photolithographic Patterns", Jul. 1, 1984, IBM, vol. 28 # 4, pp. 461-475.
Taylor, et al., "Enabling Energy Efficiency in Via-Patterned Gate Array Devices", Jun. 7-11, 2004, ACM Press, pp. 874-877.
Tong, et al., "Regular Logic Fabrics for a Via Patterned Gate Array (VPGA), Custom Integrated Circuits Conference", Sep. 2003, Proceedings of the IEEE, pp. 53-56.
Vanleehgove, et al., "A Litho-Only Approach to Double Patterning", 2007, SPIE Proceeding Series, vol. 6520; 65202F.
Wenren, et al., "The Improvement of Photolithographic Fidelity of Two-dimensional Structures Though Double Exposure Method", 2007, SPIE Proceeding Series, vol. 6520; 652021.
Wilcox, et al., "Design for Manufacturability: A Key to Semiconductor Manufacturing Excellence", 1998, IEEE, pp. 308-313.
Wu, et al., "A Study of Process Window Capabilities for Two-dimensional Structures under Double Exposure Condition", 2007, SPIE Proceeding Series, vol. 6520; 652020.
Xiong, et al., "The Constrained Via Minimization Problem for PCB and VLSI Design", 1988, ACM Press/IEEE, pp. 573-578.
Yamamaoto, et al., "New Double Exposure Technique without Alternating Phase Shift Mask", 2007, SPIE Proceeding Series, vol. 6520; 652052P.
Yang, et al., "Interconnection Driven VLSI Module Placement Based on Quadratic Programming and Considering Congestion Using LFF Principles", 2004, IEEE, pp. 1243-1247.
Yao, et al., "Multilevel Routing With Redundant Via Insertion", Oct. 2006, IEEE, pp. 1148-1152.
Zheng, et al."Modeling and Analysis of Regular Symmetrically Structured Power/Ground Distribution Networks", DAC, Jun. 10-14, 2002, ACM Press, pp. 395-398.
Zhu, et al., "A Study of Double Exposure Process Design with Balanced Performance Parameters for Line/Space Applications", 2007, SPIE Proceeding Series, vol. 6520; 65202H.
Zuchowski, et al., "A Hybrid ASIC and FPGA Architecture", 2003, IEEE, pp. 187-194.
Axelrad et al. "Efficient Full-Chip Yield Analysis Methodology for OPC-Corrected VLSI Design", 2000, International Symposium on Quality Electronic Design (ISQED).
Balasinski et al. "Impact of Subwavelength CD Tolerance on Device Performance", 2002, SPIE.
Clark et al. "Managing Standby and Active Mode Leakage Power in Deep Sub-Micron Design", Aug. 9-11, 2004, ACM.
Cobb et al. "Using OPC to Optimize for Image Slope and Improve Process Window", 2003, SPIE.
Devgan "Leakage Issues in IC Design: Part 3", 2003, CCAD.

Garg, et al. " Lithography Driven Layout Design", 2005, IEEE.

Grobman et al. "Reticle Enhancement Technology Trends: Resource and Manufacturability Implications for the Implementation of Physical Designs" Apr. 1-4, 2001, ACM.

Grobman et al. "Reticle Enhancement Technology: Implications and Challenges for Physical Design" Jun. 18-22, 2001, ACM.

Gupta et al. " Enhanced Resist and Etch CD Control by Design Perturbation", Oct. 4-7, 2006, Society of Photo-Optical Instrumentation Engineers.

Gupta et al. "A Practical Transistor-Level Dual Threshold Voltage Assignment Methodology", 2005, Sixth International Symposium on Quality Electronic Design (ISQED).

Gupta et al. "Detailed Placement for Improved Depth of Focus and CD Control", 2005, ACM.

Gupta et al. "Joining the Design and Mask Flows for Better and Cheaper Masks", Oct. 14-17, 2004, Society of Photo-Optical Instrumentation Engineers.

Gupta et al. "Selective Gate-Length Biasing for Cost-Effective Runtime Leakage Control", Jun. 7-11, 2004, ACM.

Gupta et al. "Wafer Topography-Aware Optical Proximity Correction for Better DOF Margin and CD Control", Apr. 13-15, 2005, SPIE.

Heng, et al., "Toward Through-Process Layout Quality Metrics", Mar. 3-4, 2005, Society of Photo-Optical Instrumentation Engineers.

Intel Core Microarchitecture White Paper "Introducing the 45 nm Next-Generation Intel Core Microarchitecture," 2007, Intel Corporation.

Lavin et al. "Backend DAC Flows for "Restrictive Design Rules"", 2004, IEEE.

Miller, "Manufacturing-Aware Design Helps Boost IC Yield", Sep. 9, 2004, http://www.eetimes.com/showArtiele.jhtml?articleID=47102054.

Moore, Samuel K., "Intel 45-nanometer Penryn Processors Arrive," Nov. 13, 2007, IEEE Spectrum, http://spectrum.ieee.org/semiconductors/design/intel-45nanometer-penryn-processors-arrive.

Mutoh et al. "1-V Power Supply High-Speed Digital Circuit Technology with Multithreshold-Voltage CMOS", 1995, IEEE.

Pack et al. "Physical & Timing Verification of Subwavelength-Scale Designs-Part I: Lithography Impact on MOSFETs", 2003, SPIE.

Qian et al. "Advanced Physical Models for Mask Data Verification and Impacts on Physical Layout Synthesis" 2003. IEEE.

Sreedhar et al. " Statistical Yield Modeling for Sub-Wavelength Lithography", 2008, IEEE.

Tian et al. "Model-Based Dummy Feature Placement for Oxide Chemical_Mechanical Polishing Manufacturability" 2000, ACM.

Wang, et al., "Performance Optimization for Gridded-Layout Standard Cells", 2004, vol. 5567 SPIE.

Webb, Clair, "Layout Rule Trends and Affect upon CPU Design", 2006, vol. 6156 SPIE.

Webb, Clair, "45nm Design for Manufacturing," Intel Technology Journal, vol. 12, Issue 02, Jun. 17, 2008, ISSN 1535-864X, pp. 121-130.

Zhu, et al., "A Stochastic Integral Equation Method for Modeling the Rough Surface Effect on Interconnect Capacitance", 2004, IEEE.

U.S. Appl. No. 60/625,342, filed May 25, 2006, Pileggi et al.

Capodieci, L., et al., "Toward a Methodology for Manufacturability-Driven Design Rule Exploration," DAC 2004, Jun. 7-11, 2004, San Diego, CA.

Dictionary.com, "channel," in Collins English Dictionary—Complete & Unabridged 10th Edition. Source location: HarperCollins Publishers. http://dictionary.reference.com/browse/channel. Available: http://dictionary.reference.com.

Firedberg, et al., "Modeling Within-Field Gate Length Spatial Variation for Process-Design Co-Optimization," 2005 Proc. of SPIE vol. 5756, pp. 178-188.

Gupta et al. "Manufacturing-Aware Physical Design", 2003, ACM.

Gupta, Puneet, et al., "Manufacturing-aware Design Methodology for Assist Feature Correctness," 2005.

Ha et al., "Reduction in the Mask Error Factor by Optimizing the Diffraction Order of a Scattering Bar in Lithography," Journal of the Korean Physical Society, vol. 46, No. 5, May 2005, pp. 1213-1217.

Hakko, et al., "Extension of the 2D-TCC Technique to Optimize Mask Pattern Layouts," 2008 Proc. of SPIE vol. 7028, 11 pages.

Halpin et al., "Detailed Placement with Net Length Constraints," Publication Year 2003, Proceedings of the 3rd IEEE International Workshop on System-on-Chip for Real-Time Applications, pp. 22-27.

Hur et al., "Mongrel: Hybrid Techniques for Standard Cell Placement," Publication Year 2000, IFEE/ACM International Conference on Computer Aided Design, ICCAD-2000, pp. 165-170.

Kawashima, et al., "Mask Optimization for Arbitrary Patterns with 2D-TCC Resolution Enhancement Technique," 2008 Proc. of SPIE vol. 6924, 12 pages.

Kuh et al., "Recent Advances in VLSI Layout," Publication Year 1990, Proceedings of the IEEE, vol. 78, Issue 2, pp. 237-263.

Liebmann et al., "Optimizing Style Options for Sub-Resolution Assist Features," Proc. of SPIE vol. 4346, 2001, pp. 141-152.

Mansfield et al., "Lithographic Comparison of Assist Feature Design Strategies," Proc. of SPIE vol. 4000, 2000, pp. 63-76.

Mishra, P., et al., "FinFET Circuit Design," Nanoelectronic Circuit Design, pp. 23-54, 2011.

Pham, D., et al., "FINFET Device Junction Formation Challenges," 2006 International Workshop on Junction Technology, pp. 73-77, Aug. 2006.

Rosenbluth, et al., "Optimum Mask and Source Patterns to Print a Given Shape," 2001 Proc. of SPIE vol. 4346, pp. 486-502.

Shi et al., "Understanding the Forbidden Pitch and Assist Feature Placement," Proc. of SPIE vol. 4562, 2002, pp. 968-979.

Smayling et al., "APF Pitch Halving for 22 nm Logic Cells Using Gridded Design Rules," Proceedings of SPIE, USA, vol. 6925, Jan. 1, 2008, pp. 69251E-1-69251E-7.

Socha, et al., "Simultaneous Source Mask Optimization (SMO)," 2005 Proc. of SPIE vol. 5853, pp. 180-193.

Wong, et al., "Resolution Enhancement Techniques and Design for Manufacturability: Containing and Accounting for Variabilities in Integrated Circuit Creation," J. Micro/Nanolith. MEMS MOEMS, Jul.-Sep. 2007, vol. 6(3), 2 pages.

Yamazoe, et al., "Resolution Enhancement by Aerial Image Approximation with 2D-TCC," 2007 Proc. of SPIE vol. 6730, 12 pages.

Yu, et al., "True Process Variation Aware Optical Proximity Correction with Variational Lithography Modeling and Model Calibration," J. Micro/Nanolith. MEMS MOEMS, Jul.-Sep. 2007, vol. 6(3), 16 pages.

Alam, Syed M. et al., "A Comprehensive Layout Methodology and Layout-Specific Circuit Analyses for Three-Dimensional Integrated Circuits," Mar. 21, 2002.

Alam, Syed M. et al., "Layout-Specific Circuit Evaluation in 3-D Integrated Circuits," May 2003.

Aubusson, Russel, "Wafer-Scale Integration of Semiconductor Memory," Apr. 1979.

Bachtold, "Logic Circuits with Carbon," Nov. 9, 2001.

Baker, R. Jacob, "CMOS: Circuit Design, Layout, and Simulation (2nd Edition)," Nov. 1, 2004.

Baldi et al., "A Scalable Single Poly EEPROM Cell for Embedded Memory Applications," pp. 1-4, Fig. 1, Sep. 1997.

Cao, Ke, "Design for Manufacturing (DFM) in Submicron VLSI Design," Aug. 2007.

Capodieci, Luigi, "From Optical Proximity Correction to Lithography-Driven Physical Design (1996-2006): 10 years of Resolution Enhancement Technology and the roadmap enablers for the next decade," Proc. SPIE 6154, Optical Microlithography XIX, 615401, Mar. 20, 2006.

Chang, Leland et al., "Stable SRAM Cell Design for the 32 nm Node and Beyond," Jun. 16, 2005.

Cheung, Peter, "Layout Design," Apr. 4, 2004.

Chinnery, David, "Closing the Gap Between ASIC & Custom: Tools and Techniques for High-Performance ASIC Design," Jun. 30, 2002.

Chou, Dyiann et al., "Line End Optimization through Optical Proximity Correction (OPC): A Case Study," Feb. 19, 2006.

Clein, Dan, "CMOS IC Layout: Concepts, Methodologies, and Tools," Dec. 22, 1999.

Cowell, "Exploiting Non-Uniform Access Time," Jul. 2003.

Das, Shamik, "Design Automation and Analysis of Three-Dimensional Integrated Circuits," May 1, 2004.

Dehaene, W. et al., "Technology-Aware Design of SRAM Memory Circuits," Mar. 2007.

Deng, Liang et al., "Coupling-aware Dummy Metal Insertion for Lithography," p. 1, col. 2, 2007.
Devoivre et al., "Validated 90nm CMOS Technology Platform with Low-k Copper Interconnects for Advanced System-on-Chip (SoC)," 2002.
Enbody, R. J., "Near-Optimal n-Layer Channel Routing," 1986.
Ferretti, Marcos et al., "High Performance Asynchronous ASIC Back-End Design Flow Using Single-Track Full-Buffer Standard Cells," Apr. 23, 2004.
Garg, Manish et al., "Litho-driven Layouts for Reducing Performance Variability," p. 2, Figs. 2b-2c, May 23, 2005.
Green Way, Robert et al., "32nm 1-D Regular Pitch SRAM Bitcell Design for Interference-Assisted Lithography," 2008.
Gupta et al., "Modeling Edge Placement Error Distribution in Standard Cell Library," Feb. 23-24, 2006.
Grad, Johannes et al., "A standard cell library for student projects," Proceedings of the 2003 IEEE International Conference on Microelectronic Systems Education, Jun. 2, 2003.
Hartono, Roy et al., "Active Device Generation for Automatic Analog Layout Retargeting Tool," May 13, 2004.
Hartono, Roy et al., "IPRAIL—Intellectual Property Reuse-based Analog IC Layout Automation," Mar. 17, 2003.
Hastings, Alan, "The Art of Analog Layout (2nd Edition)," Jul. 4, 2005.
Hurata et al., "A Genuine Design Manufacturability Check for Designers," 2006.
Institute of Microelectronic Systems, "Digital Subsystem Design," Oct. 13, 2006.
Ishida, M. et al., "A Novel 6T-SRAM Cell Technology Designed with Rectangular Patterns Scalable beyond 0.18 pm Generation and Desirable for Ultra High Speed Operation," 1998.
Jakusovszky, "Linear IC Parasitic Element Simulation Methodology," Oct. 1, 1993.
Jangkrajarng, Nuttorn et al., "Template-Based Parasitic-Aware Optimization and Retargeting of Analog and RF Integrated Circuit Layouts," Nov. 5, 2006.
Kahng, Andrew B., "Design Optimizations DAC-2006 DFM Tutorial, part V)," 2006.
Kang, Sung-Mo et al., "CMOS Digital Integrated Circuits Analysis & Design," Oct. 29, 2002.
Kottoor, Mathew Francis, "Development of a Standard Cell Library based on Deep Sub-Micron SCMOS Design Rules using Open Source Software (MS Thesis)," Aug. 1, 2005.
Kubicki, "Intel 65nm and Beyond (or Below): IDF Day 2 Coverage (available at http://www.anandtech.com/show/1468/4)," Sep. 9, 2004.
Kuhn, Kelin J., "Reducing Variation in Advanced Logic Technologies: Approaches to Process and Design for Manufacturability of Nanoscale CMOS," p. 27, Dec. 12, 2007.
Kurokawa, Atsushi et al., "Dummy Filling Methods for Reducing Interconnect Capacitance and Number of Fills, Proc. of ISQED," pp. 586-591, 2005.
Lavin, Mark, "Open Access Requirements from RDR Design Flows," Nov. 11, 2004.
Liebmann, Lars et al., "Layout Methodology Impact of Resolution Enhancement Techniques," pp. 5-6, 2003.
Liebmann, Lars et al., "TCAD development for lithography resolution enhancement," Sep. 2001.
Lin, Chung-Wei et al., "Recent Research and Emerging Challenges in Physical Design for Manufacturability/Reliability," Jan. 26, 2007.
Mccullen, Kevin W., "Layout Techniques for Phase Correct and Gridded Wiring," pp. 13, 17, Fig. 5, 2006.
Mosis, "Design Rules MOSIS Scalable CMOS (SCMOS) (Revision 8.00)," Oct. 4, 2004.
Mosis, "Mosis Scalable CMOS (SCMOS) Design Rules (Revision 7.2).".
Muta et al., "Manufacturability-Aware Design of Standard Cells," pp. 2686-2690, Figs. 3, 12, Dec. 2007.
Na, Kee-Yeol et al., "A Novel Single Polysilicon EEPROM Cell With a Polyfinger Capacitor," Nov. 30, 2007.
Pan et al., "Redundant Via Enahnced Maze Routing for Yield Improvement," 2005.
Park, Tae Hong, "Characterization and Modeling of Pattern Dependencies in Copper Interconnects for Integrated Circuits," Ph.D. Thesis, MIT, 2002.
Patel, Chetan, "An Architectural Exploration of Via Patterned Gate Arrays (CMU Master's Project)," May 2003.
Pease, R. Fabian et al., "Lithography and Other Patterning Techniques for Future Electronics," 2008.
Serrano, Diego Emilio, Pontificia Universidad Javeriana Facultad De Ingenieria, Departamento De Electronica, "Diseño De Multiplicador 4 X 8 en VLSI, Introduccion al VLSI," 2006.
Pramanik, "Impact of layout on variability of devices for sub 90nm technologies," 2004.
Pramanik, Dipankar et al., "Lithography-driven layout of logic cells for 65-nm node (SPIE Proceedings vol. 5042)," Jul. 10, 2003.
Roy et al., "Extending Aggressive Low-K1 Design Rule Requirements For 90 And 65 Nm Nodes Via Simultaneous Optimization Of Numerical Aperture, Illumination And Optical Proximity Correction," J.Micro/Nanolith, MEMS MOEMS, 4(2), 023003, Apr. 26, 2005.
Saint, Christopher et al., "IC Layout Basics: A Practical Guide," Chapter 3, Nov. 5, 2001.
Saint, Christopher et al., "IC Mask Design: Essential Layout Techniques," 2002.
Scheffer, "Physical CAD Changes to Incorporate Design for Lithography and Manufacturability," Feb. 4, 2004.
Smayling, Michael C., "Part 3: Test Structures, Test Chips, In-Line Metrology & Inspection," 2006.
Spence, Chris, "Full-Chip Lithography Simulation and Design Analysis: How OPC is changing IC Design, Emerging Lithographic Technologies IX," May 6, 2005.
Subramaniam, Anupama R., "Design Rule Optimization of Regular layout for Leakage Reduction in Nanoscale Design," pp. 474-478, Mar. 24, 2008.
Tang, C. W. et al., "A compact large signal model of LDMOS," 2002.
Taylor, Brian et al., "Exact Combinatorial Optimization Methods for Physical Design of Regular Logic Bricks," Jun. 8, 2007.
Tian, Ruiqi et al., "Dummy Feature Placement for Chemical-Mechanical Unifoimity in a Shallow Trench Isolation Process," IEEE Trans. on Computer-Aided Design of Integrated Circuits and Systems, vol. 21, No. 1, pp. 63-71, Jan. 2002.
Tian, Ruiqi et al., "Proximity Dummy Feature Placement and Selective Via Sizing for Process Uniformity in a Trench-First-Via-Last Dual-Inlaid Metal Process," Proc. of IITC, pp. 48-50, 2001.
Torres, J. A. et al., "RET Compliant Cell Generation for sub-130nm Processes," 2002.
Uyemura, John P., "Introduction to VLSI Circuits and Systems," Chapters 2, 3, 5, and Part 3, 2002.
Uyemura, John, "Chip Design for Submicron VLSI: CMOS Layout and Simulation," Chapters 2-5, 7-9, Feb. 8, 2005.
Verhaegen et al., "Litho Enhancements for 45nm-nod MuGFETs," Aug. 1, 2005.
Wong, Ban P., "Bridging the Gap between Dreams and Nano-Scale Reality (DAC-2006 DFM Tutorial)," 2006.
Wang, Dunwei et al., "Complementary Symmetry Silicon Nanowire Logic: Power-Efficient Inverters with Gain," 2006.
Wang, Jun et al., "Effects of grid-placed contacts on circuit performance," pp. 135-139, Figs. 2, 4-8, Feb. 28, 2003.
Wang, Jun et al., "Standard cell design with regularly placed contacts and gates (SPIE vol. 5379)," 2004.
Wang, Jun et al., "Standard cell design with resolution-enhancement-technique-driven regularly placed contacts and gates," J. Micro/Nanolith, MEMS MOEMS, 4(1), 013001, Mar. 16, 2005.
Watson, Bruce, "Challenges and Automata Applications in Chip-Design Software," pp. 38-40, 2007.
Weste, Neil et al., "CMOS VLSI Design: A Circuits and Systems Perspective, 3rd Edition," May 21, 2004.
Wingerden, Johannes van, "Experimental verification of improved printability for litho-driven designs," Mar. 14, 2005.
Wong, Alfred K., "Microlithography: Trends, Challenges, Solutions, and Their Impact on Design," 2003.
Xu, Gang, "Redundant-Via Enhanced Maze Routing for Yield Improvement," 2005.

Yang, Jie, "Manufacturability Aware Design," pp. 93, 102, Fig. 5.2, 2007.

Yongshun, Wang et al., "Static Induction Devices with Planar Type Buried Gate," 2004.

Zobrist, George (editor), "Progress in Computer Aided VLSI Design: Implementations (Ch. 5)," 1990.

* cited by examiner

View A-A

View A-A

View A-A

View A-A

View A-A

View A-A

View A-A

View A-A

View A-A

View A-A

View A-A

View A-A

View A-A

View A-A

View A-A

View A-A

View A-A

View A-A

View A-A

SUPER-SELF-ALIGNED CONTACTS AND METHOD FOR MAKING THE SAME

BACKGROUND

During semiconductor wafer fabrication, electrically conductive active area contacts are formed between active areas at the substrate level of the wafer and electrically conductive interconnect lines located above the substrate level. Also, electrically conductive gate contacts are formed between transistor gate structures within the wafer and electrically conductive interconnect lines located above the gate structures. Conventional active area contact and gate contact fabrication methods have relied upon photolithographic techniques in which a photomask is used to project a light pattern onto a photoresist layer deposited on the wafer, so as to transfer the pattern to the photoresist layer, wherein the pattern defines various openings within the photoresist layer at which contacts are to be formed. The various contacts are required to be accurately aligned to the underlying active areas and gate features for proper contact placement, and ultimately for proper device operation. Therefore, the photomask must be accurately aligned to the wafer to enable proper transfer of the contact pattern onto the wafer.

As device sizes become smaller and their features become more closely spaced on the wafer, contact placement and fabrication becomes more difficult. For example, it becomes more difficult to satisfy the increasing photomask-to-wafer alignment accuracy requirements. Therefore, it is of interest to seek methods by which contacts can be more accurately placed and fabricated for devices having smaller and more closely spaced features.

SUMMARY

In one embodiment, a method is disclosed for fabricating an active area contact within a semiconductor wafer. In the method, a number of first hard mask portions are formed over a corresponding number of underlying gate structures, such that each first hard mask portion vertically shadows a respective one of the underlying gate structures. Also in the method, a number of second hard mask filaments are formed adjacent to each of the number of first hard mask portions. A combined width of each first hard mask portion and its adjoining second hard mask filaments is greater than a width of the respective underlying gate structure. Also, a width of each second hard mask filament defines an active area contact-to-gate structure spacing. The method further includes an operation for etching a passage between facing surfaces of neighboring second hard mask filaments, and through a depth of the semiconductor wafer to an active area. Then, an electrically conductive material is deposited within the passage to form the active area contact.

In another embodiment, a method is disclosed for fabricating a gate contact within a semiconductor wafer. In the method, a first hard mask portion is formed over a gate structure within a section of the semiconductor wafer, such that the first hard mask portion vertically shadows the gate structure. Also, the first hard mask portion is formed to include substantially vertical side surfaces. Also in the method, a second hard mask filament is formed adjacent to each side surface of the first hard mask portion. An etching operation is then performed to etch a passage through the first hard mask portion, and through a depth of the semiconductor wafer to a top surface of the gate structure. During this etching operation, surfaces of the second hard mask filaments adjacent to the vertical side surfaces of the first hard mask portion are revealed through etching of the first mask portion. The revealed side surfaces of the first hard mask portion define side surfaces of the passage. The method then proceeds with an operation for depositing an electrically conductive material within the passage to form the gate contact.

In another embodiment, a method is disclosed for fabricating an active area contact and a gate contact within a semiconductor wafer. The method includes an operation for depositing a photon absorption layer between gate structures within a section of the semiconductor wafer, so as to substantially cover an area present between gate structures with the photon absorption layer while leaving a top surface of each gate structure uncovered. Then, a dielectric layer is deposited over both the photon absorption layer and the top of each gate structure within the section of the semiconductor wafer. The method continues with forming a number of first hard mask portions on the dielectric layer and over the gate structures within the section of the semiconductor wafer. Each first hard mask portion vertically shadows a respective one of the gate structures. Also, each first hard mask portion includes substantially vertical side surfaces. The method then proceeds with forming a second hard mask filament adjacent to each vertical side surface of each first hard mask portion, such that each second hard mask filament has an exposed side surface. A width of each second hard mask filament defines an active area contact-to-gate structure spacing. The method also includes an operation for etching a first passage between facing exposed side surfaces of a given pair of neighboring second hard mask filaments, and through a depth of the semiconductor wafer to an active area. The method further includes an operation for etching a second passage through a given first hard mask portion, and through a depth of the semiconductor wafer to a top surface of the gate structure underlying the given first hard mask portion. Surfaces of the second hard mask filaments adjacent to the vertical side surfaces of the given first hard mask portion are revealed through etching of the given first mask portion. These revealed surfaces of the second hard mask filaments define side surfaces of the second passage. The method then proceeds with an operation for depositing an electrically conductive material within both the first and second passages to respectively form the active area contact and the gate contact.

In another embodiment, a semiconductor device is disclosed. The semiconductor device includes a linear gate structure having side surfaces and a top surface. A width of the linear gate structure is defined by a perpendicular distance between the side surfaces of the linear gate structure. The semiconductor device also includes a gate contact disposed to electrically connect to the top surface of the linear gate structure. The gate contact has a substantially rectangular horizontal cross-section. Also, the gate contact is defined to substantially cover the width of the linear gate structure without extending substantially beyond either of the side surfaces of the gate structure.

Other aspects and advantages of the invention will become more apparent from the following detailed description, taken in conjunction with the accompanying drawings, illustrating by way of example the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1A:
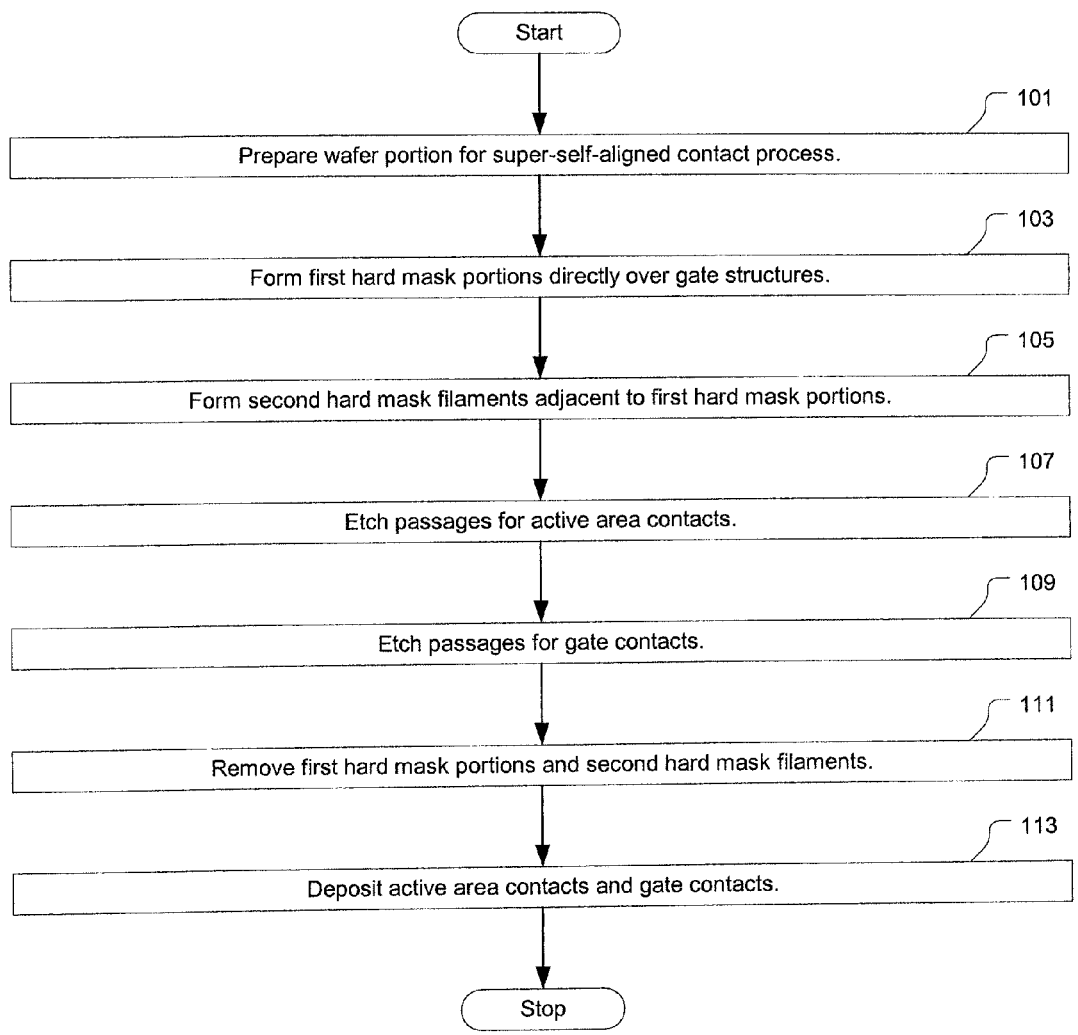
FIG. 1A is an illustration showing a flowchart of a method for fabricating super-self-aligned contacts within a semiconductor wafer, in accordance with one embodiment of the present invention.
Figure 1B:
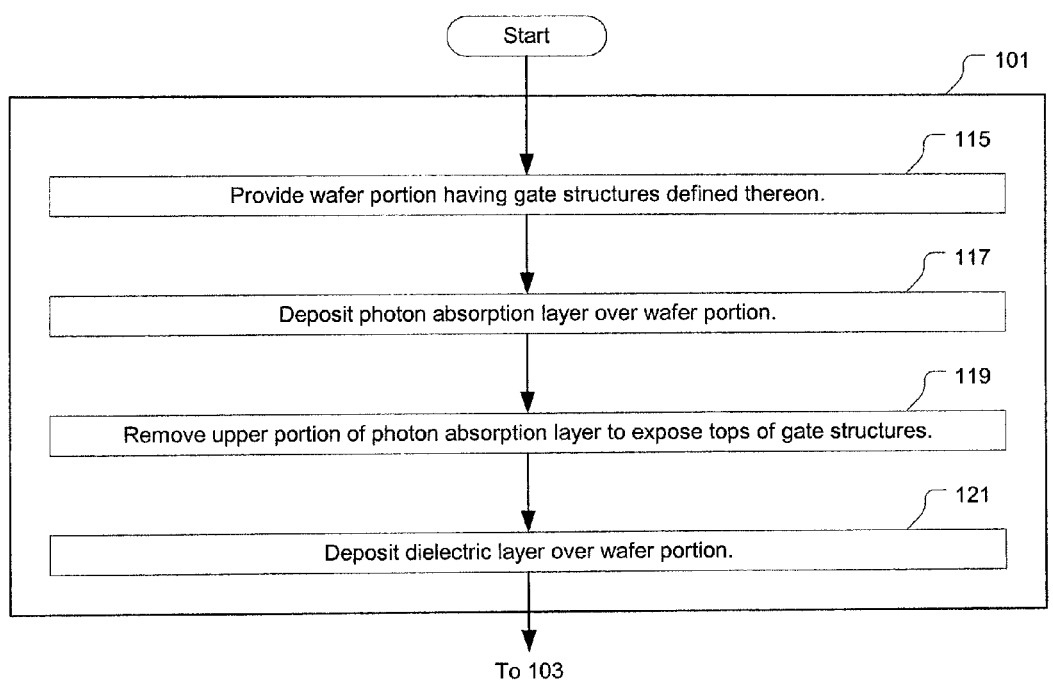
FIG. 1B is an illustration showing an expanded view of operation 101 of FIG. 1A, in accordance with one embodiment of the present invention.

FIGS. 1A-1G are illustrations showing a flowchart of a method for fabricating super-self-aligned (SSA) contacts within a semiconductor wafer ("wafer" hereafter), in accordance with one embodiment of the present invention. The SSA contacts fabricated according to the method of FIGS. 1A-1G can be either active area contacts or gate contacts. To facilitate description, FIGS. 2A-24B illustrate physical representations of a portion of the wafer as it is subjected to the operations of the method of FIGS. 1A-1G. The method begins with an operation 101 for preparing a wafer portion for the SSA contact process. FIG. 1B is an illustration showing an expanded view of operation 101, in accordance with one embodiment of the present invention. As shown in FIG. 1B, operation 101 includes an operation 115 for providing the wafer portion upon which the SSA contacts are to be fabricated.

Figure 1C:
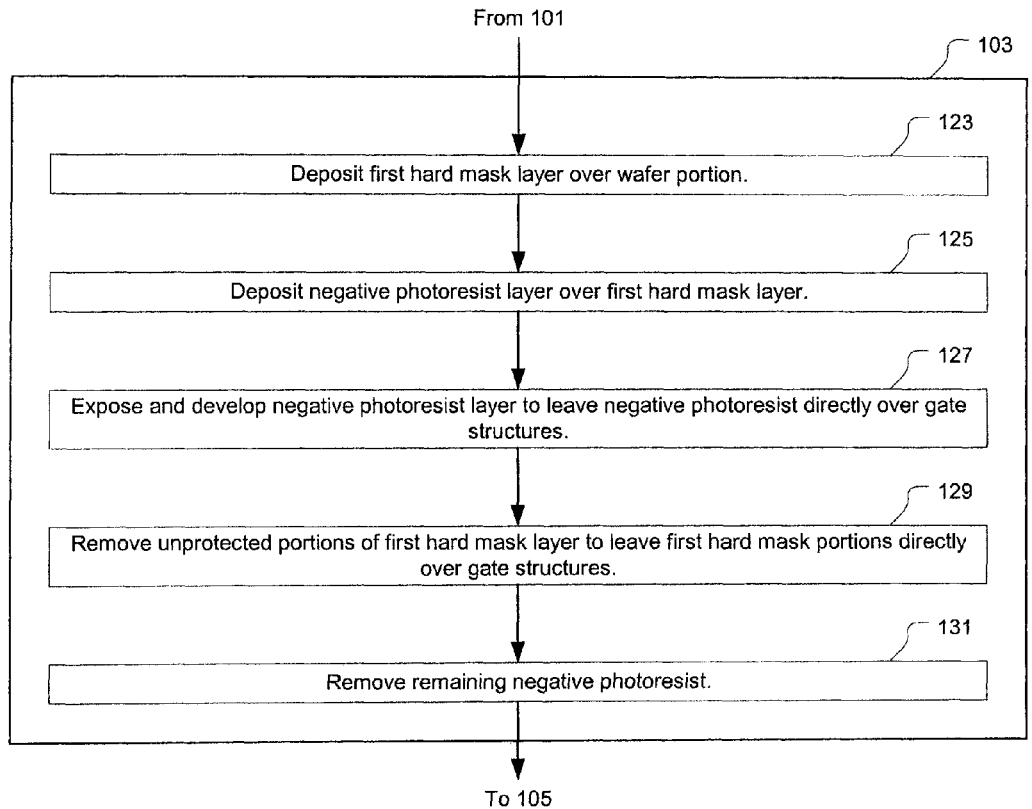
FIG. 1C is an illustration showing an expanded view of operation 103 of FIG. 1A, in accordance with one embodiment of the present invention.
Figure 1D:
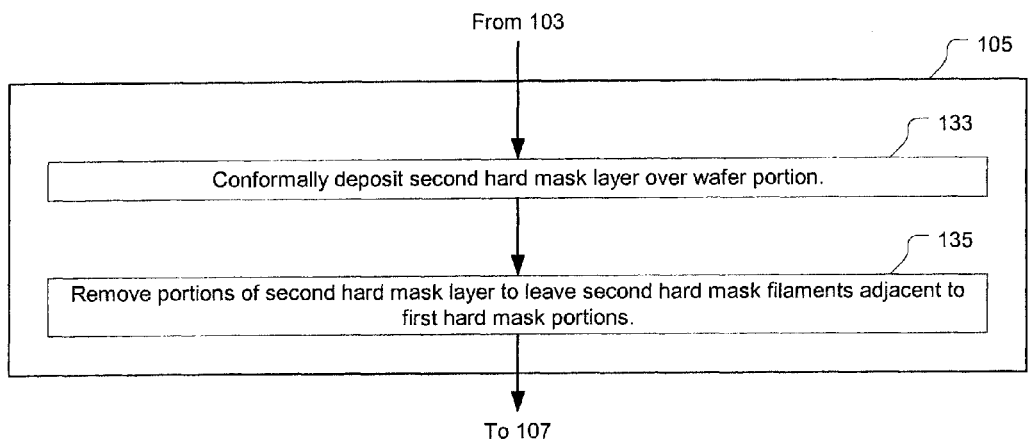
FIG. 1D is an illustration showing an expanded view of operation 105 of FIG. 1A, in accordance with one embodiment of the present invention.
Figure 1E:
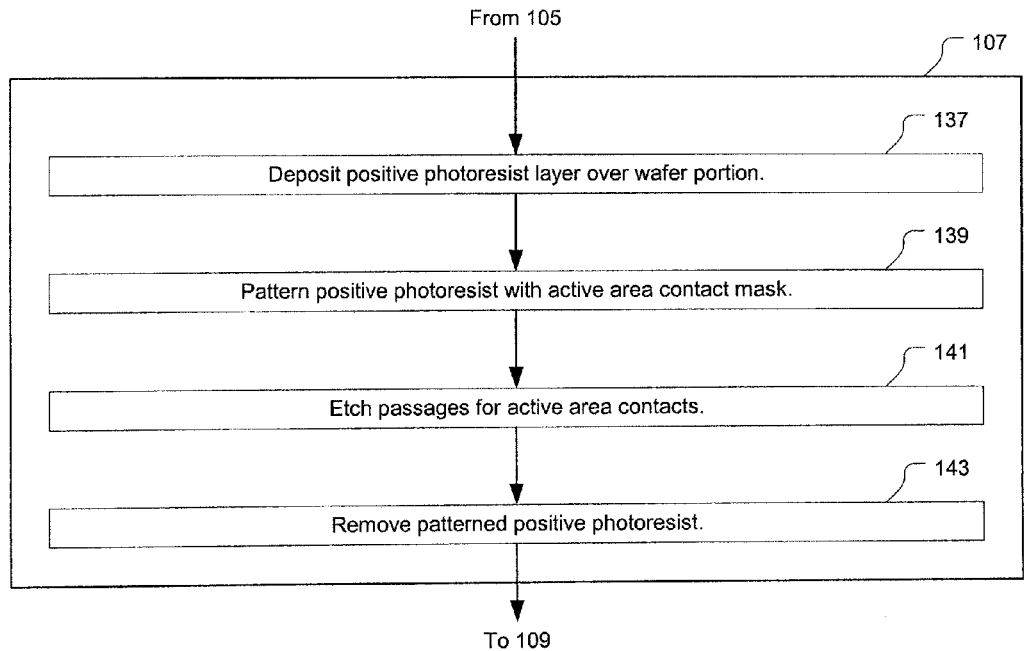
FIG. 1E is an illustration showing an expanded view of operation 107 of FIG. 1A, in accordance with one embodiment of the present invention.
Figure 1F:
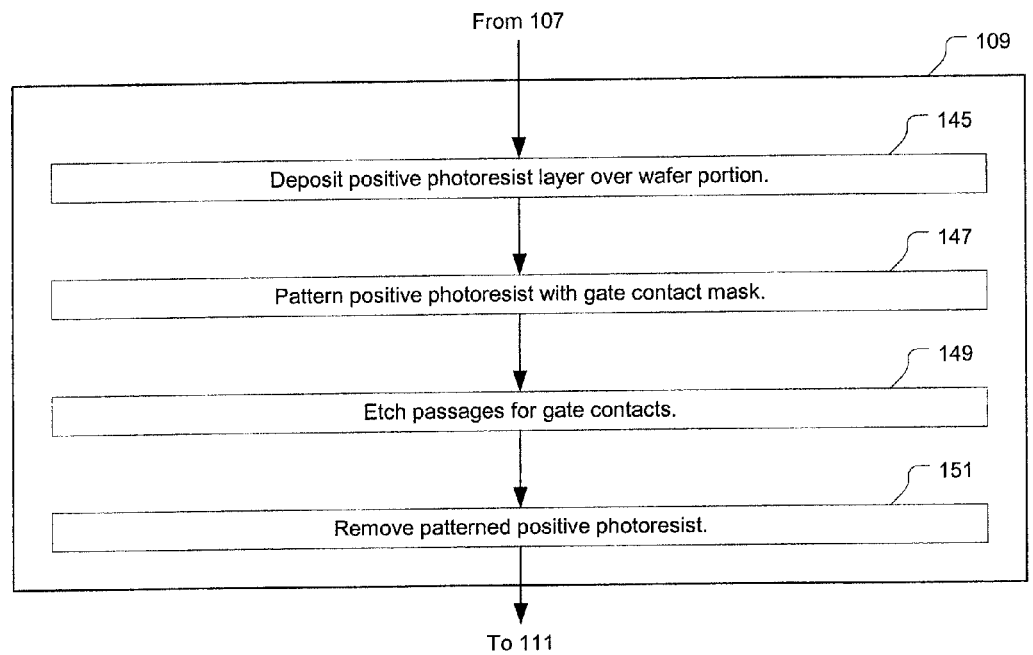
FIG. 1F is an illustration showing an expanded view of operation 109 of FIG. 1A, in accordance with one embodiment of the present invention.
Figure 1G:
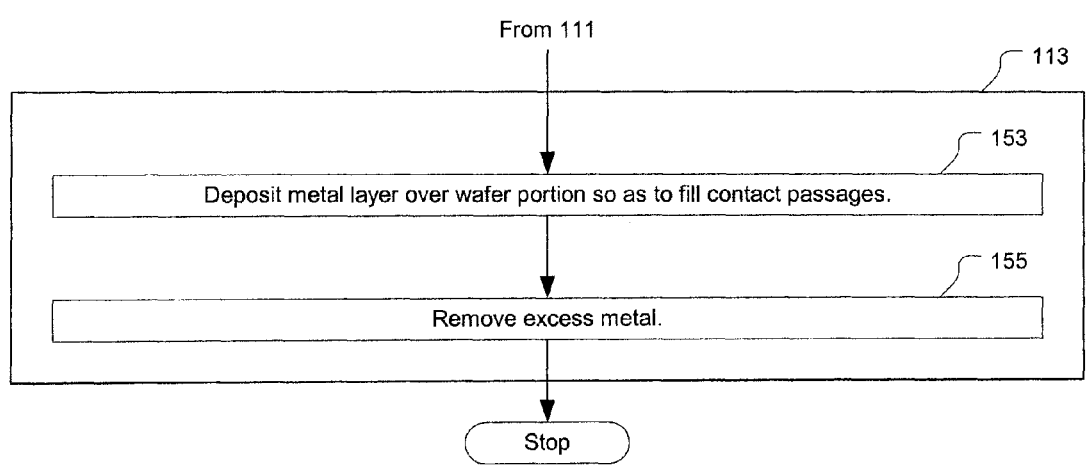
FIG. 1G is an illustration showing an expanded view of operation 113 of FIG. 1A, in accordance with one embodiment of the present invention.
Figure 2A:
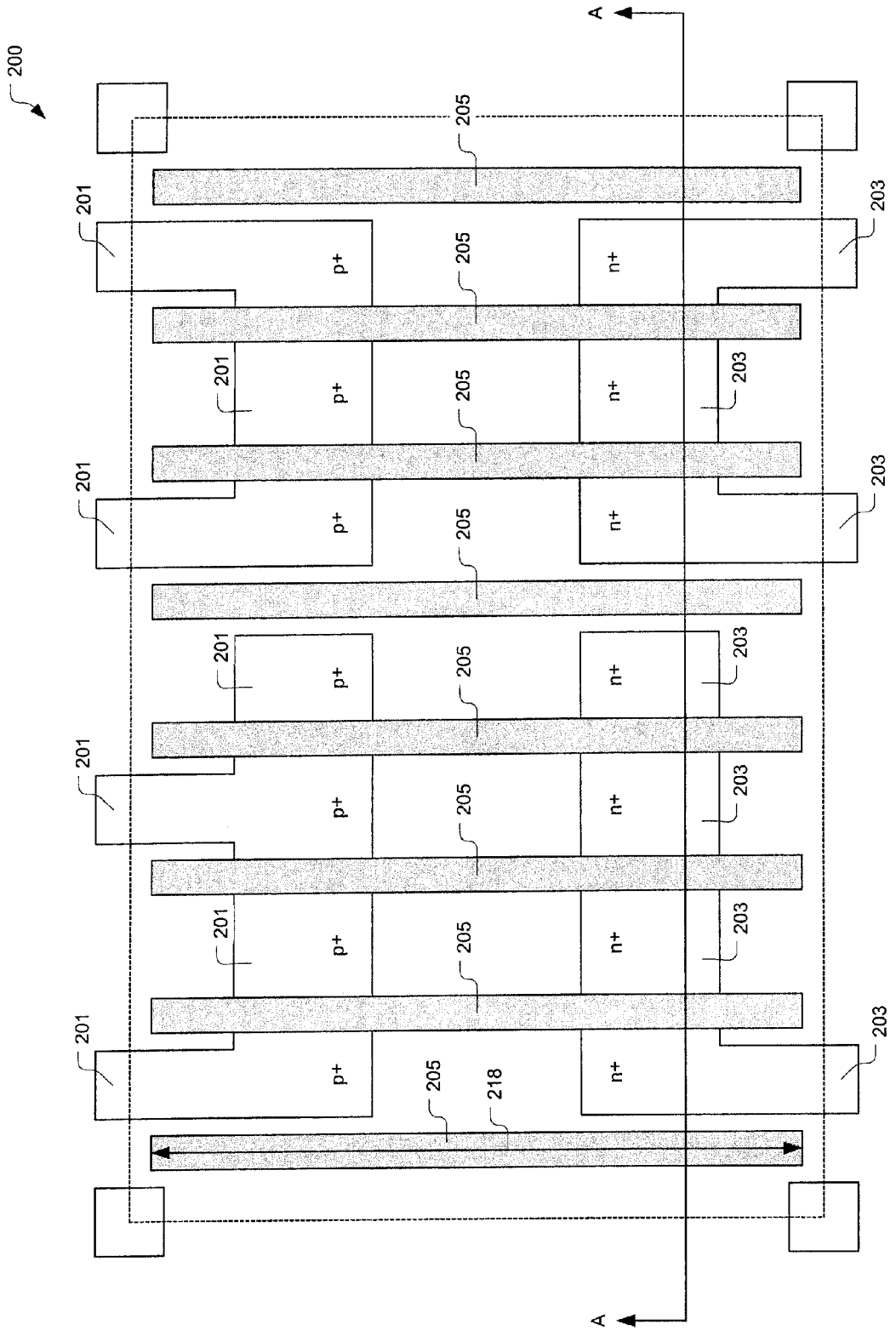
FIG. 2A is an illustration showing a top view of the wafer portion, in accordance with one embodiment of the present invention.
Figure 2B:
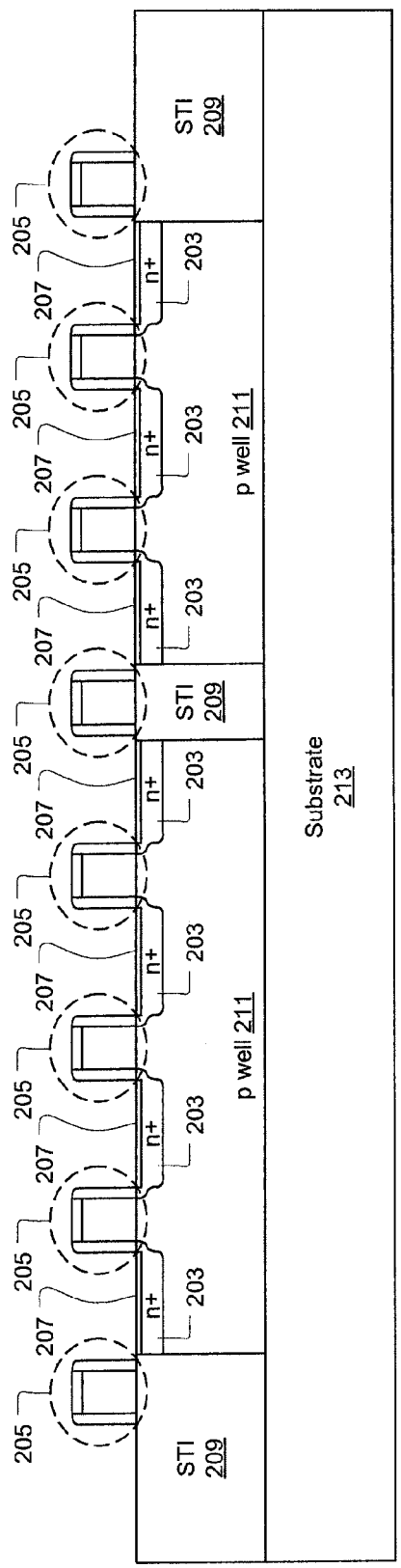
FIG. 2B is an illustration showing a vertical cross-section view of the wafer portion, in accordance with one embodiment of the present invention.
Figure 2C:
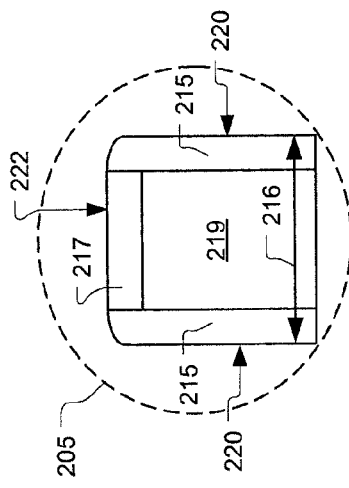
FIG. 2C is an illustration showing the an expanded view of a given gate structure, in accordance with one embodiment of the present invention.

FIGS. 2A-2C are illustrations showing an exemplary wafer portion 200 provided in operation 115. It should be understood that the exemplary wafer portion 200 is provided by way of example for the purpose of describing the SSA contact fabrication method of FIGS. 1A-1G. It should be further understood that the SSA contact fabrication method disclosed herein is not to be limited to use with the particular exemplary wafer portion 200. Moreover, it should be appreciated that the SSA contact fabrication process disclosed herein can be performed on essentially any semiconductor device or semiconductor wafer within which one or more active area contacts and/or one or more gate contacts are to be defined.

FIG. 2A is an illustration showing a top view of the wafer portion 200, in accordance with one embodiment of the present invention. FIG. 2B is an illustration showing a vertical cross-section view of the wafer portion 200, in accordance with one embodiment of the present invention. The vertical cross-section view (A-A) of FIG. 2B corresponds to the vertical cross-section of the wafer portion 200 at a location corresponding to bracket A-A in FIG. 2A. The wafer portion 200 includes a number of gate structures 205 defined thereon in a parallel orientation with respect to each other. FIG. 2C is an illustration showing an expanded view of a given gate structure 205, in accordance with one embodiment of the present invention. It should be understood that the given gate structure 205, as shown in FIG. 2C, is representative of the other gate structures 205 within the wafer portion 200.

Each gate structure 205 is defined as a linear gate structure having a central conductive region 219, a top region 217, and sidewall spacers 215. In various embodiments, the central conductive region 219 can be formed of polysilicon, metal, or essentially any other suitable electrically conductive material. The top region 217 is formed of an electrically conductive material that is capable of reflecting photons, such a those of incoherent light. For example, in one embodiment, the top region 217 is formed of $NiSi_2$. In various embodiments, the sidewall spacers 215 can be formed of essentially any suitable material. For example, in one embodiment, the sidewall spacers 215 are formed of $Si_3N_4$.

Each gate structure 205 is defined as a linear gate structure having a top surface 222, substantially parallel side surfaces 220, a width 216 defined perpendicularly between the side surfaces 220, and a length 218 extending perpendicular to the width 216 along the top surface 222. In the exemplary wafer portion 200, for ease of description, each linear gate structure 205 is shown to have a length approximately equal to the length 218. However, it should be understood that the various gate structures 205 are not required to have the same length. For example, any number of the linear gate structures 205 may be segmented to include a number of breaks, depending on the circuit function to be defined.

Each linear gate structure 205, or segment thereof, is devoid of a substantial change in direction along its length. In one embodiment, a substantial change in direction of a linear gate structure 205, or segment thereof, exists when the width 216 of the linear gate structure 205 at any point thereon changes by more than 50% of the nominal width 216 of the linear gate structure 205 along its entire length. In another embodiment, a substantial change in direction of a linear gate structure 205, or segment thereof, exists when the width 216 of the linear gate structure 205 changes from any first location on the linear gate structure 205 to any second location on the linear gate structure 205 by more than 50% of the width 216 at the first location.

The exemplary wafer portion 200 further includes a number of active areas 203 for NMOS devices, as denoted by (n+), and a number of active areas 201 for PMOS devices, as denoted by (p+). As shown in the cross-section view A-A of FIG. 2B, the n+ active areas 203 are disposed within a "p well" 211, and the p wells 211 are bordered by shallow trench isolation (STI) regions 209. It should be appreciated that in some embodiments the p wells 211 can extend under the STI regions 209. The wafer portion 200, including the p wells 211, the STI regions 209 and the gate structures 205 thereabove, is defined over a substrate 213, such as a silicon substrate. Additionally, the active area regions 201/203 between the sidewalls 215 of each gate structure 205 can be defined to have an exposed conductive surface 207. In one embodiment, the exposed conductive surface 207 is formed of metal, metal silicide, or a combination thereof. For example, in one embodiment, a salicide process is performed to form a nickel silicide as the exposed conductive surface 207 present over portions of the active area regions 201/203.

Additionally, the wafer portion 200 can include a thin, e.g., 200-300 angstroms thick, etch stop and/or stress liner conformally disposed over its top surface, i.e., conformally disposed over the upper exposed surfaces of the substrate 213, STI regions 209, active area regions 201/203, and gate structures 205. For clarity purposes, the etch stop and/or stress liner is not shown in FIGS. 2A-24B. However, it should be understood that such a conformal layer can be present, if appropriate.

Although the wafer portion 200 provided for the SSA contact process has been described in some detail in FIGS. 2A-2C, it should be understood that the SSA contact process is not restricted to the specifically disclosed features of the exemplary wafer portion 200. In other embodiments, the SSA contact process described herein can be used to defined contacts on a semiconductor wafer portion that includes either more or less features than what are explicitly disclosed herein with regard to the exemplary wafer portion 200, so long as the top surface 222 and/or top region 217 of each gate structure is capable of reflecting photons.

With reference back to FIG. 1B, from the operation 115, the method proceeds with an operation 117 for depositing a photon absorption layer 301 over the wafer portion 200. In one embodiment the photon absorption layer 301 is formed of amorphous carbon. However, it should be understood that in other embodiments the photon absorption layer 301 can be formed from essentially any material that has a sufficiently strong photon absorption property and has adequate chemical, structural, thermal, and electrical properties as required for successful manufacture and operation of the semiconductor device formed on the wafer portion 200. In one embodiment, the sufficiently strong photon absorption property of the photon absorption layer 301 material is evidenced by a minimal backscattering of photons incident upon a surface of the photon absorption layer 301 material.

Figure 3:
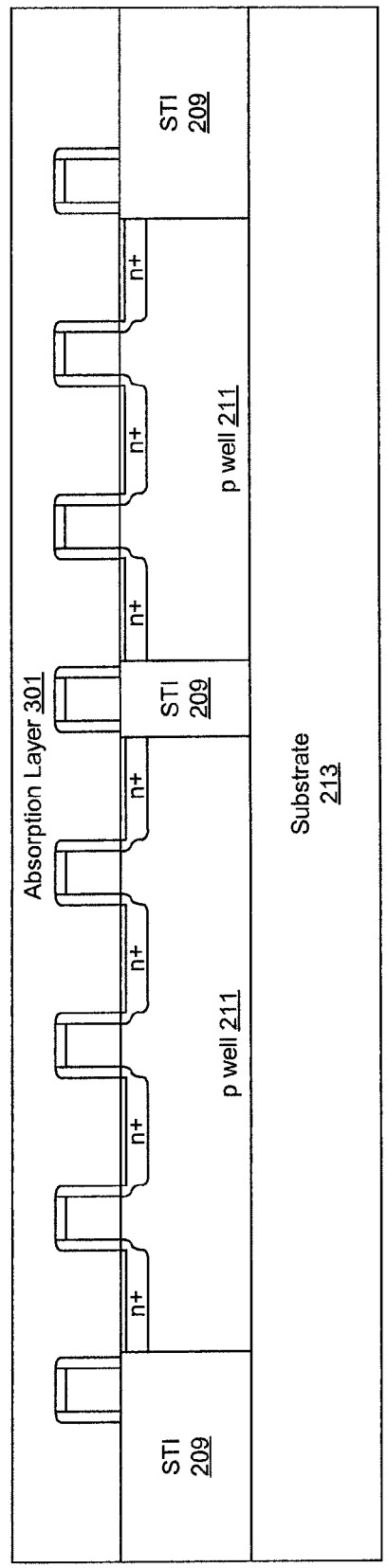
FIG. 3 is an illustration showing the photon absorption layer deposited over the wafer portion, in accordance with one embodiment of the present invention.
Figure 4:
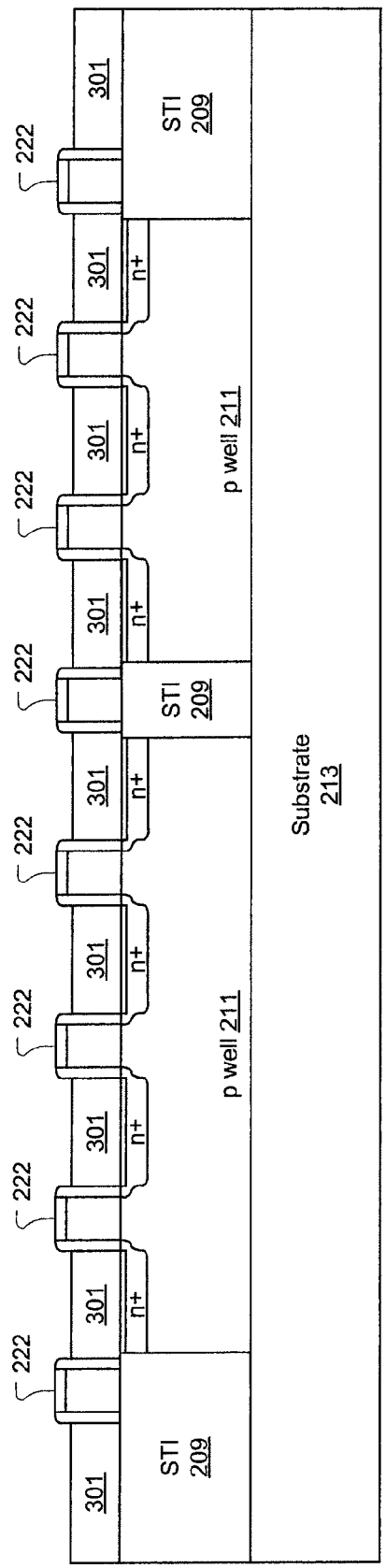
FIG. 4 is an illustration showing the upper portion of the photon absorption layer removed to expose the top surfaces of the gate structures, in accordance with one embodiment of the present invention.

FIG. 3 is an illustration showing the photon absorption layer 301 deposited over the wafer portion 200, in accordance with one embodiment of the present invention. The photon absorption layer 301 is initially deposited to fill the regions between the gate structures 205, and to extend up to a level above the top surfaces 222 of the gate structures 205. An operation 119 is then performed to remove an upper portion of the photon absorption layer 301 so as to expose the top surfaces 222 of the gate structures 205. FIG. 4 is an illustration showing the upper portion of the photon absorption layer 301 removed to expose the top surfaces 222 of the gate structures 205, in accordance with one embodiment of the present invention.

In various embodiments, the removal of the upper portion of the photon absorption layer 301 in operation 119 can be performed using an etching process, a chemical mechanical planarization (CMP) process, or a combination thereof. It should be understood that through operations 117 and 119, the photon absorption layer 301 is deposited between the gate structures 205 so as to substantially cover an area of the wafer portion 200 present between the gate structures 205 with the photon absorption layer 301, while leaving the top surface 222 of each gate structure 205 uncovered. In other words, following operation 119, the photon absorption layer 301 fills regions adjacent to each gate structure 205 so as to contact the side surfaces 220 of each gate structure 205 without covering the top surface 222 of each gate structure 205.

Figure 5:
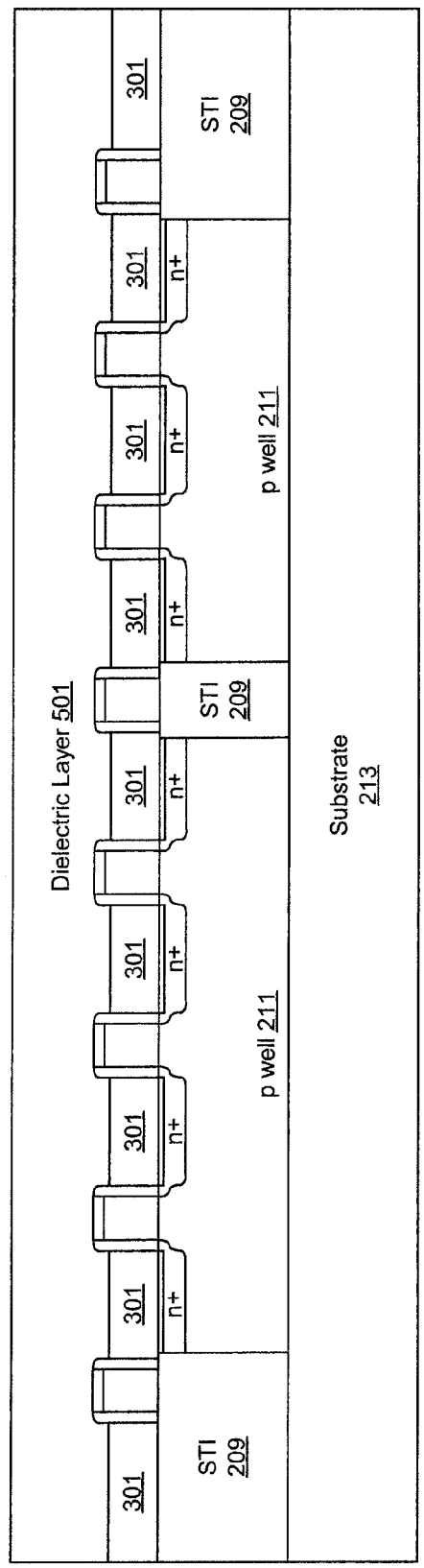
FIG. 5 is an illustration showing the dielectric layer deposited over the wafer portion, in accordance with one embodiment of the present invention.

Following operation 119, an operation 121 is performed to deposit a dielectric layer 501, i.e., a pre-metal dielectric layer, over the wafer portion 200. FIG. 5 is an illustration showing the dielectric layer 501 deposited over the wafer portion 200, in accordance with one embodiment of the present invention. The dielectric layer 501 is deposited over both the photon absorption layer 301 and the top surface 222 of each gate structure 205. In one embodiment, the dielectric layer 501 is formed of an electrically insulating oxide material. However, it should be understood that the SSA contact fabrication process is not limited to use with a specific type of dielectric layer 501. The dielectric layer 501 can be formed from essentially any material, or stack of materials, having adequate chemical, structural, thermal, and electrical properties as required for successful manufacture and operation of the semiconductor device formed on the wafer portion 200. Additionally, as part of operation 121, an upper surface 503 of the deposited dielectric layer 501 is substantially planarized. In one embodiment, planarization of the dielectric layer 501 upper surface 503 is performed using a CMP process. However, in other embodiments, essentially any technique can be used to planarize the dielectric layer 501, so long as the technique is compatible with the materials present on the wafer portion 200.

With reference back to FIG. 1A, the method proceeds from the operation 101 to an operation 103 in which first hard mask portions 601A are formed directly over the gate structures 205. The term "first" as used herein with regard to the first hard mask portions 601A, distinguishes a material type used to form the first hard mask portions 601A. As will be discussed later, second hard mask filaments 1101A are also used in the SSA fabrication process. The term "second" as used herein with regard to the second hard mask filaments 1101A, distinguishes a material type used to form the second hard mask filaments 1101A, that is different from the "first" material type used to form the first hard mask portions 601A. In operation 103, the first hard mask portions 601A are formed over a corresponding number of underlying gate structures such that each first hard mask portion 601A vertically shadows a respective one of the underlying gate structures 205.

Figure 6:
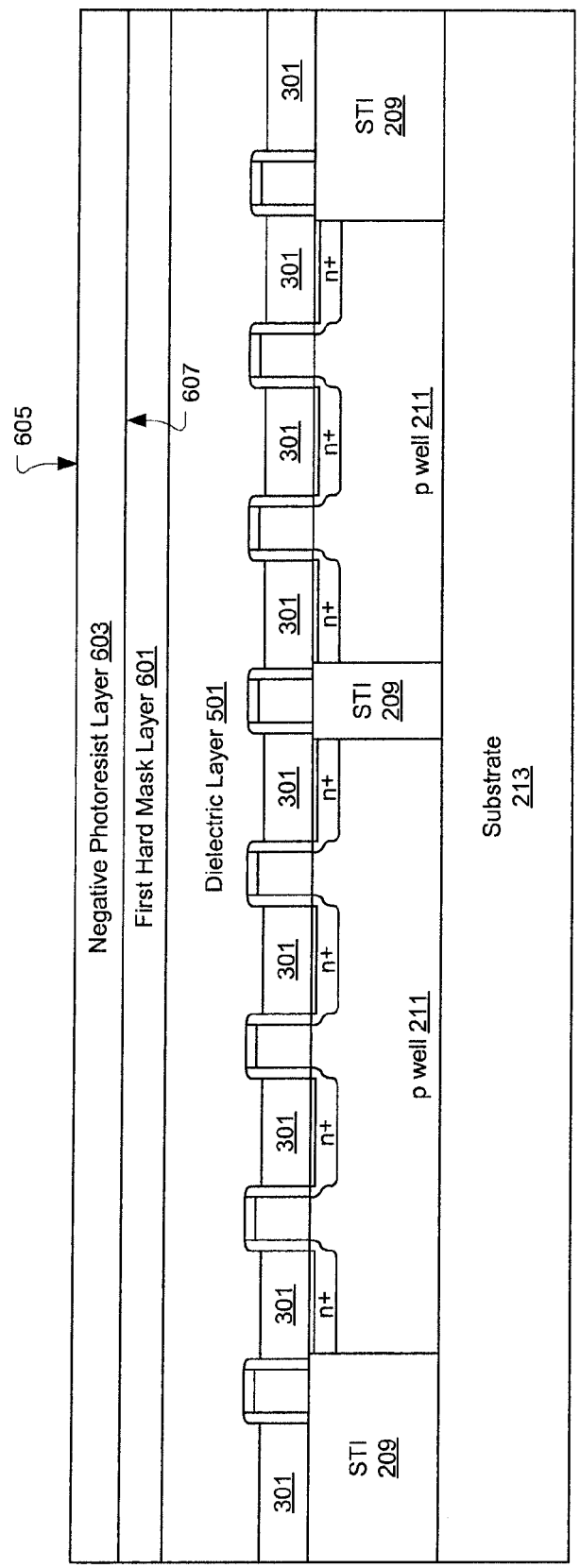
FIG. 6 is an illustration showing the first hard mask layer deposited over the dielectric layer, and the negative photoresist layer deposited over the first hard mask layer, in accordance with one embodiment of the present invention.

FIG. 1C is an illustration showing an expanded view of operation 103, in accordance with one embodiment of the present invention. As shown in FIG. 1C, operation 103 includes an operation 123 for depositing a first hard mask layer 601 over the wafer portion 200. More specifically, the first hard mask layer 601 is deposited over the dielectric layer 501. An operation 125 is then performed to deposit a negative photoresist layer 603 over the first hard mask layer 601. FIG. 6 is an illustration showing the first hard mask layer 601 deposited over the dielectric layer 501, and the negative photoresist layer 603 deposited over the first hard mask layer 601, in accordance with one embodiment of the present invention. The first hard mask layer 601 can be defined by essentially any suitable hard mask material. For example, in some embodiments, the first hard mask layer 601 can be defined as an advanced patterning film (APF) or as a SiON hard mask. Also, the first hard mask layer 601 can be deposited on the wafer portion 200 using essentially any hard mask deposition technique. For example, in one embodiment, the first hard mask layer 601 is deposited using a chemical vapor deposition (CVD) process.

A negative photoresist material is characterized in that portions of the negative photoresist material that are sufficiently exposed to a light source will made insoluble, i.e., non-removable, in the presence of a developer solution, and underexposed portions of the negative photoresist material will be remain soluble, i.e., removable, in the presence of the developer solution. The negative photoresist layer 603 can be defined by essentially any type of negative photoresist material, e.g., photosensitive polymer, so long as the light exposure threshold for cross-linking of the negative photoresist material is suitable for use with a given light source, such that more than a forward exposure of the negative photoresist material to the given light source is required for cross-linking of the negative photoresist material. For example, the light exposure threshold of the negative photoresist material is such that a transmission of collimated, incoherent light from the given light source through an upper surface 605 of the negative photoresist layer 603 to a lower surface 607 of the negative photoresist layer 603, i.e., forward exposure, is not sufficient to cross-link the negative photoresist material.

However, the light exposure threshold of the negative photoresist material is such that the forward exposure of the negative photoresist material combined with a reflective exposure of the negative photoresist material, i.e., exposure to light reflected upward from below the lower surface 607 of the negative photoresist layer 603, is sufficient to cross-link the negative photoresist material. Also, the characteristics of the light, e.g., intensity, duration, wavelength, etc., incident upon the negative photoresist layer 603 can be controlled in conjunction with the light exposure threshold of the negative photoresist material such that a specific amount of reflective exposure of the negative photoresist material is required for cross-linking of the negative photoresist material. Additionally, it should be understood that the negative photoresist layer 603 can be deposited on the wafer portion 200 using essentially any photoresist deposition technique, such as spin-on deposition.

Figure 7:
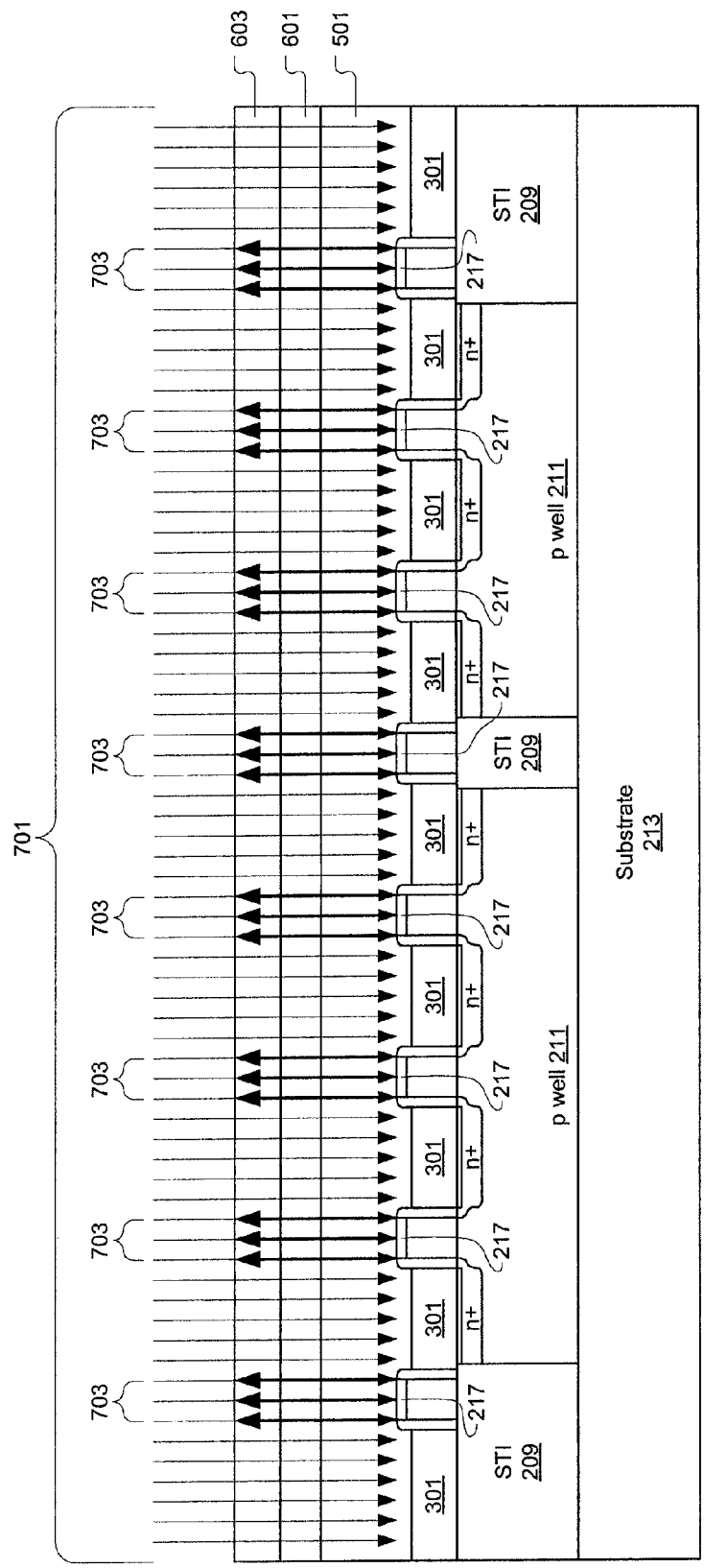
FIG. 7 is an illustration showing the exposure of the wafer portion to the vertically collimated, incoherent light, in accordance with one embodiment of the present invention.

From the operation 125, the method proceeds with an operation 127 for exposing and developing the negative photoresist layer 603, so as to only leave negative photoresist portions that vertically overlie gate structures 205. In one embodiment, operation 125 is performed by uniformly exposing the negative photoresist layer 603 to vertically collimated, incoherent light, whereby the light passes through the negative photoresist layer 603 to be absorbed by the photon absorption layer 301, and to be reflected by the top surface 222/top region 217 of the gate structures 205. FIG. 7 is an illustration showing the exposure of the wafer portion 200 to the vertically collimated, incoherent light, in accordance with one embodiment of the present invention. The uniform exposure of the negative photoresist layer 603 to the vertically collimated, incoherent light is depicted by the downward pointing arrows within bracket 701. Reflection of the light, i.e., upward reflection, is depicted by the upward pointing arrows within brackets 703. It should be appreciated that use of incoherent light serves to prevent formation of standing light waves.

Because both forward and reflected exposures of the negative photoresist layer 603 are required to cross-link the negative photoresist, only those portions of negative photoresist that vertically overlie the reflective top surfaces 222/top regions 217 of the gate structures will be cross-linked. Also, it should be appreciated that because the light is vertically collimated to be normally, i.e., perpendicularly, incident upon the top surfaces 222 of the gate structures 205, which are substantially horizontal, only those portions of the negative photoresist layer 603 that are located vertically over the gate structures 205 will be subjected to substantial reflective exposure of the light.

Figure 8:
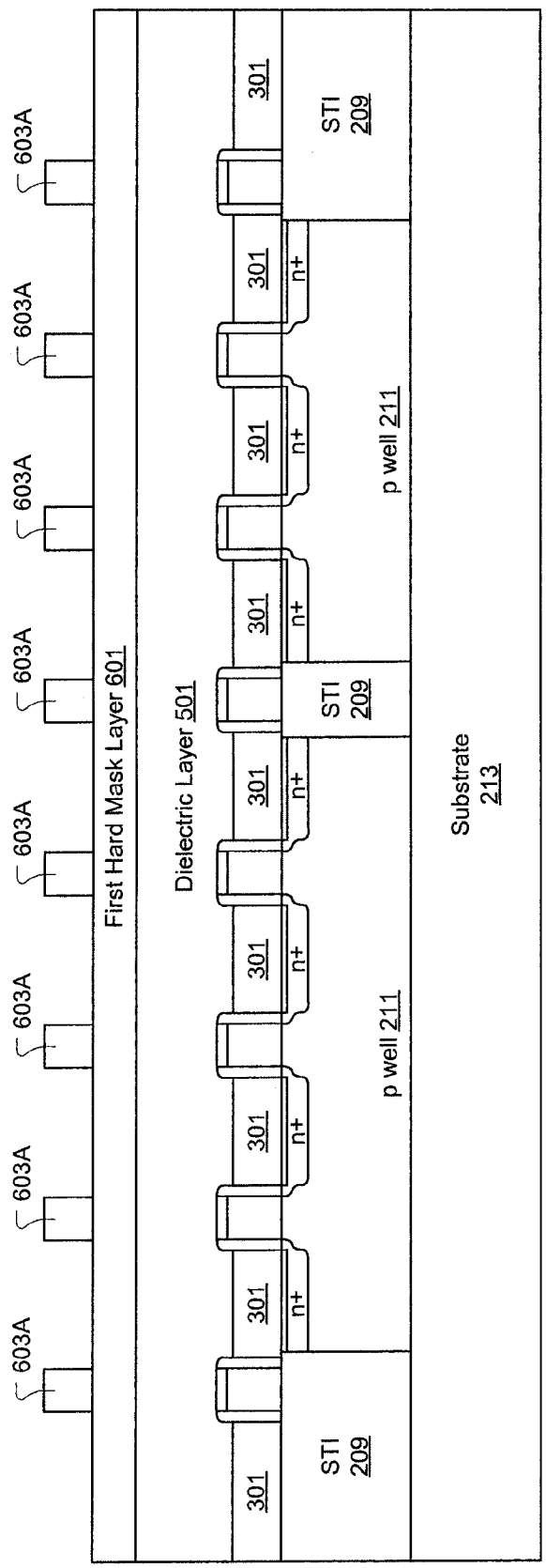
FIG. 8 is an illustration showing the wafer portion following removal of the non-cross-linked portions of the negative photoresist layer, in accordance with one embodiment of the present invention.

Following exposure of the negative photoresist layer 603 to the light, the negative photoresist layer 603 is developed to remove the non-cross-linked portions of the negative photoresist layer 603. In various embodiments, essentially any photoresist development technique suitable for use with the particular negative photoresist material can be utilized. For example, in one embodiment, an acid etch can be used to remove the non-cross-linked portions of the negative photoresist layer 603. FIG. 8 is an illustration showing the wafer portion 200 following removal of the non-cross-linked portions of the negative photoresist layer 603, in accordance with one embodiment of the present invention. As shown in FIG. 8, exposure and development of the negative photoresist layer 603 in operation 127 leaves the negative photoresist portions 603A, such that each negative photoresist portion 603A vertically overlies a respective one of the underlying gate structures 205.

Following operation 127, the method proceeds with an operation 129 for removing portions of the first hard mask layer 601 that are not protected by the negative photoresist portions 603A, thereby forming the first hard mask portions 601A directly over the gate structures 205. In one embodiment, operation 129 is performed using a vertically biased etching process, such that the portions of the first hard mask layer 601 that are not protected by the negative photoresist portions 603A are removed in a substantially top-down manner. However, it should be understood that other techniques can be used to remove the portions of the first hard mask layer 601 that are not protected by the negative photoresist portions 603A, so long as a width 901 of the remaining first hard mask portions 601A substantially matches a width 903 of the negative photoresist portions 603A. In other words, undercutting of the first hard mask portions 601A relative to the negative photoresist portions 603A should be minimized to the extent possible.

Figure 9:
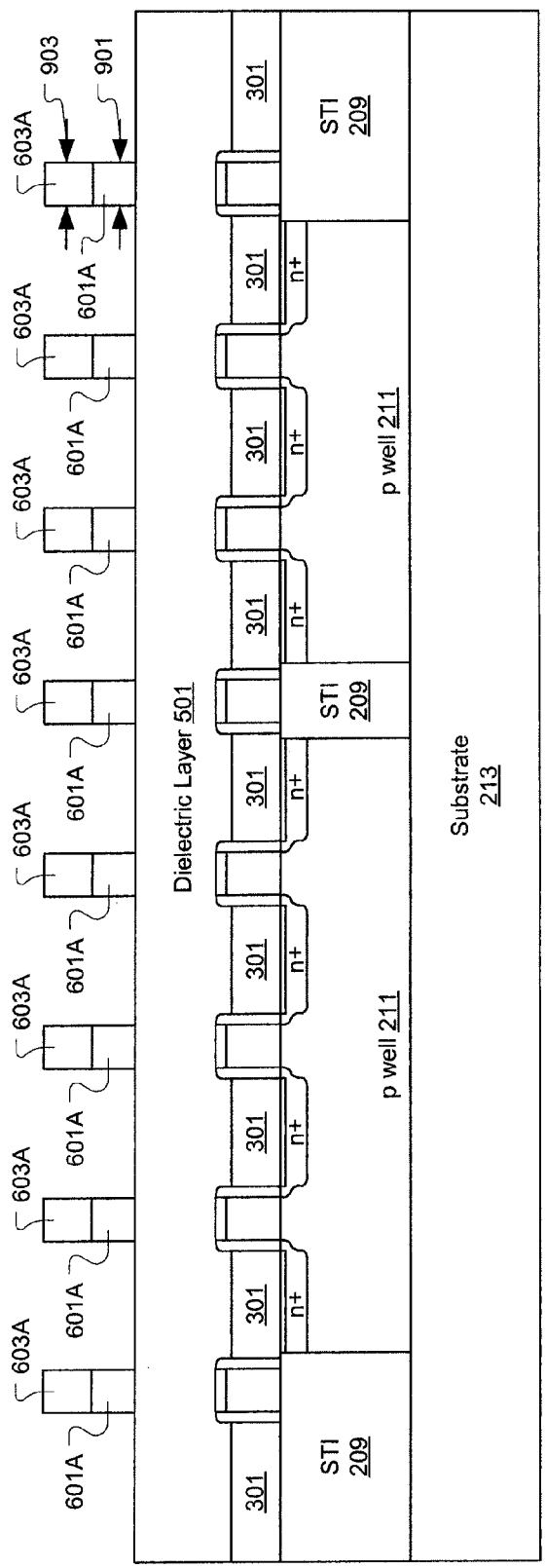
FIG. 9 is an illustration showing the wafer portion following removal of the unprotected portions of the first hard mask layer, in accordance with one embodiment of the present invention.

FIG. 9 is an illustration showing the wafer portion 200 following removal of the unprotected portions of the first hard mask layer 601, in accordance with one embodiment of the present invention. As shown in FIG. 9, removal of the unprotected portions of the first hard mask layer 601 in operation 129 leaves the first hard mask portions 601A, such that each first hard mask portion 601A vertically shadows a respective one of the underlying gate structures 205. It should be understood that vertical shadowing of a given underlying gate structure 205 by a given first hard mask portion 601A is defined by the given first hard mask portion 601A having the substantially same horizontal cross-section size and shape as the given underlying gate structure 205. The horizontal cross-section size and shape refers to the size and shape of the feature, i.e., gate structure 205 or first hard mask portion 601A, when cut in a horizontal plane substantially parallel to the horizontal surface of the substrate 213. It should be further appreciated that the horizontal width 901 of each first hard mask portion 601A is substantially the same as the horizontal width of the top surface 222/top region 217 of the underlying gate structure 205.

Figure 10:
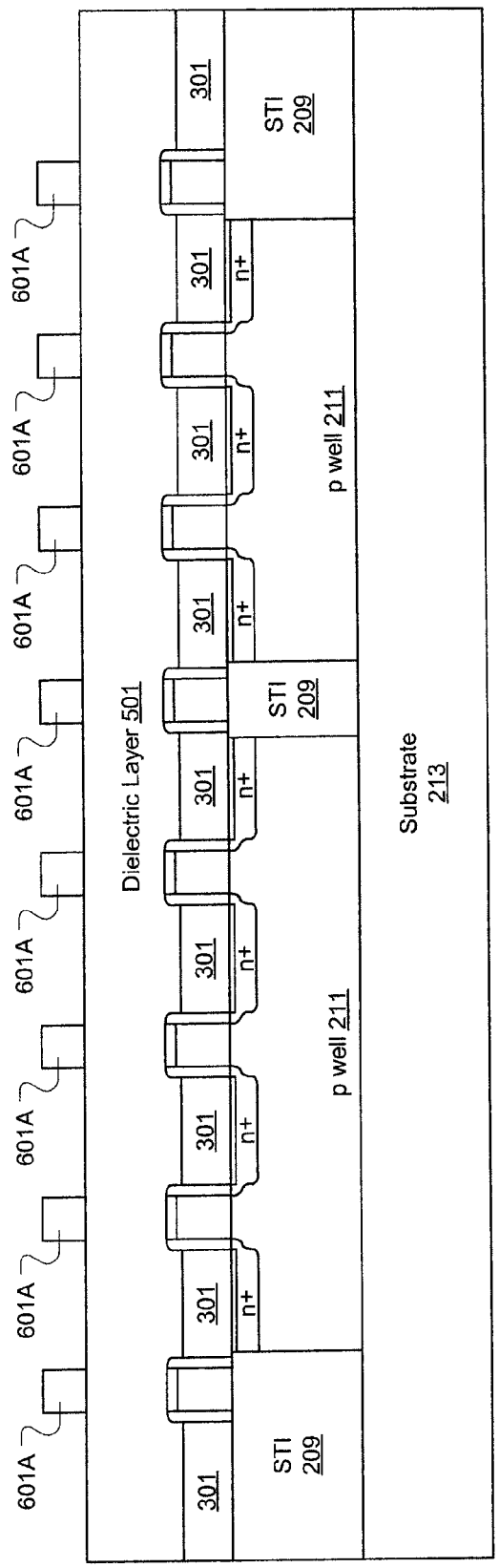
FIG. 10 is an illustration showing the wafer portion following removal of the remaining negative photoresist portions, in accordance with one embodiment of the present invention.

Following the operation 129, the method proceed with an operation 131 for removing the remaining negative photoresist portions 603A. Removal of the remaining negative photoresist portions 603A can be performed using essentially any photoresist stripping technique, e.g., chemical stripping, ashing, etc. FIG. 10 is an illustration showing the wafer portion 200 following removal of the remaining negative photoresist portions 603A, in accordance with one embodiment of the present invention.

Figure 11:
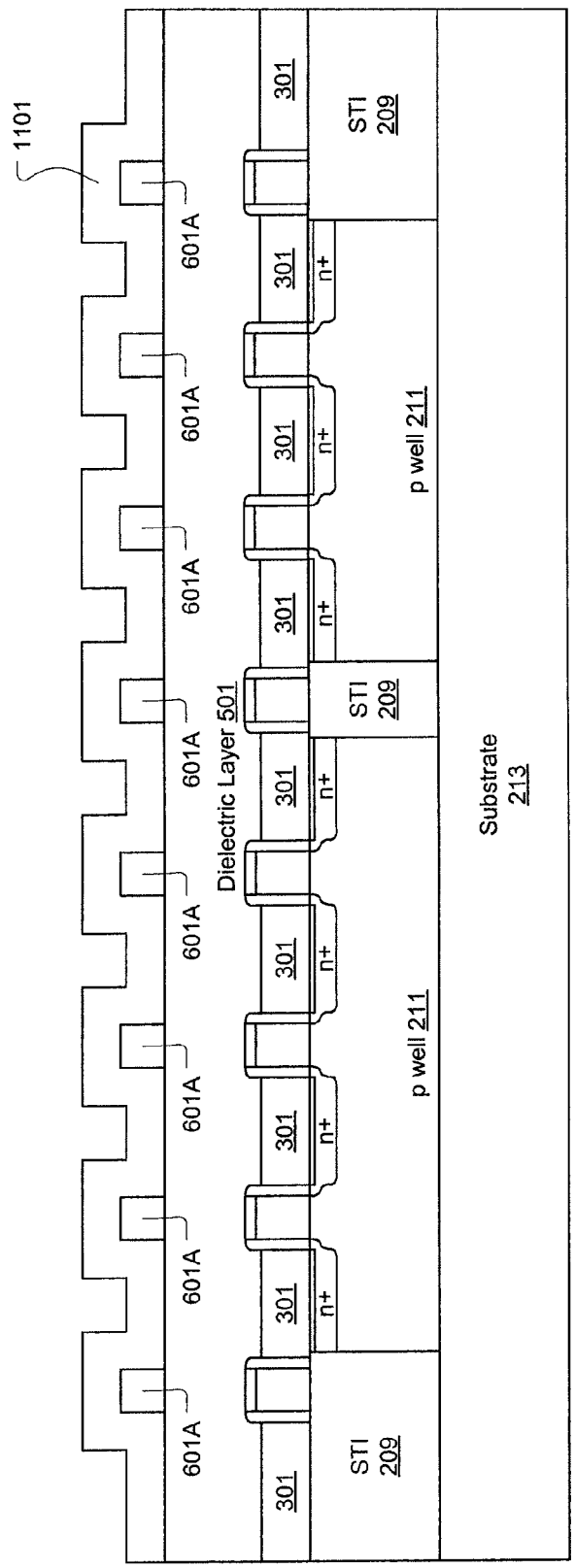
FIG. 11 is an illustration showing the second hard mask layer deposited over the wafer portion, in accordance with one embodiment of the present invention.

With reference back to FIG. 1A, the method proceeds from the operation 103 to an operation 105 in which the second hard mask filaments 1101A are formed adjacent to the first hard mask portions 601A. FIG. 1D is an illustration showing an expanded view of operation 105, in accordance with one embodiment of the present invention. As shown in FIG. 1D, operation 105 includes an operation 133 for conformally depositing a second hard mask layer 1101 over the wafer portion 200. FIG. 11 is an illustration showing the second hard mask layer 1101 conformally deposited over the wafer portion 200, in accordance with one embodiment of the present invention. As shown in FIG. 11, the second hard mask layer 1101 is conformally deposited over both the dielectric layer 501 and the first hard mask portions 601A.

The second hard mask layer 1101 can be defined by essentially any suitable hard mask material, so long as the second hard mask material is different from the first hard mask material used to form the first hard mask portions 601A. More specifically, the second hard mask material should have an etching selectivity different than that of the first hard mask material, such that the first hard mask material can be etched without substantially etching the second hard mask material. For example, in one embodiment, the second hard mask layer 1101 can be formed of a nitride material. Also, the second hard mask layer 1101 can be deposited on the wafer portion 200 using essentially any hard mask deposition technique. For example, in one embodiment, the second hard mask layer 1101 is conformally deposited using a chemical vapor deposition (CVD) process.

Figure 12:
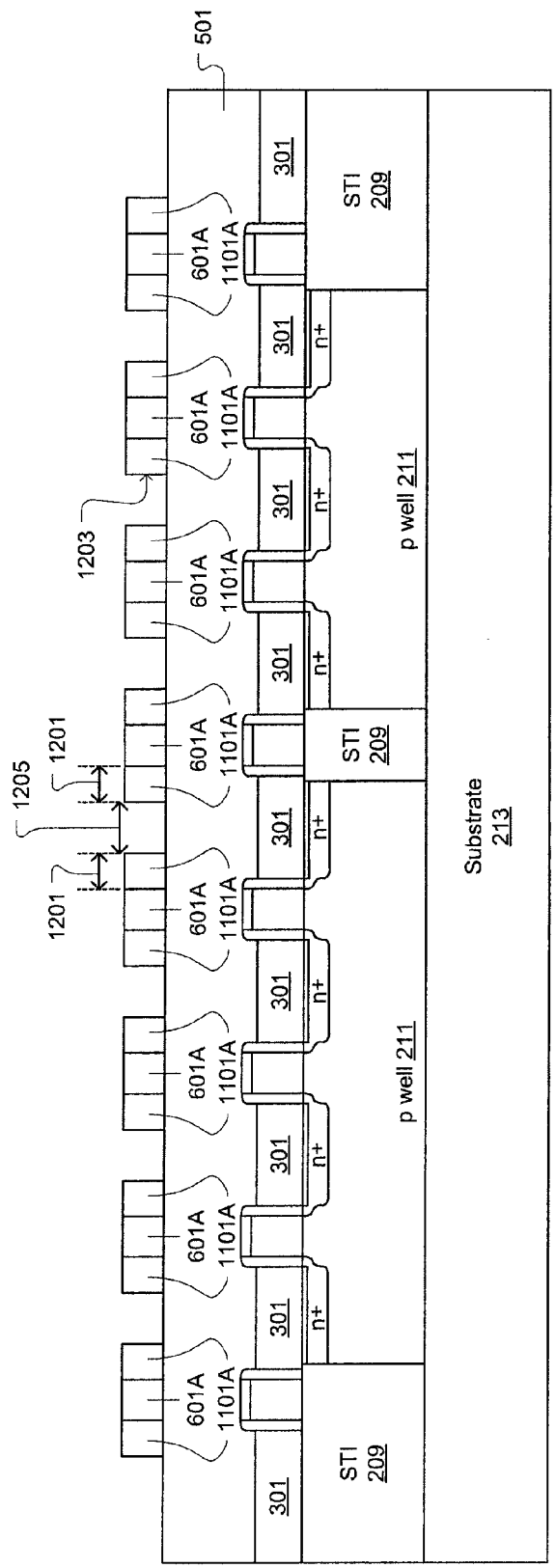
FIG. 12 is an illustration showing the second hard mask filaments adjacent to the first hard mask portions, in accordance with one embodiment of the present invention.

Following the operation 133, an operation 135 is performed to remove portions of the second hard mask layer 1101 to leave second hard mask filaments 101A adjacent to the first hard mask portions 601A. FIG. 12 is an illustration showing the second hard mask filaments 1101A adjacent to the first hard mask portions 601A, in accordance with one embodiment of the present invention. The second hard mask filaments 1101A are essentially defined as sidewall spacers adjacent to the first hard mask portions 601A, such that each side surface of each first hard mask portion 601A has an adjoining second hard mask filament 1101A. In one embodiment, a horizontal width 1201 of each second hard mask filament 1101A, as measured perpendicular to the sidewall of its adjoining first hard mask portion 601A, is defined to be substantially the same. Also, in one embodiment, a vertical cross-section profile of each exposed sidewall 1203 of each second hard mask filament 1101A is defined to be substantially vertical. However, in other embodiments, the vertical cross-section profile of the exposed sidewalls 1203 of the hard mask filaments 1101A may other than substantially vertical. For example, in one embodiment, the vertical cross-section profile of the exposed sidewall 1203 of the second hard mask filament 1101A can be tapered such that the second hard mask filament 1101A is thicker at its bottom, i.e., at the dielectric layer 501, relative to its top.

In one embodiment, the second hard mask filaments 1101A are formed by etching the second hard mask layer 1101, such that horizontal surfaces of the second hard mask layer 1101 are preferentially etched relative to the vertical surfaces of the second hard mask layer 1101. It should be understood, however, that other techniques can be utilized to form the second hard mask filaments 1101A from the second hard mask layer 1101, such that each second hard mask filament 1101A is formed as a hard mask spacer extending out from the sidewalls of the first hard mask portions 601A. Because the width 901 of a given first hard mask portion 601A is substantially equal to the width of the top surface 222 of the underlying gate structure 205, a combined width of the given first hard mask portion 601A and its adjoining second hard mask filaments 1101A is greater than the width of the underlying gate structure 205. Also, it should be understood that a perpendicular spacing 1205 between facing exposed side surfaces of a given pair of neighboring second hard mask filaments 1101A effectively defines a width of an active area contact to be formed between the given pair of neighboring second hard mask filaments 1101A. Therefore, because the first hard mask portion 601A vertically shadows the underlying gate structure 205, the width 1201 of each second hard mask filament effectively defines an active area contact-to-gate structure 205 spacing.

Figure 13:
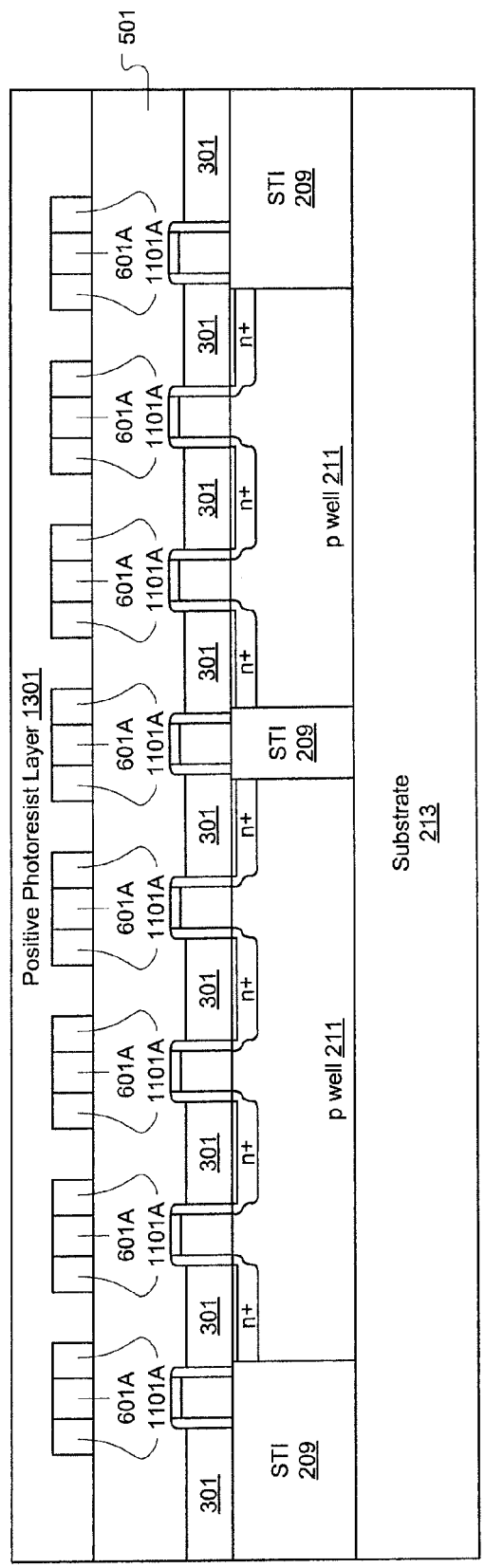
FIG. 13 is an illustration showing the positive photoresist layer deposited over the wafer portion, in accordance with one embodiment of the present invention.

With reference back to FIG. 1A, the method proceeds from the operation 105 to an operation 107 in which passages are etched for active area contacts. FIG. 1E is an illustration showing an expanded view of operation 107, in accordance with one embodiment of the present invention. As shown in FIG. 1E, operation 107 includes an operation 137 for depositing a positive photoresist layer 1301 over the wafer portion 200. FIG. 13 is an illustration showing the positive photoresist layer 1301 deposited over the wafer portion 200, in accordance with one embodiment of the present invention. As shown in FIG. 13, the positive photoresist layer 1301 is deposited over both the exposed dielectric layer 501 portions, the exposed first hard mask portions 601A, and the exposed second hard mask filaments 1101A. The positive photoresist layer 1301 can be defined by essentially any type of positive photoresist material. The positive photoresist material is characterized in that portions of the positive photoresist material that are sufficiently exposed to a light source will made soluble, i.e., removable, in the presence of a developer solution, and underexposed portions of the positive photoresist material will remain insoluble, i.e., non-removable, in the presence of the developer solution.

Following operation 137, an operation 139 is performed to pattern the positive photoresist layer 1301 with an active area contact mask. More specifically, the positive photoresist layer 1301 is patterned to include a substantially linear opening through the positive photoresist layer 1301, extending from one first hard mask portion 601A to a neighboring first hard mask portion 601A in a direction substantially perpendicular to the length of each of the neighboring first hard mask portions 601A. The patterning of the positive photoresist layer 1301 can be performed using essentially any conventional photolithography technique.

Figure 14A:
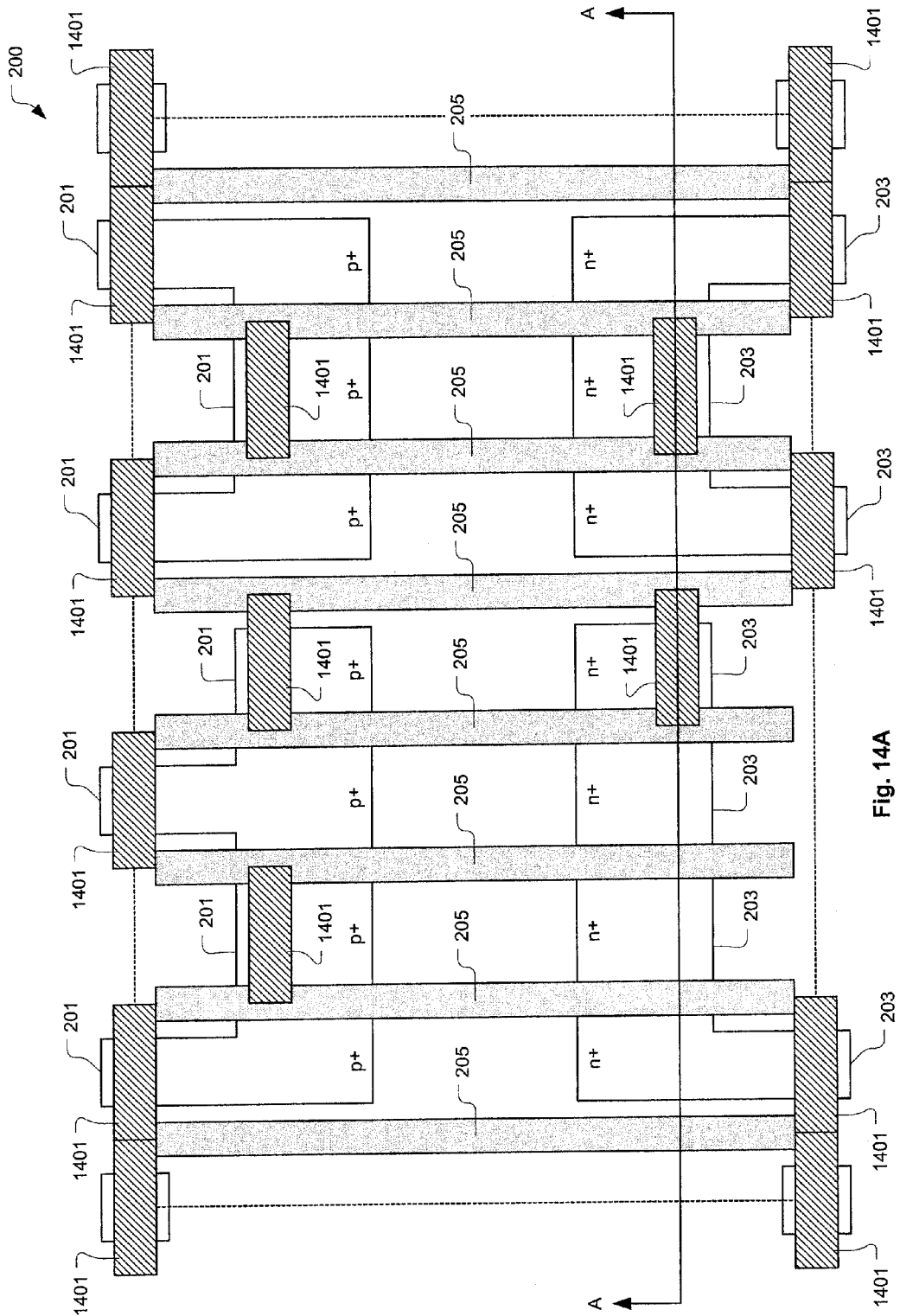
FIG. 14A is an illustration showing an example active area contact mask used to pattern the positive photoresist layer, in accordance with one embodiment of the present invention.

FIG. 14A is an illustration showing an example active area contact mask used to pattern the positive photoresist layer 1301, in accordance with one embodiment of the present invention. The active area contact mask includes a number of linear openings 1401. Each linear opening 1401 represents an area where the positive photoresist layer 1301 is removed to expose the underlying dielectric layer 501, first hard mask portions 601A, and second hard mask filaments 1101A. Although, the linear openings 1401 are shown as "ideal" rectangular-shaped openings, it should be understood that the actual linear openings 1401 may have somewhat rounded ends. However, it should be noted that the rounded ends will lie above the first hard mask portions 601A and/or the second hard mask filaments 1101A, but not above the dielectric layer 501 portion that extends perpendicularly between the second hard mask filaments 1101A.

Figure 14B:
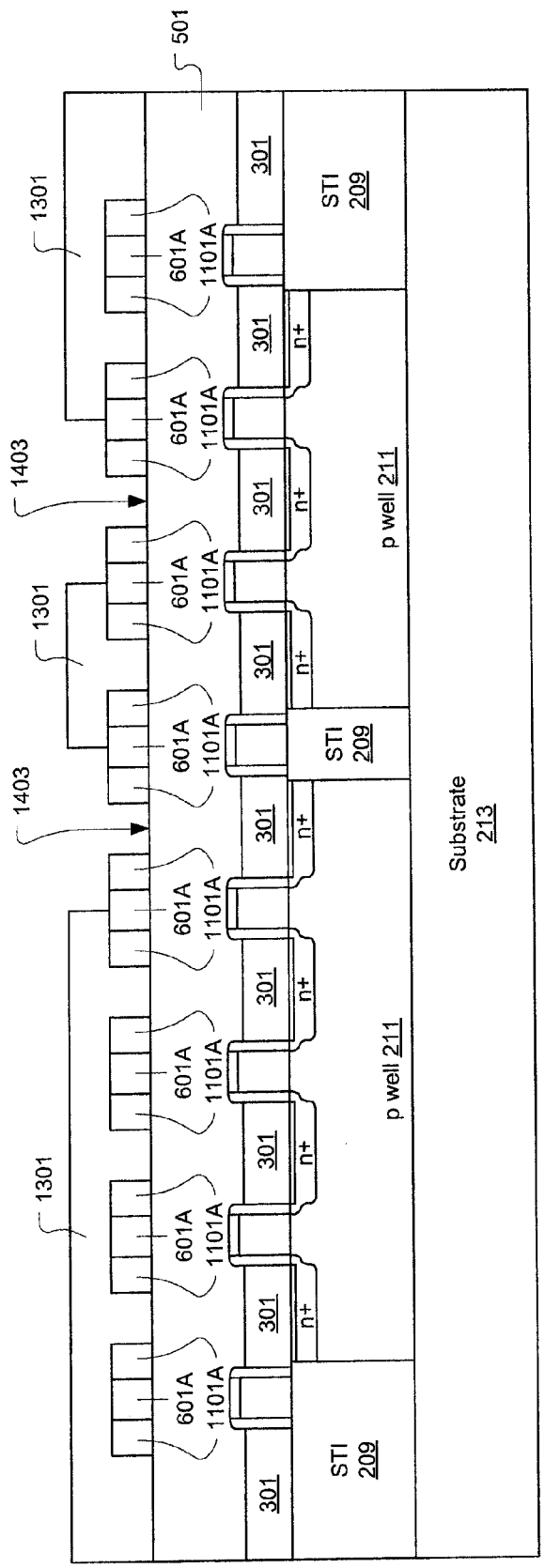
FIG. 14B is an illustration showing the vertical cross-section view A-A of the wafer portion with the patterned positive photoresist layer, in accordance with one embodiment of the present invention.

FIG. 14B is an illustration showing the vertical cross-section view A-A of the wafer portion 200 with the patterned positive photoresist layer 1301, in accordance with one embodiment of the present invention. Substantially rectangular areas 1403 of the dielectric layer 501 are exposed between the neighboring second hard mask filaments 1101A within the linear openings 1401. The substantially rectangular areas 1403 of the dielectric layer 501 are bounded on two opposing side by the second hard mask filaments 1101A, and on the other two opposing sides by the linear opening 1401 of the patterned positive photoresist layer 1301. It should be appreciated that the substantially rectangular areas 1403 of the dielectric layer 501 represent the horizontal cross-section of the active area contact to be formed.

Also, it should be appreciated that because the active area contact is to be bounded by the second hard mask filaments 1101A in the linear openings 1401, and because the linear openings 1401 are "oversized" with respect to the distance between the sidewalls of the neighboring second hard mask filaments 1101A, there is some flexibility provided in the indexing of the active area contact mask to the wafer portion 200 when patterning the positive photoresist layer 1301. For example, if the linear opening 1401 is offset slightly in its direction of extent between the first hard mask portions 601A, the substantially rectangular area 1403 of exposed dielectric layer 501 will be unaffected.

Figure 15:
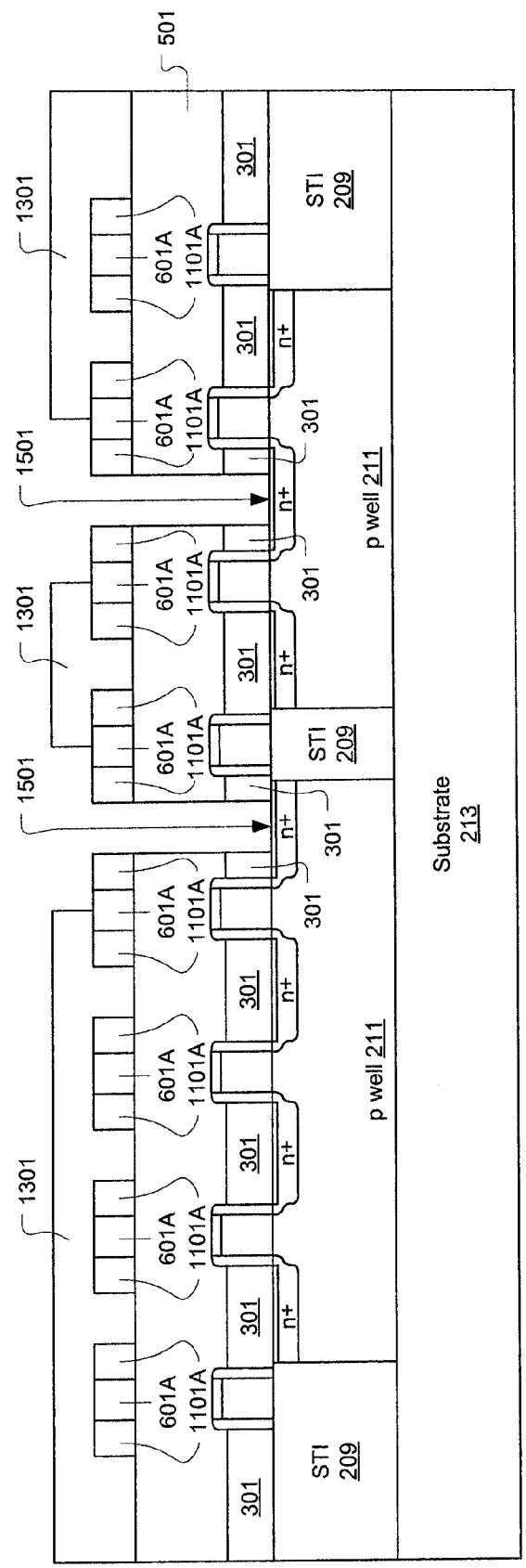
FIG. 15 is an illustration showing the vertical cross-section view A-A of the wafer portion with the passages for the active area contacts etched therein, in accordance with one embodiment of the present invention.

Following the operation 139, the method proceeds with an operation 141 for etching passages 1501 for the active area contacts. FIG. 15 is an illustration showing the vertical cross-section view A-A of the wafer portion 200 with the passages 1501 etched therein, in accordance with one embodiment of the present invention. The passages 1501 for the active area contacts are etched downward through the exposed, substantially rectangular areas 1403 of the dielectric layer 501 within the linear openings 1401. In one embodiment, the passages 1501 for the active area contacts are etched in a substantially vertical manner, such that sidewalls of the passages 1501 extend in a substantially vertical manner downward from the periphery of the substantially rectangular areas 1403 of the dielectric layer 501 within the linear openings 1401. Although, the sidewalls of the passages 1501 ideally extend downward in a substantially vertical manner, it should be understood that the sidewalls of the passages 1501 can be slightly tapered. For example, in one embodiment, the sidewalls of a given passage 1501 can be tapered such that the rectangular opening of the given passage 1501 is slightly smaller at its bottom end relative to its top end.

In one embodiment, a vertically biased etching process can be used to form the passages 1501 for the active area contacts. The passages 1501 are etched downward through the underlying portion of the dielectric layer 501, and the underlying portion of the photon absorption layer 301 to reach the conductive material, e.g., silicide, present at the top of the underlying active area, or to reach an etch stop layer present over the underlying active area. It should be understood that during the etching of the passages 1501 for the active area contacts, the second hard mask filaments 101A are etched very slowly so as to not be substantially removed.

Figure 16:
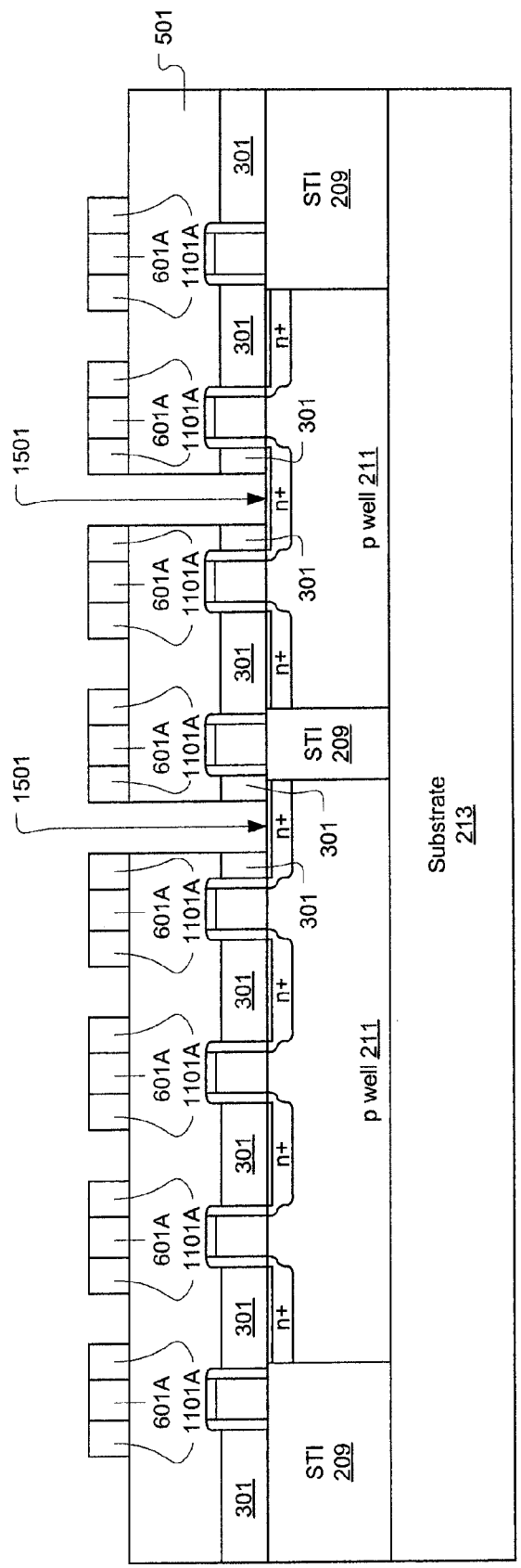
FIG. 16 is an illustration showing the wafer portion following removal of the patterned photoresist layer, in accordance with one embodiment of the present invention.

Following the operation 141, an operation 143 is performed to remove the patterned photoresist layer 1301 from the wafer portion 200. FIG. 16 is an illustration showing the wafer portion 200 following removal of the patterned photoresist layer 1301, in accordance with one embodiment of the present invention. The patterned photoresist layer 1301 can be removed using essentially any photoresist stripping technique, e.g., chemical stripping, ashing, etc.

Figure 17:
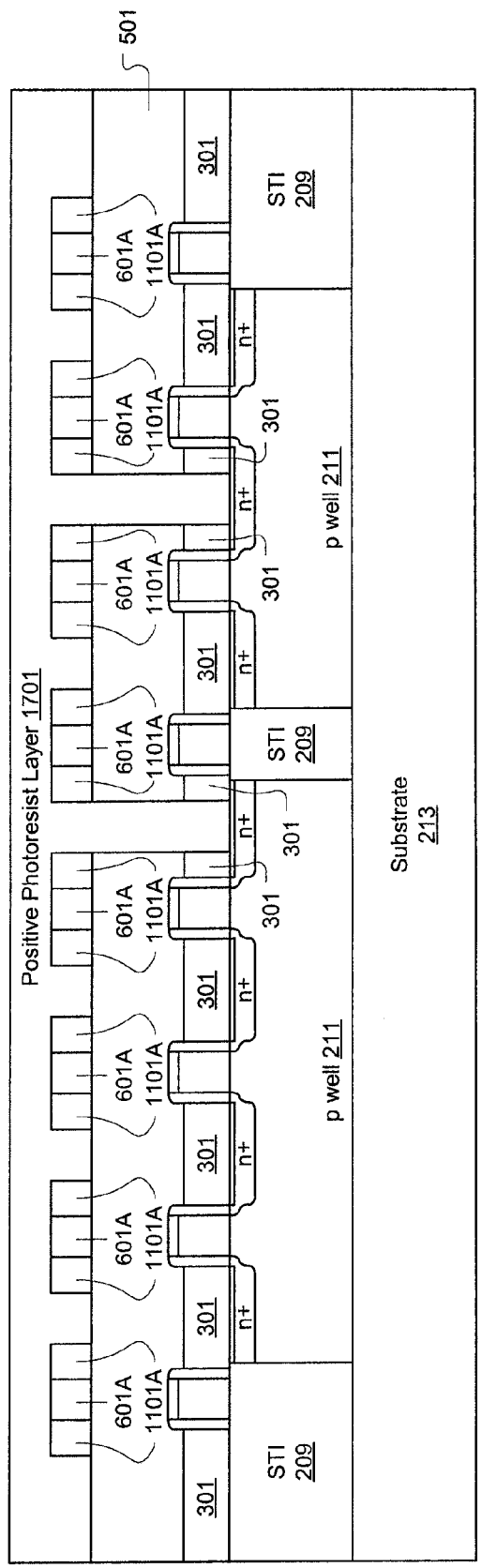
FIG. 17 is an illustration showing the positive photoresist layer deposited over the wafer portion, in accordance with one embodiment of the present invention.

With reference back to FIG. 1A, the method proceeds from the operation 107 to an operation 109 in which passages are etched for gate contacts. FIG. 1F is an illustration showing an expanded view of operation 109, in accordance with one embodiment of the present invention. As shown in FIG. 1F, operation 109 includes an operation 145 for depositing a positive photoresist layer 1701 over the wafer portion 200. FIG. 17 is an illustration showing the positive photoresist layer 1701 deposited over the wafer portion 200, in accordance with one embodiment of the present invention. As shown in FIG. 17, the positive photoresist layer 1701 is deposited over both the exposed dielectric layer 501 portions, the exposed first hard mask portions 601A, the exposed second hard mask filaments 1101A, and within the active area contact passages 1501 previously etched in operation 107. The positive photoresist layer 1701 can be defined by essentially any type of positive photoresist material. The positive photoresist material is characterized in that portions of the positive photoresist material that are sufficiently exposed to a light source will made soluble, i.e., removable, in the presence of a developer solution, and underexposed portions of the positive photoresist material will remain insoluble, i.e., non-removable, in the presence of the developer solution.

Following operation 145, an operation 147 is performed to pattern the positive photoresist layer 1701 with a gate contact mask. More specifically, the positive photoresist layer 1701 is patterned to include a number of substantially linear openings through the positive photoresist layer 1701, each extending across a given first hard mask portion 601A and across portions of the two second hard mask filaments 1101A adjacent to the given first hard mask portion 601A. The substantially linear opening defined through the positive photoresist layer 1701 is oriented to extend in a direction substantially perpendicular to the length 218 of the underlying gate structure 205 over which the linear opening is defined. The patterning of the positive photoresist layer 1701 can be performed using essentially any conventional photolithography technique.

Figure 18A:
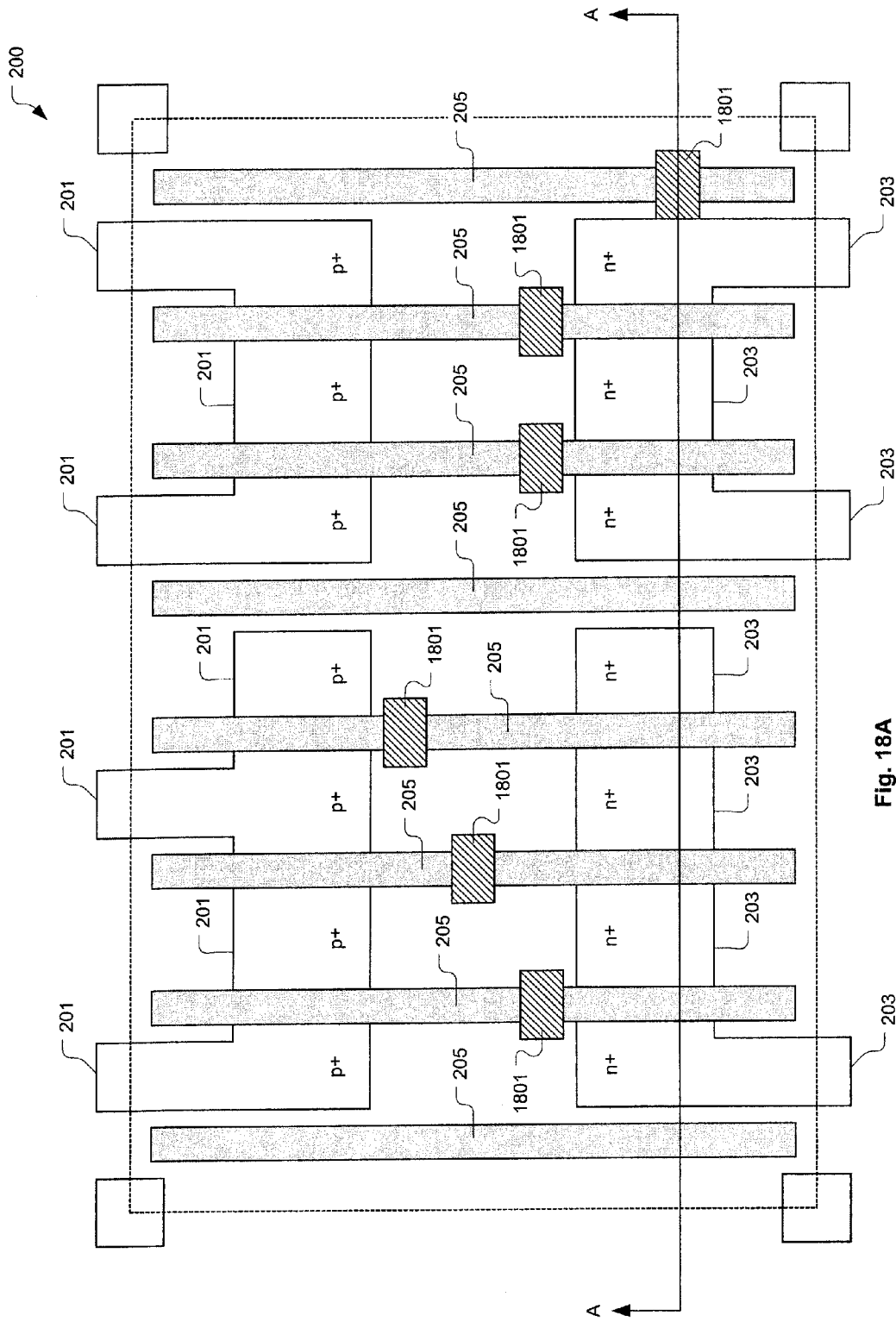
FIG. 18A is an illustration showing an example gate contact mask used to pattern the positive photoresist layer, in accordance with one embodiment of the present invention.

FIG. 18A is an illustration showing an example gate contact mask used to pattern the positive photoresist layer 1701, in accordance with one embodiment of the present invention. The gate contact mask includes a number of linear openings 1801. Each linear openings 1801 represents area where the positive photoresist layer 1701 is removed to expose the underlying first hard mask portion 601A, and adjoining portions of the second hard mask filaments 1101A. Although, the linear openings 1801 are shown as "ideal" rectangular-shaped openings, it should be understood that the actual linear openings 1801 may have somewhat rounded ends. However, it should be noted that the rounded ends of a given linear opening 1801 will lie above the adjoining second hard mask filaments 1101A, and will not lie above the first hard mask portion 601A over which the given linear opening 1801 extends.

Figure 18B:
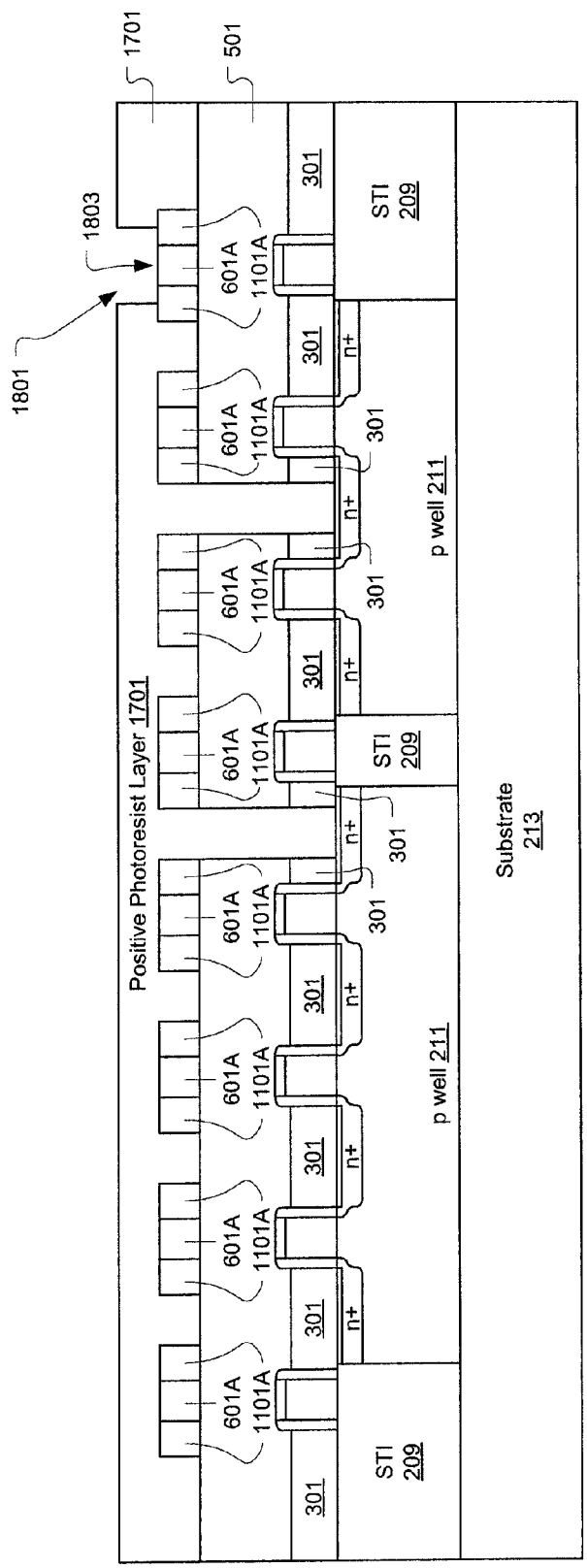
FIG. 18B is an illustration showing the vertical cross-section view A-A of the wafer portion with the patterned positive photoresist layer, in accordance with one embodiment of the present invention.

FIG. 18B is an illustration showing the vertical cross-section view A-A of the wafer portion 200 with the patterned positive photoresist layer 1701, in accordance with one embodiment of the present invention. Substantially rectangular areas 1803 of first hard mask portions 601A are exposed between the neighboring second hard mask filaments 1101A within the linear openings 1801. The substantially rectangular areas 1803 of the first hard mask portions 601A are bounded on two opposing side by the second hard mask filaments 1101A, and on the other two opposing sides by the linear opening 1801 of the patterned positive photoresist layer 1701. It should be appreciated that the substantially rectangular area 1803 of the first hard portion 601A, as exposed in the linear opening 1801, represents the horizontal cross-section of the gate contact to be formed. Also, it should be appreciated that because the gate contact is to be bounded by the second hard mask filaments 1101A in the linear opening 1801, and because the linear opening 1801 is "oversized" with respect to the width of the first hard mask portion 601A, there is some flexibility provided in the indexing of the gate contact mask to the wafer portion 200 when patterning the positive photoresist layer 1701. For example, if the linear opening 1801 is offset slightly in its direction of extent between the second hard mask filaments 1101A, the substantially rectangular area 1803 of the exposed first hard mask portion 601A will be unaffected.

Figure 19:
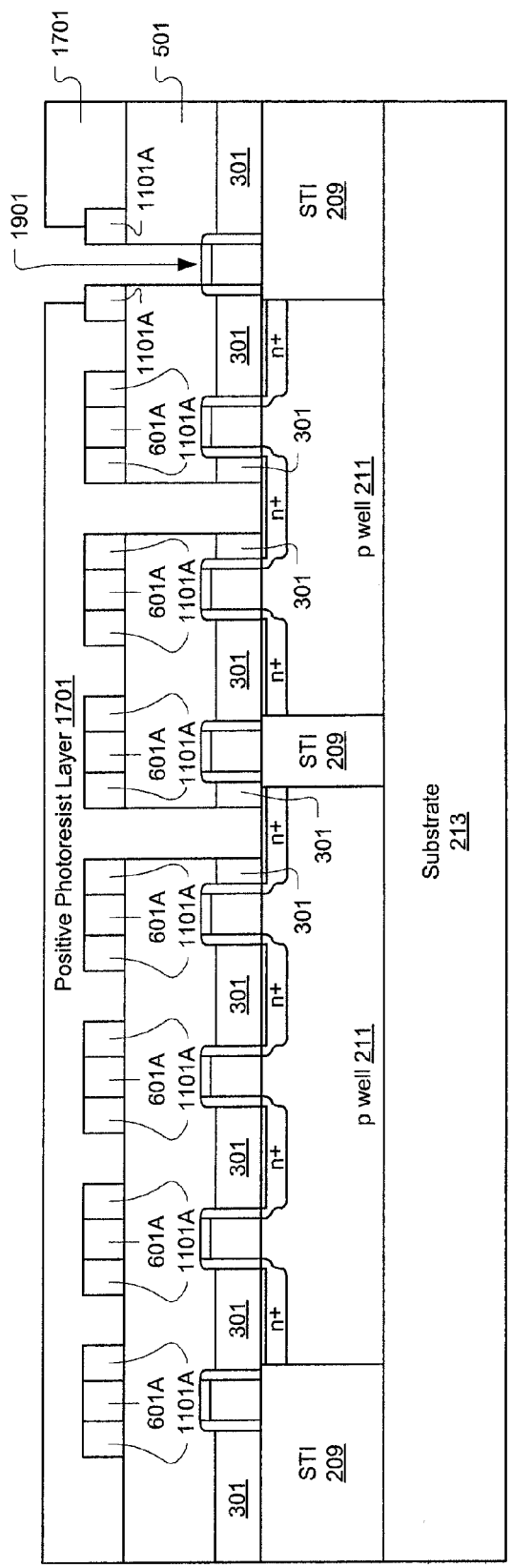
FIG. 19 is an illustration showing the vertical cross-section view A-A of the wafer portion with the passages for the gate contacts etched therein, in accordance with one embodiment of the present invention.

Following the operation 147, the method proceeds with an operation 149 for etching passages 1901 for the gate contacts. FIG. 19 is an illustration showing the vertical cross-section view A-A of the wafer portion 200 with the passages 1901 etched therein, in accordance with one embodiment of the present invention. The passages 1901 for the gate contacts are etched downward through the exposed, substantially rectangular areas 1803 of the first hard mask portion 601A within the linear openings 1801. It should be appreciated that because the materials of the first hard mask portion 601A and the second hard mask filament 1101A are different, these material can be selected to have a substantially different etching selectivity with respect to a given etching process. For example, the first hard mask portion 601A may be defined to etch ten times faster than the second hard mask filaments 1101A. Therefore, during the particular etching process to be performed in operation 149, the exposed first hard mask portion 601A is defined to be preferentially etched without substantially affecting the neighboring exposed second hard mask filaments 1101A. It should be understood that during the etching of the passages 1901 for the gate contacts, the second hard mask filaments 101A are etched very slowly so as to not be substantially removed.

In one embodiment, the passages 1901 for the gate contacts are etched in a substantially vertical manner, such that sidewalls of the passages 1901 extend in a substantially vertical manner downward from the periphery of the substantially rectangular areas 1803 of the exposed first hard mask portion 601A within the linear openings 1801. However, it should be understood that the sidewalls of the passages 1901 are not required to extend downward in a substantially vertical manner. For example, in one embodiment, the sidewalls of the passages 1901 can be slightly tapered, such that the rectangular opening of the given passage 1901 is slightly smaller at its bottom end relative to its top end. In one embodiment, a vertically biased etching process can be used to form the passages 1901 for the gate contacts. The passages 1901 are etched downward through the first hard mask portion 601A to reach the top surface 222 of the underlying gate structure 205, or to reach an etch stop layer present over the underlying gate structure 205.

Figure 20:
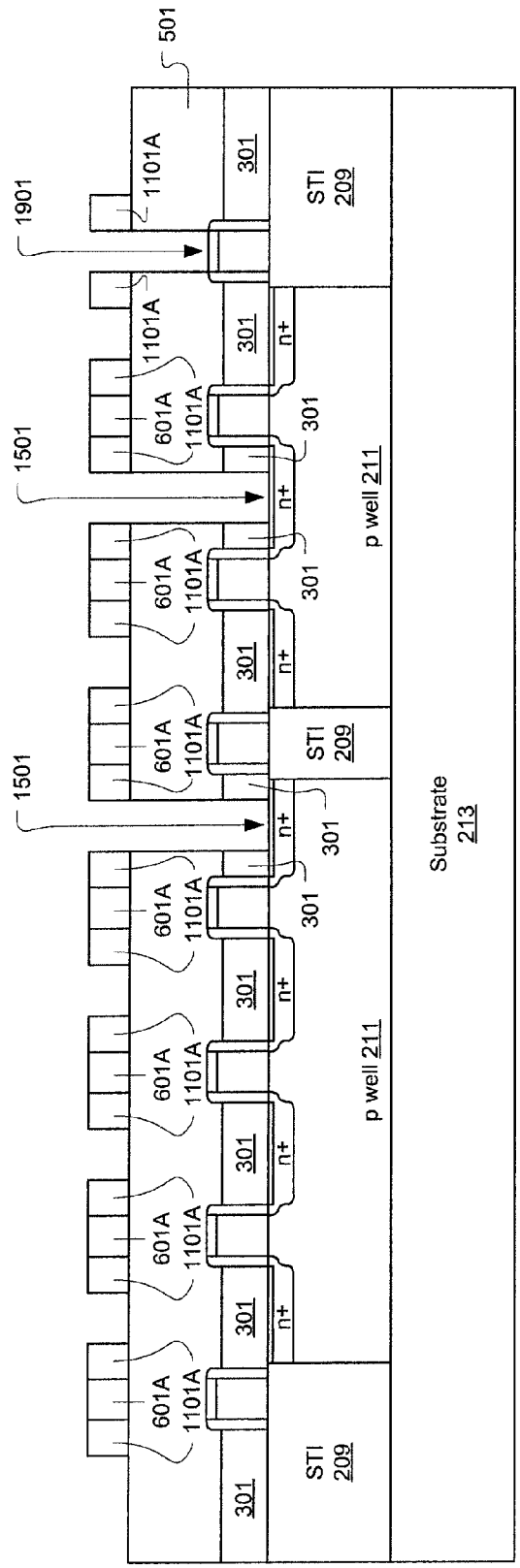
FIG. 20 is an illustration showing the wafer portion following removal of the patterned photoresist layer, in accordance with one embodiment of the present invention.

Following the operation 149, an operation 151 is performed to remove the patterned photoresist layer 1701 from the wafer portion 200. FIG. 20 is an illustration showing the wafer portion 200 following removal of the patterned photoresist layer 1701, in accordance with one embodiment of the present invention. The patterned photoresist layer 1701 can be removed using essentially any photoresist stripping technique, e.g., chemical stripping, ashing, etc.

Figure 21:
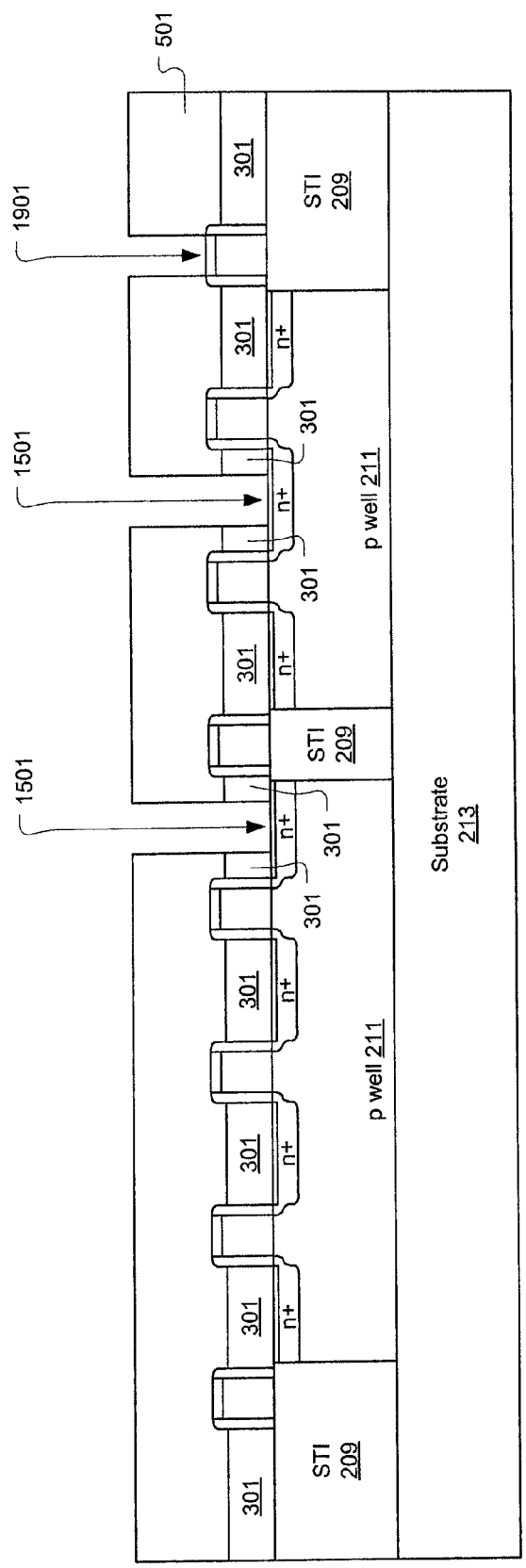
FIG. 21 is an illustration showing the wafer portion following removal of the first hard mask portions and the second hard mask filaments, in accordance with one embodiment of the present invention.

With reference back to FIG. 1A, the method proceeds from the operation 109 to an operation 111 in which the first hard mask portions 601A and the second hard mask filaments 1101A are removed from the wafer portion 200. FIG. 21 is an illustration showing the wafer portion 200 following removal of the first hard mask portions 601A and the second hard mask filaments 1101A, in accordance with one embodiment of the present invention. Operation 111 can be performed using essentially any hard mask removal technique. For example, in one embodiment the first hard mask portions 601A and the second hard mask filaments 1101A are removed using a wet stripping technique. It should also be understood that the operation 111 includes removal of any exposed etch stop layer, if present at the bottoms of the passages 1501 and 1901.

Figure 22:
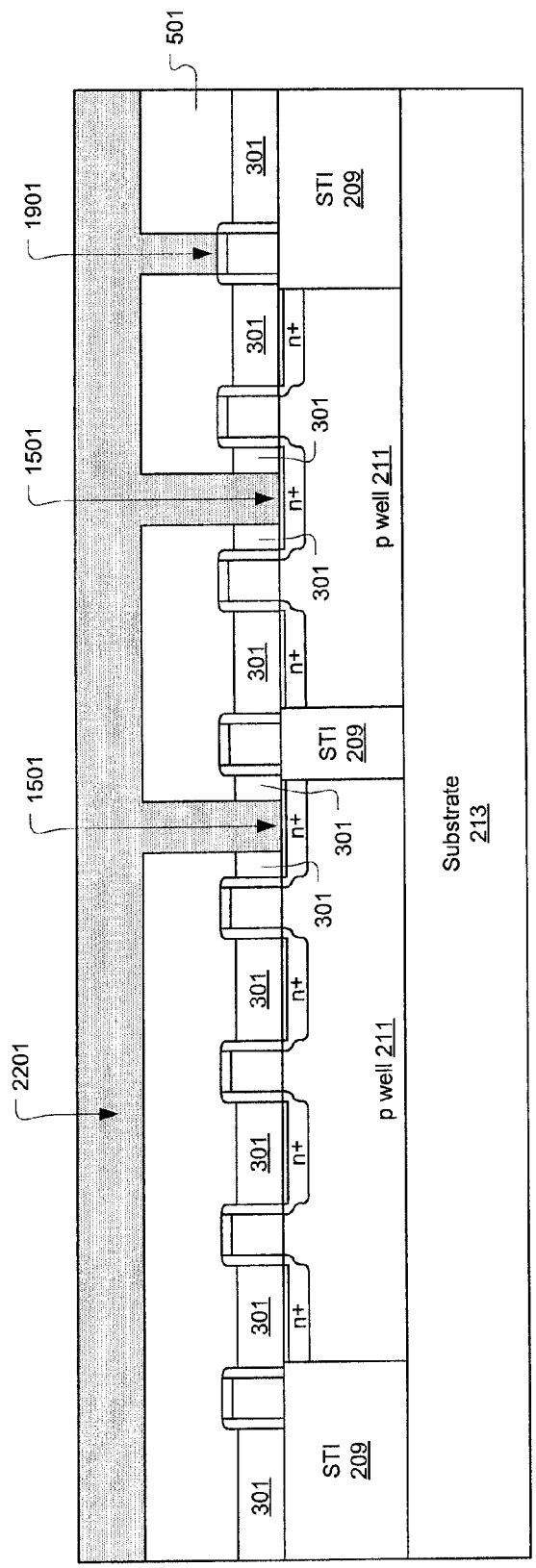
FIG. 22 is an illustration showing the vertical cross-section view A-A of the wafer portion with the metal layer deposited thereon, in accordance with one embodiment of the present invention.

The method proceeds from operation 111 to an operation 113 in which active area contacts 2301 and gate contacts 2303 are disposed within the passages 1501 and 1901, respectively. FIG. 1G is an illustration showing an expanded view of operation 113, in accordance with one embodiment of the present invention. As shown in FIG. 1G, operation 113 includes an operation 153 for depositing a metal layer 2201 over the wafer portion 200. FIG. 22 is an illustration showing the vertical cross-section view A-A of the wafer portion 200 with the metal layer 2201 deposited thereon, in accordance with one embodiment of the present invention. In one embodiment, the metal layer 2201 is deposited as a liner followed by a metal fill. For example, in one embodiment, the metal layer 2201 is formed by first depositing a TiN liner over the wafer portion 200 using a chemical vapor deposition (CVD) process or a physical vapor deposition (PVD) process. Then, a tungsten (W) fill layer is deposited over the TiN liner using a CVD process. In this embodiment, the TiN liner is relatively thin, while the W fill layer completely fills the contact passages 1501 and 1901.

Figure 23:
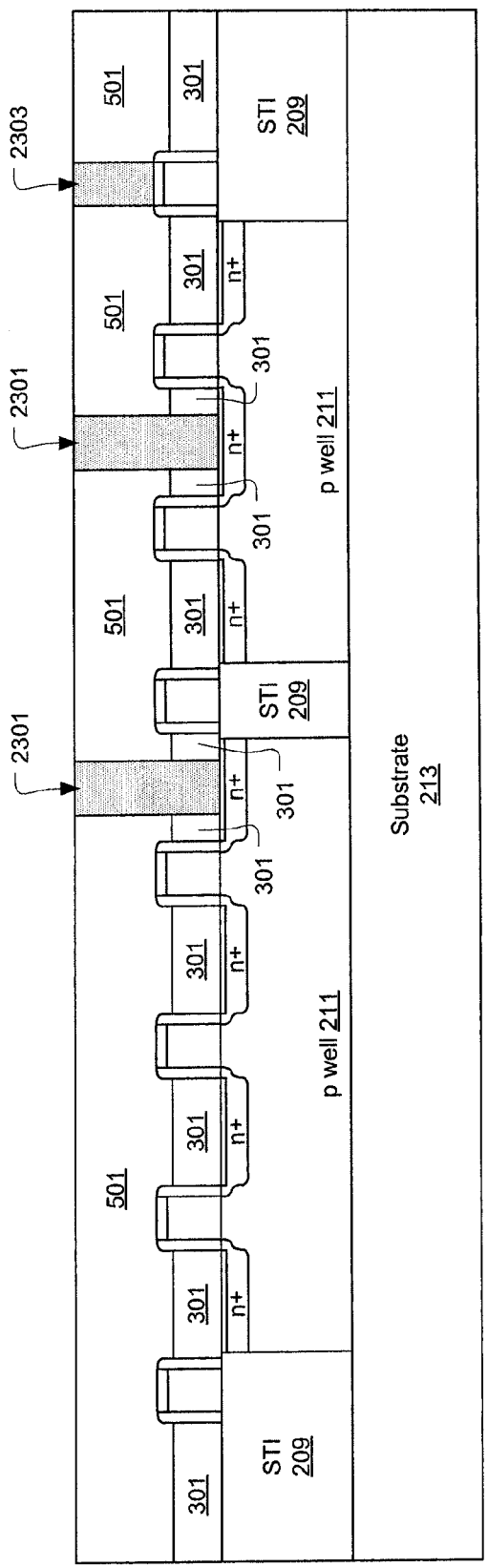
FIG. 23 is an illustration showing the vertical cross-section view A-A of the wafer portion with the excess metal layer removed to leave the active area contacts and the gate contacts, in accordance with one embodiment of the present invention.

Following the operation 153, an operation 155 is performed to removal excess metal from the top of the wafer portion 200, so as to leave the top surface of the dielectric layer exposed 501 and the contact passages 1501 and 1901 filled with metal. For example, in the TiN liner/W fill embodiment, a CMP process can be used to perform operation 155 so as to remove the W fill layer and the TiN liner from the top surface of the dielectric layer 501. FIG. 23 is an illustration showing the vertical cross-section view A-A of the wafer portion 200 with the excess metal layer 2201 removed to leave the active area contacts 2301 and the gate contacts 2303, in accordance with one embodiment of the present invention. Following completion of operation 113, i.e., following completion of the SSA contact fabrication process, fabrication of the wafer portion 200 can continue with fabrication of a metalization layer over the dielectric layer 501.

Figure 24A:
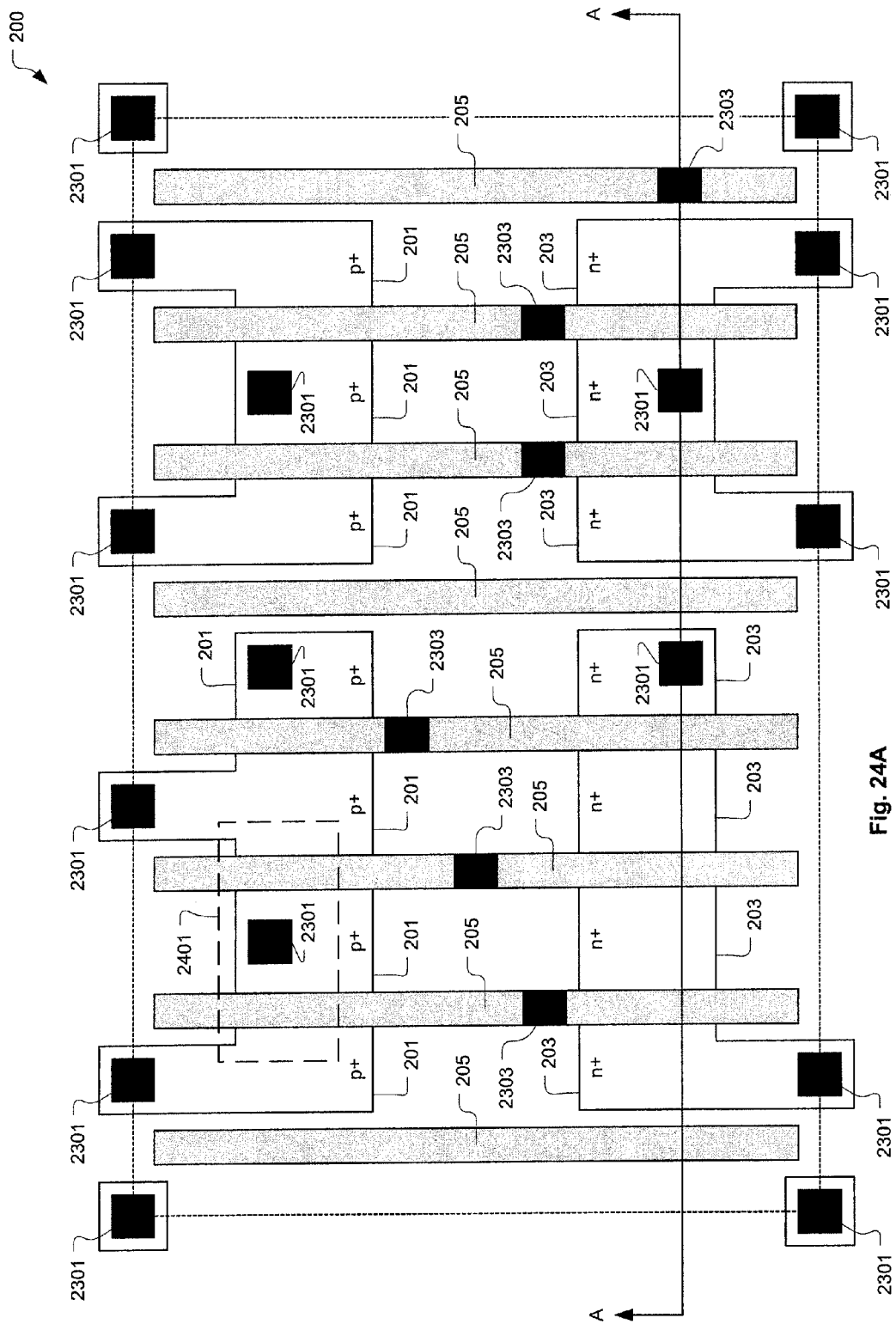
FIG. 24A is an illustration showing a top view of the wafer portion following formation of the active area contacts and gate contacts, in accordance with one embodiment of the present invention.

FIG. 24A is an illustration showing a top view of the wafer portion 200 following formation of the active area contacts 2301 and gate contacts 2303, in accordance with one embodiment of the present invention. It should be appreciated that each active area contact 2301 is substantially centered between its neighboring gate structures 205. Also, it should be appreciated that each gate contact 2303 is defined to substantially cover the width of the underlying gate structure 205 without extending substantially beyond either of the side surfaces of the underlying gate structure 205. Hence, due to their direct reference from the as-fabricated gate structures 205, the active area contacts 2301 and the gate contacts 2303 are considered to be super-self-aligned (SSA) contacts with respect to the gate structures 205. Additionally, it should be appreciated that the horizontal cross-section of each active area contact and each gate contact is substantially rectangular in shape.

Figure 24B:
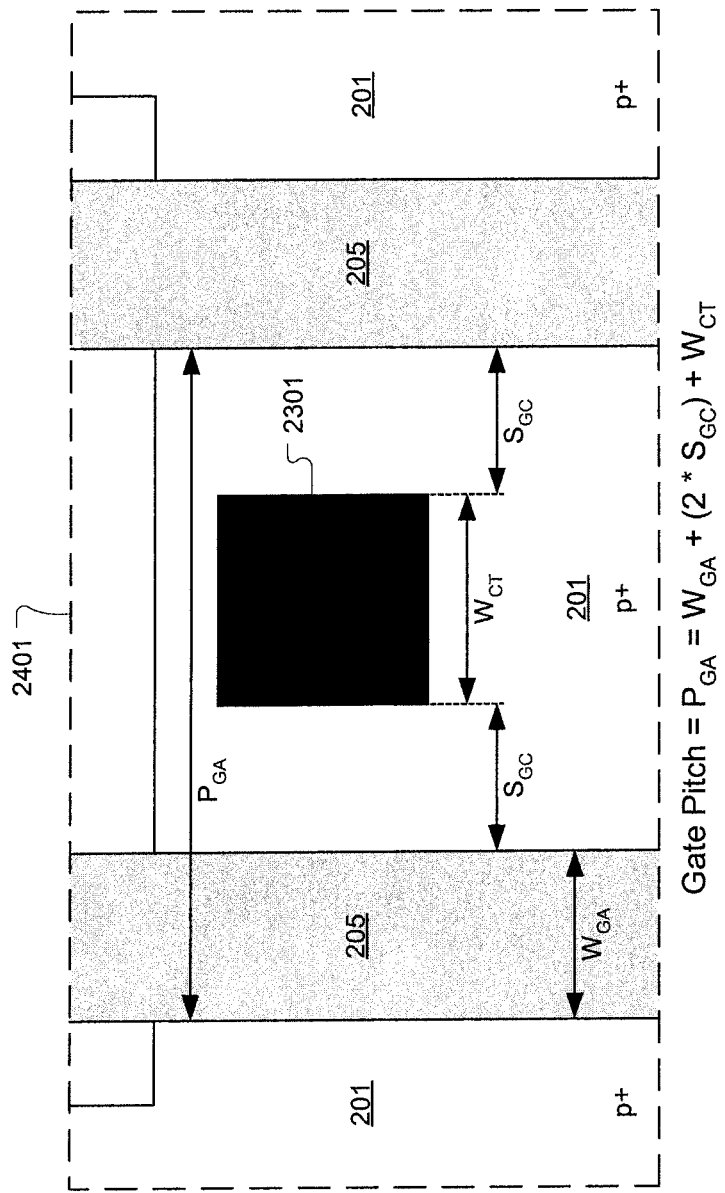
FIG. 24B is an illustration showing an expanded view of an area, as called out in FIG. 24A, in accordance with one embodiment of the present invention.

FIG. 24B is an illustration showing an expanded view of an area 2401, as called out in FIG. 24A, in accordance with one embodiment of the present invention. As shown in FIG. 24B, the active area contact 2301 is substantially centered between its neighboring gate structures 205, such that a substantially equal gate-to-active area contact spacing (SGC) exists on each side the active area contact 2301. As previously discussed, the gate-to-active area contact spacing (SGC) is defined by the width of the second hard mask filament 1101A, as measured in the horizontal direction perpendicular to the length 218 of the gate structure 205. As shown in FIG. 24B, the gate pitch (PGA) is equal to the sum of the gate width (WGA), the active area contact width (WCT), and twice the gate-to-active area contact spacing (SGC).

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention.

What is claimed is:

1. A semiconductor device, comprising:
   a linear gate structure having side surfaces and a top surface, wherein a width of the linear gate structure is defined by a perpendicular distance between the side surfaces;
   a gate contact disposed to electrically connect to the top surface of the linear gate structure, wherein the gate contact has a substantially rectangular horizontal cross-section, and wherein the gate contact is defined to substantially cover the width of the linear gate structure without extending substantially beyond either of the side surfaces of the linear gate structure; and
   a photon absorption layer disposed adjacent to the side surfaces of the linear gate structure so as to contact the side surfaces of the linear gate structure without covering the top surface of the linear gate structure.

2. A semiconductor device as recited in claim 1, wherein the top surface of the linear gate structure is formed from a photon reflecting material.

3. A semiconductor device as recited in claim 1, wherein the photon absorption layer is disposed to fill regions adjacent to the linear gate structure.

4. A semiconductor device as recited in claim 1, further comprising:
   a dielectric layer disposed over both the photon absorption layer and the linear gate structure, wherein the dielectric layer includes a passage through which the gate contact is disposed, and wherein the passage is defined by a substantially rectangular horizontal cross-section along its length.

5. A semiconductor device as recited in claim 1, further comprising:
   a pair of linear gate structures disposed parallel to each other, each of the pair of linear gate structures having side surfaces and a top surface; and
   an active area contact disposed to electrically connect to an active area present between facing side surfaces of the pair of linear gate structures, wherein the active area contact has a substantially rectangular horizontal cross-section, and wherein the active area contact is disposed to be substantially centered between facing side surfaces of the pair of linear gate structures.

6. A semiconductor device, comprising:
a linear gate structure having side surfaces and a top surface, the linear gate structure extending lengthwise in a first direction, wherein a length of the linear gate structure as measured in the first direction is larger than a width of the linear gate structure as measured in a second direction perpendicular to the first direction;
sidewall spacers formed on the side surfaces of the linear gate structure; and
a gate contact disposed to electrically connect to the top surface of the linear gate structure, the gate contact having a substantially rectangular horizontal cross-section, the gate contact defined to substantially cover the width of the linear gate structure without extending substantially beyond either of the side surfaces of the linear gate structure, the gate contact having a first dimension as measured in the first direction that is larger than a second dimension as measured in the second direction, and the gate contact confined within a vertical region between the sidewall spacers above the linear gate structure.

7. A semiconductor device as recited in claim 6, further comprising:
a photon absorption layer disposed adjacent to the side surfaces of the linear gate structure so as to contact the side surfaces of the linear gate structure without covering the top surface of the linear gate structure.

8. A semiconductor device as recited in claim 7, wherein the photon absorption layer is disposed to fill regions adjacent to the linear gate structure.

9. A semiconductor device as recited in claim 7, further comprising:
a dielectric layer disposed over both the photon absorption layer and the linear gate structure, wherein the dielectric layer includes a passage through which the gate contact is disposed, and wherein the passage is defined by a substantially rectangular horizontal cross-section along its length.

10. A semiconductor device as recited in claim 6, wherein the top surface of the linear gate structure is formed from a photon reflecting material.

11. A semiconductor device as recited in claim 6, further comprising:
a pair of linear gate structures disposed parallel to each other, each of the pair of linear gate structures having side surfaces and a top surface; and
an active area contact disposed to electrically connect to an active area present between facing side surfaces of the pair of linear gate structures, wherein the active area contact has a substantially rectangular horizontal cross-section, and wherein the active area contact is disposed to be substantially centered between facing side surfaces of the pair of linear gate structures.

12. A semiconductor device, comprising:
a pair of linear gate structures disposed parallel to each other, each of the pair of linear gate structures having side surfaces and a top surface, each of the pair of linear gate structures extending lengthwise in a first direction, wherein a length and a width of each of the pair of linear gate structures are such that the length as measured in the first direction is larger than the width as measured in a second direction perpendicular to the first direction;
a gate contact disposed to electrically connect to the top surface of at least one of the pair of linear gate structures, the gate contact having a substantially rectangular horizontal cross-section, the gate contact defined to substantially cover the width of the linear gate structure to which it connects without extending substantially beyond either of the side surfaces of the linear gate structure to which it connects, the gate contact having a first dimension as measured in the first direction that is larger than a second dimension as measured in the second direction; and
an active area contact disposed to electrically connect to an active area present between facing side surfaces of the pair of linear gate structures, wherein the active area contact has a substantially rectangular horizontal cross-section, and wherein the active area contact is disposed to be substantially centered between facing side surfaces of the pair of linear gate structures.

13. A semiconductor device as recited in claim 12, further comprising:
a photon absorption layer disposed adjacent to the side surfaces of each of the pair of linear gate structures so as to contact the side surfaces of each of the pair of linear gate structures without covering the top surfaces of the pair of linear gate structures.

14. A semiconductor device as recited in claim 13, wherein the photon absorption layer is disposed to fill regions adjacent to each of the pair of linear gate structures.

15. A semiconductor device as recited in claim 13, further comprising:
a dielectric layer disposed over both the photon absorption layer and the pair of linear gate structures, wherein the dielectric layer includes a passage through which the gate contact is disposed, and wherein the passage is defined by a substantially rectangular horizontal cross-section along its length.

16. A semiconductor device as recited in claim 12, wherein the top surfaces of the pair of linear gate structures are formed from a photon reflecting material.

* * * * *